US012475824B2

(12) United States Patent
Shao et al.

(10) Patent No.: US 12,475,824 B2

(45) Date of Patent: Nov. 18, 2025

(54) DRIVE CONTROL CIRCUIT, CONTROL METHOD THEREOF, AND DISPLAY APPARATUS

(71) Applicants: Beijing BOE Display Technology Co., Ltd., Beijing (CN); BOE TECHNOLOGY GROUP CO., LTD., Beijing (CN)

(72) Inventors: Xibin Shao, Beijing (CN); Yanping Liao, Beijing (CN); Dongchuan Chen, Beijing (CN); Yingmeng Miao, Beijing (CN); Shulin Yao, Beijing (CN); Yue Yang, Beijing (CN)

(73) Assignees: Beijing BOE Display Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/291,649

(22) PCT Filed: Aug. 17, 2022

(86) PCT No.: PCT/CN2022/112928

§ 371 (c)(1),
(2) Date: Jan. 24, 2024

(87) PCT Pub. No.: WO2024/036499

PCT Pub. Date: Feb. 22, 2024

(65) Prior Publication Data

US 2025/0087125 A1 Mar. 13, 2025

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01);
(Continued)

(58) Field of Classification Search
None
See application file for complete search history.

(56) References Cited

U.S. PATENT DOCUMENTS

2006/0267889 A1* 11/2006 Kimura ................ G09G 3/3258 345/84
2017/0116946 A1* 4/2017 Nakatani .............. G09G 3/3677
2021/0027707 A1* 1/2021 Park ........................ G09G 3/035

FOREIGN PATENT DOCUMENTS

CN 1319830 A 10/2001
CN 100423077 C 10/2008
(Continued)

*Primary Examiner* — Ifedayo B Iluyomade

(74) *Attorney, Agent, or Firm* — HOUTTEMAN LAW LLC

(57) ABSTRACT

The embodiments of the present disclosure provide a drive control circuit, a control method thereof, and a display apparatus. The drive control circuit includes: a first control circuit configured to acquire image data, and output a first selection command signal according to the image data; and at least one second control circuit each coupled to at least one scan signal line in a display panel and coupled to the first control circuit. The at least one second control circuit is configured to receive the first selection command signal, determine, according to the first selection command signal, a target scan signal line from among scan signal lines in the display panel, and output a scan drive signal to the target scan signal line.

18 Claims, 26 Drawing Sheets

(52) U.S. Cl.
CPC ............... *G09G 2310/0275* (2013.01); *G09G 2310/0286* (2013.01); *G09G 2310/0289* (2013.01); *G09G 2310/08* (2013.01); *G09G 2340/0435* (2013.01); *G09G 2340/16* (2013.01)

(56) References Cited

FOREIGN PATENT DOCUMENTS

| | | | |
|---|---|---|---|
| CN | 103680439 | A | 3/2014 |
| CN | 104123906 | A | 10/2014 |
| CN | 105047176 | A | 11/2015 |
| CN | 106504722 | A | 3/2017 |
| CN | 106652972 | A | 5/2017 |
| CN | 106663402 | A | 5/2017 |
| CN | 106663409 | A | 5/2017 |
| CN | 107016953 | A | 8/2017 |
| CN | 108231029 | A | 6/2018 |
| CN | 109036246 | A | 12/2018 |
| CN | 106782258 | B | 6/2020 |
| CN | 112309297 | A | 2/2021 |
| CN | 113643664 | A | 11/2021 |
| CN | 113971927 | A | 1/2022 |
| CN | 114267295 | A | 4/2022 |
| CN | 114882846 | A | 8/2022 |

* cited by examiner

DRIVE CONTROL CIRCUIT, CONTROL METHOD THEREOF, AND DISPLAY APPARATUS

TECHNICAL FIELD

The present disclosure relates to the field of display technology, and particularly relates to a drive control circuit, a control method thereof, and a display apparatus.

BACKGROUND

A display panel such as a Liquid Crystal Display (LCD) panel, an Organic Light Emitting Diode (OLED) display panel, a Quantum Dot Light Emitting Diode (QLED) display panel, or the like, generally includes a plurality of pixel units. Each pixel unit may include a plurality of sub-pixels with different colors. The light emitting brightness of the plurality of sub-pixels with different colors are controlled to be mixed together to obtain a color required to be displayed, and a color image can be displayed.

SUMMARY

Some embodiments of the present disclosure provide a drive control circuit, including:

a first control circuit, configured to acquire image data, and output a first selection command signal according to the image data; and at least one second control circuit, each coupled to at least one scan signal line in a display panel, and coupled to the first control circuit, where the at least one second control circuit is each configured to receive the first selection command signal, determine, according to the first selection command signal, a target scan signal line from among a plurality of scan signal lines in the display panel, and output a scan drive signal to the target scan signal line.

In some possible embodiments provided by the present disclosure, the plurality of scan signal lines are divided into at least one scan signal line group each including at least one of the plurality of scan signal lines; the at least one second control circuit is in one-to-one correspondence with the at least one scan signal line group;

the first selection command signal includes address information corresponding to the second control circuit coupled to the target scan signal line and data selected information corresponding to the target scan signal line;

the first control circuit is further configured to pre-store address information of the second control circuit coupled to the first control circuit; and each of the at least one second control circuit is further configured to receive the first selection command signal, and determine, according to the data selected information in the first selection command signal corresponding to the address information of the second control circuit, the target scan signal line from among the plurality of scan signal lines in the display panel.

In some possible embodiments provided by the present disclosure, the second control circuit includes a frame start signal control circuit and at least one first shift register unit; a drive signal output terminal of each of the at least one first shift register unit is coupled to at least one scan signal line; in the same second control circuit, the frame start signal control circuit is coupled to an input signal terminal of each of the at least one first shift register unit;

the frame start signal control circuit is configured to receive the first selection command signal, determine, according to corresponding address information and data selected information in the first selection command signal, the target scan signal line from among the correspondingly coupled scan signal line group, generate a first target frame start signal corresponding to the target scan signal line according to the determined target scan signal line, and input the generated first target frame start signal corresponding to the target scan signal line to the input signal terminal of the first shift register unit coupled to the target scan signal line; and the first shift register unit is configured to receive the first target frame start signal corresponding to the coupled target scan signal line through the input signal terminal, and provide a clock signal input to a clock control signal terminal to the coupled target scan signal line according to the received first target frame start signal, to output the scan drive signal to the target scan signal line.

In some possible embodiments provided by the present disclosure, the frame start signal control circuit includes a first decoder, a first frame start signal generator, and a first level shifter;

the first decoder is configured to receive the first selection command signal, determine, according to the corresponding address information and data selected information in the first selection command signal, the target scan signal line from among the corresponding scan signal line group, and generate a frame start generating signal corresponding to the target scan signal line according to the determined target scan signal line;

the first frame start signal generator is configured to receive the first frame start generating signal corresponding to the target scan signal line, and generate a first initial frame start signal corresponding to the target scan signal line according to the received first frame start generating signal; and the first level shifter is configured to receive the first initial frame start signal corresponding to the target scan signal line, perform voltage shift processing on the received first initial frame start signal, generate the first target frame start signal corresponding to the target scan signal line, and input the generated first target frame start signal corresponding to the target scan signal line to the input signal terminal of the first shift register unit coupled to the target scan signal line.

In some possible embodiments provided by the present disclosure, the frame start signal control circuit and the at least one first shift register unit are on the display panel;

the display panel further includes a plurality of first clock control signal lines; and the clock control signal terminal of the first shift register unit in the second control circuit is coupled to at least one of the plurality of first clock control signal lines.

In some possible embodiments provided by the present disclosure, in the same second control circuit, all of the at least one first shift register unit is at a same end of the scan signal line.

In some possible embodiments provided by the present disclosure, the scan signal line has a first end and a second end opposite to each other; and all of the at least one first shift register unit in the second control circuit is at one of the first end and the second end.

In some possible embodiments provided by the present disclosure, the scan signal line has a first end and a second end opposite to each other; and each of the first end and the second end of the scan signal line is coupled to one first shift register unit.

In some possible embodiments provided by the present disclosure, in the same second control circuit, the frame start signal control circuit and the first shift register unit are at the same end of the scan signal line.

In some possible embodiments provided by the present disclosure, the display panel has a bonding area; the frame start signal control circuit in all of the at least one second control circuit is in the bonding area;

the display panel further includes a plurality of first frame start signal lines and a plurality of first transfer signal lines, where an input signal terminal of each first shift register unit is coupled to one of the plurality of first frame start signal lines, and the one of the plurality of first frame start signal lines is coupled to one of the plurality of first transfer signal lines; and in the same second control circuit, the frame start signal control circuit is coupled to the first transfer signal line corresponding to the first shift register unit.

In some possible embodiments provided by the present disclosure, the display panel includes a plurality of pixel units;

the plurality of pixel units are divided into a plurality of pixel unit row groups, where each of the plurality of pixel unit row groups includes one pixel unit row or at least two adjacent pixel unit rows; and between any two adjacent pixel unit row groups is arranged at least one of the plurality of first frame start signal lines.

In some possible embodiments provided by the present disclosure, the pixel unit row group includes one pixel unit row; and between every two adjacent pixel unit row groups is arranged one of the plurality of first frame start signal lines.

In some possible embodiments provided by the present disclosure, the plurality of first frame start signal lines and the plurality of scan signal lines are in a same layer.

In some possible embodiments provided by the present disclosure, the display panel includes a plurality of pixel units;

the plurality of pixel units are divided into a plurality of pixel unit column groups, where each of the plurality of pixel unit column groups includes one pixel unit column or at least two adjacent pixel unit columns; and between any two adjacent pixel unit column groups is arranged at least one of the plurality of first transfer signal lines.

In some possible embodiments provided by the present disclosure, the pixel unit column group includes one pixel unit column; and between every two adjacent pixel unit column groups in at least part of area is arranged one of the plurality of first transfer signal lines.

In some possible embodiments provided by the present disclosure, the display panel further includes a plurality of data signal lines; and the plurality of first transfer signal lines and the plurality of data signal lines are in a same layer.

In some possible embodiments provided by the present disclosure, the display panel further includes a black matrix;

in a direction perpendicular to a plane where the display panel is located, the black matrix covers the plurality of scan signal lines and the plurality of first frame start signal lines; and/or in the direction perpendicular to the plane where the display panel is located, the black matrix covers the plurality of data signal lines and the plurality of first transfer signal lines.

In some possible embodiments provided by the present disclosure, the drive signal output terminal of each of the at least one first shift register unit is coupled to one of the plurality of scan signal lines.

In some possible embodiments provided by the present disclosure, the drive signal output terminal of the first shift register unit is coupled to multiple ones of the plurality of the scan signal lines;

the first shift register unit includes a first shift register sub-unit and a second shift register sub-unit, where the second shift register sub-unit is coupled to the multiple scan signal lines;

the first shift register sub-unit is configured to receive the first target frame start signal corresponding to the coupled target scan signal line, and provide a signal at a first cascade clock signal terminal to a cascade signal output terminal according to the received first target frame start signal, to output a cascade drive signal through the cascade signal output terminal; and the second shift register sub-unit is configured to receive the cascade drive signal output by the coupled cascade signal output terminal, and provide a signal at an input clock control signal terminal to the coupled target scan signal line in response to the cascade drive signal, to output the scan drive signal to the target scan signal line.

In some possible embodiments provided by the present disclosure, the first shift register sub-unit includes a plurality of first shift registers, where the plurality of first shift registers are cascaded together;

the second shift register sub-unit includes a plurality of second shift registers, where the plurality of first shift registers are in one-to-one correspondence with the plurality of second shift registers; and the cascade signal output terminal of each of the plurality of first shift registers is coupled to an input signal terminal of a corresponding one of the plurality of second shift registers;

the plurality of first shift registers are configured to receive the first target frame start signal corresponding to the coupled target scan signal line through the input signal terminal, and sequentially operate according to the received first target frame start signal, so that each first shift register provides the signal at the first cascade clock signal terminal to the cascade signal output terminal, to output the cascade drive signal through the cascade signal output terminal; and each of the plurality of second shift registers is configured to receive the cascade drive signal output by the coupled cascade signal output terminal, and provide the signal at the input clock control signal terminal to the coupled target scan signal line in response to the cascade drive signal, to output the scan drive signal to the target scan signal line.

In some possible embodiments provided by the present disclosure, the second control circuit includes a scan control output circuit, where the scan control output circuit is coupled to the scan signal line in the corresponding scan signal line group; and the scan control output circuit is configured to receive the first selection command signal, determine, according to data selected information in the first selection command signal corresponding to address information of the scan control output circuit, the target scan signal line from among the corresponding scan signal line group, generate the scan drive signal corresponding to the target scan signal line according to the determined target scan signal line, and provide the generated scan drive signal to the coupled target scan signal line, to output the scan drive signal to the target scan signal line.

In some possible embodiments provided by the present disclosure, the scan control output circuit includes a second decoder, a second frame start signal generator, and a second level shifter;

the second decoder is configured to receive the first selection command signal, determine, according to data selected information in the first selection command signal corresponding to address information of the second decoder, the target scan signal line from among the corresponding scan signal line group, and generate a scan generating signal corresponding to the target scan signal line according to the determined target scan signal line;

the second frame start signal generator is configured to receive the scan generating signal corresponding to the target scan signal line, and generate an initial scan signal corresponding to the target scan signal line according to the received scan generating signal; and the second level shifter is configured to receive the initial scan signal corresponding to the target scan signal line, perform voltage shift processing on the received initial scan signal, generate the scan drive signal corresponding to the target scan signal line, and input the generated scan drive signal corresponding to the target scan signal line to the target scan signal line coupled to the second level shifter.

In some possible embodiments provided by the present disclosure, the first control circuit is further configured to obtain image data corresponding to a plurality of consecutive display frames, compare the image data of the plurality of consecutive display frames, and when it is determined that set picture data in a same first image area in image data of at least two adjacent display frames exists in the plurality of consecutive display frames, determine an area outside the first image area as a second image area, determine a scan signal line coupled to a pixel unit in the first image area or the second image area as the target scan signal line, and output the first selection command signal according to the determined scan signal line during each of the at least two adjacent display frames.

In some possible embodiments provided by the present disclosure, the first image area includes a plurality of adjacent pixel unit rows; the second image area includes a plurality of adjacent pixel unit rows; and the first image area includes at least one first image area, and the second image area includes at least one second image area, where the at least one first image area and the at least one second image area are alternately arranged.

In some possible embodiments provided by the present disclosure, the first image area includes a plurality of adjacent pixel unit columns; the second image area includes a plurality of adjacent pixel unit columns; and the first image area includes at least one first image area, and the second image area includes at least one second image area, where the at least one first image area and the at least one second image area are alternately arranged.

In some possible embodiments provided by the present disclosure, the first image area includes adjacent a1 columns×b1 rows of pixel units, where $1 \le a1 < M$, $1 \le b1 < N$, M represents a total number of pixel unit columns in the display panel, N represents a total number of pixel unit rows in the display panel, and both of a1 and b1 are integers;

the first image area includes adjacent a2 columns×b2 rows of pixel units, where $1 \le a2 < M$, $1 \le b2 < N$, and both of a2 and b2 are integers; and the first image area includes at least one first image area, and the second image area includes at least one second image area, where the at least one first image area and the at least one second image area are uniformly distributed.

In some possible embodiments provided by the present disclosure, the first control circuit is further configured to determine a refresh rate corresponding to the first image area as a first refresh rate, and determine a refresh rate corresponding to the second image area as a second refresh rate; and the first refresh rate is less than the second refresh rate.

In some possible embodiments provided by the present disclosure, the drive control circuit further includes at least one source driver circuit, where each of the at least one source driver circuit is coupled to a data signal line in the display panel;

the first control circuit is further configured to send the acquired image data to the at least one source driver circuit; and each of the at least one source driver circuit is configured to receive the image data, and apply a corresponding data voltage to the data signal line coupled to the source driver circuit, according to the image data.

In some possible embodiments provided by the present disclosure, the first control circuit is further configured to send the acquired image data to the at least one source driver circuit, and input, when a scan signal line coupled to a pixel unit in the first image area is determined as the target scan signal line, a first image enable signal to the source driver circuit coupled to the pixel unit in the first image area; and the source driver circuit is further configured to receive the first image enable signal, and apply a corresponding data voltage to a data signal line coupled to a pixel unit in the second image area, according to the first image enable signal and the image data.

In some possible embodiments provided by the present disclosure, the first control circuit is further configured to send the acquired image data to the at least one source driver circuit, and input, when a scan signal line coupled to a pixel unit in the second image area is determined as the target scan signal line, a first image disable signal to the source driver circuit coupled to the pixel unit in the second image area; and the source driver circuit is further configured to receive the first image disable signal, and apply a corresponding data voltage to a data signal line coupled to the pixel unit in the second image area, according to the first image disable signal and the image data.

An embodiment of the present disclosure further provides a display apparatus, including a display panel and the foregoing drive control circuit provided by the embodiments of the present disclosure.

An embodiment of the present disclosure further provides a control method for the foregoing drive control circuit provided by the embodiment of the present disclosure, where the control method includes:

acquiring image data and outputting a first selection command signal according to the image data; and receiving the first selection command signal, determining, according to the first selection command signal, a target scan signal line from among scan signal lines in the display panel, and outputting a scan drive signal to the target scan signal line.

In some possible embodiments provided by the present disclosure, acquiring the image data and outputting the first selection command signal according to the image data includes:

acquiring image data corresponding to a plurality of consecutive display frames;

comparing the image data of the plurality of consecutive display frames;

when it is determined that set picture data in a same first image area in image data of at least two adjacent display frames exists in the plurality of consecutive display frames, determining an area outside the first image area as a second image area;

determining a scan signal line coupled to a pixel unit in the first image area or the second image area as the target scan signal line; and during each of the at least two adjacent display frames, outputting the first selection command signal according to the determined scan signal line.

DETAIL DESCRIPTION OF EMBODIMENTS

Figure 1:
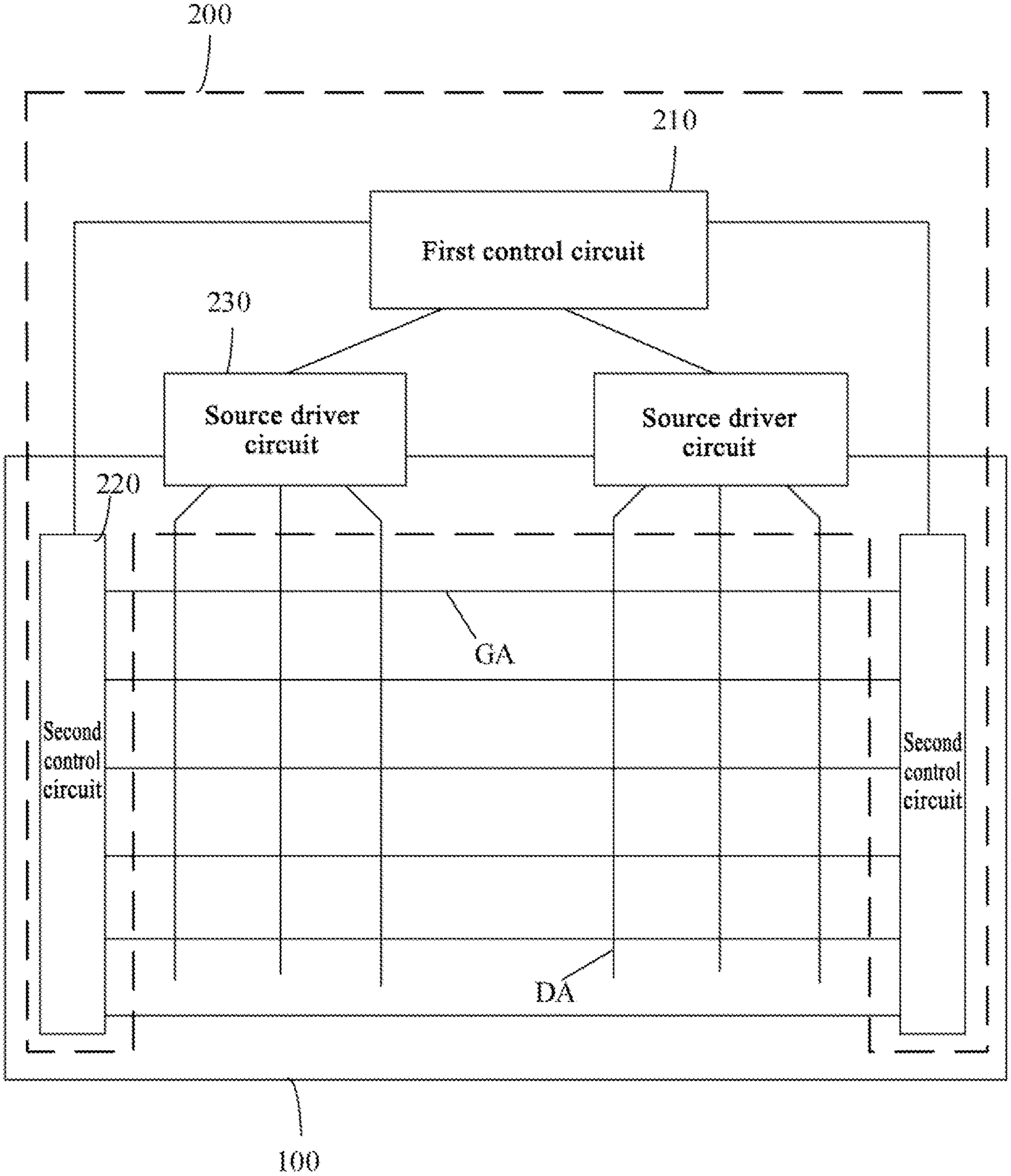
FIG. 1 is a schematic diagram illustrating some structures of a display apparatus provided by an embodiment of the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. Apparently, the described embodiments are some, but not all, of the embodiments of the present disclosure. Further, the embodiments of the present disclosure and features thereof may be combined with each other as long as they are not contradictory. All other embodiments obtained by those of ordinary skill in the art based on the embodiments of the present disclosure described herein without paying any creative effort shall be within the protection scope of the present disclosure.

Unless otherwise defined, technical or scientific terms used in the present disclosure are intended to have general meanings as understood by those of ordinary skill in the art. The words "first", "second" and the like used in the present disclosure do not denote any order, quantity, or importance, but are used merely for distinguishing different components from each other. The word "include" or "comprise" or the like means that the element or item preceding the word includes elements or items that appear after the word or equivalents thereof, but does not exclude other elements or items. The word "connected", "coupled" or the like is not limited to a physical or mechanical connection, but may include an electrical connection, whether direct or indirect.

It should be noted that the sizes and shapes of various components in the drawings are not to scale, but are merely intended to schematically illustrate the present disclosure. The same or similar reference signs refer to the same or similar elements or elements with the same or similar functions throughout the drawings.

Figure 2:
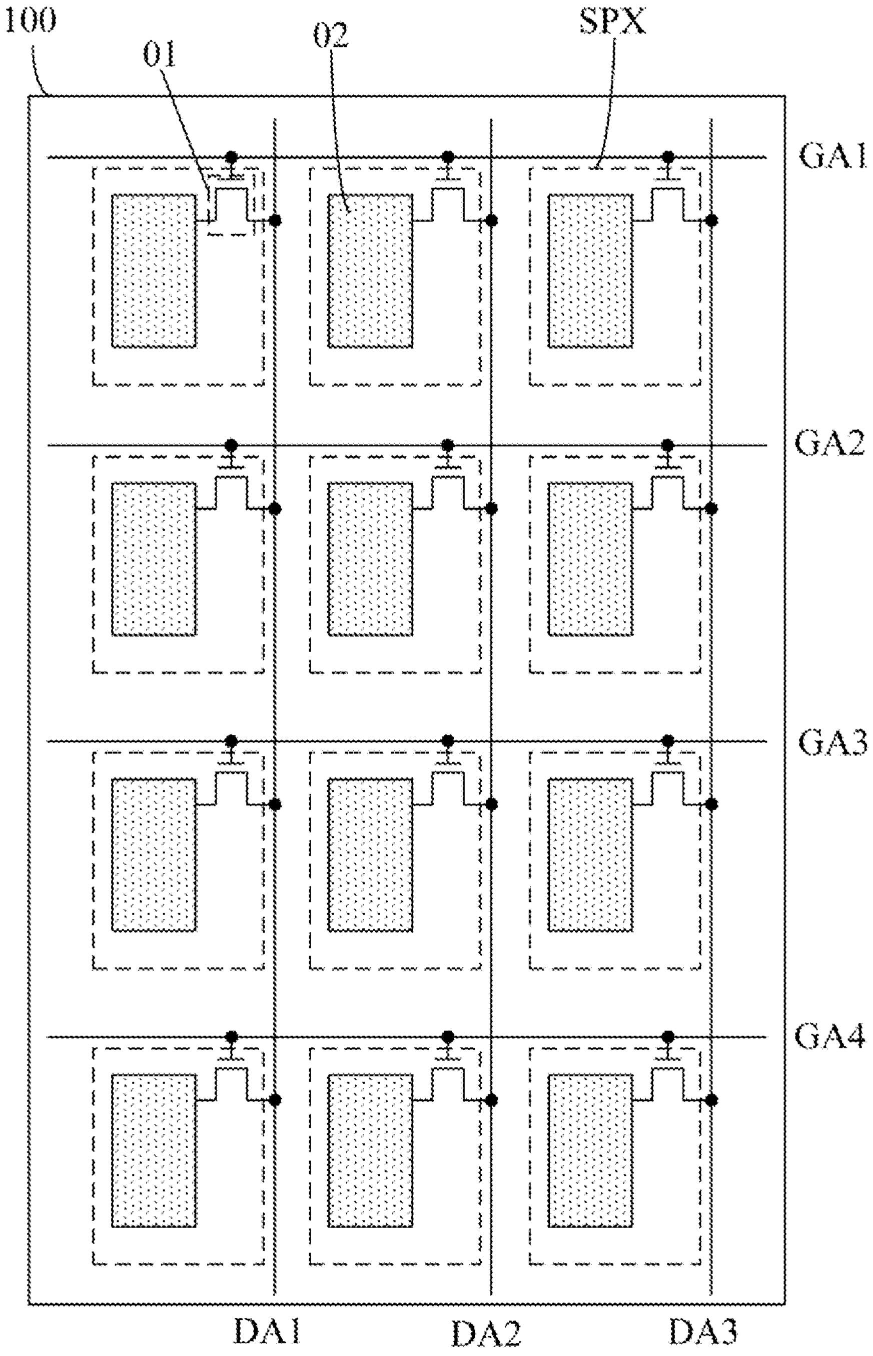
FIG. 2 is a schematic diagram illustrating some structures of a display panel provided by an embodiment of the present disclosure.

In some embodiments of the present disclosure, as shown in FIGS. 1 and 2, a display apparatus may include a display panel 100 and a drive control circuit 200. In some embodiments, the display panel 100 may include a plurality of pixel units arranged in an array, a plurality of scan signal lines GA (e.g., GA1, GA2, GA3, GA4), and a plurality of data signal lines DA (e.g., DA1, DA2, DA 3). Illustratively, each pixel unit may include a plurality of sub-pixels SPX with different colors. For example, a pixel unit may include three sub-pixels with different colors, which may be a red sub-pixel, a green sub-pixel, and a blue sub-pixel. Alternatively, the pixel unit may include four sub-pixels with different colors, which may be a red sub-pixel, a green sub-pixel, a blue sub-pixel, and a white sub-pixel. It should be noted that, in practical applications, the colors of light emitted by the sub-pixels and the specific number of the sub-pixels in the pixel unit may be determined and designed, according to practical application environments, and are not limited by the present disclosure.

In some embodiments of the present disclosure, as shown in FIG. 2, each sub-pixel SPX may include a switch transistor 01 and a pixel electrode 02. In some embodiments, a row of sub-pixels SPX are coupled to a scan signal line GA, and a column of sub-pixels SPX are coupled to a data signal line DA. Specifically, a gate of the switch transistor 01 is coupled to a corresponding scan signal line GA, a source of the switch transistor 01 is coupled to a corresponding data signal line DA, and a drain of the switch transistor 01 is coupled to the pixel electrode 02 in the same sub-pixel SPX. In specific implementation, when a scan drive signal loaded on the scan signal line GA is at an active level, the switch transistor 01 may be controlled to be turned on, so that the data voltage loaded on the data signal line DA may be input to the pixel electrode 02 through the turned-on switch transistor 01, thereby charging the pixel electrode 02, that is, charging the sub-pixel. In addition, when the scan drive signal loaded on the scan signal line GA is at an inactive level, the switch transistor 01 may be controlled to be turned off, so that the pixel electrode 02 may maintain the input data voltage through the turned-off switch transistor 01.

In some embodiments of the present disclosure, the pixel array structure in the present disclosure may alternatively be a dual-gate structure, that is, two scan signal lines are arranged between two adjacent rows of sub-pixels. This arrangement may reduce half of the data signal lines, that is, a data signal line is provided between some two adjacent rows of sub-pixels, and is not provided between other two adjacent rows of sub-pixels. It should be noted that, in practical applications, the specific arrangement structure of pixels and the arrangement manner of the data signal lines and the scan signal lines may be designed and determined according to practical application environments, and are not limited by the present disclosure.

In some embodiments of the present disclosure, the display panel in the embodiments of the present disclosure may be a Liquid Crystal Display (LCD) panel, an Organic Light Emitting Diode (OLED) display panel, a Quantum Dot Light Emitting Diode (QLED) display panel, an electronic paper display panel, or the like. Illustratively, taking a liquid crystal display panel as an example, the liquid crystal display panel may generally include an array substrate and an opposite substrate which are aligned and assembled together, and a liquid crystal molecule layer sealed between the array substrate and the opposite substrate. Illustratively, when a picture is displayed, since a voltage difference exists between the data voltage loaded on the pixel electrode of each sub-pixel and the common electrode voltage on the common electrode, the voltage difference may form an electric field, so that the liquid crystal molecules in the liquid crystal molecule layer are deflected by the electric field. The electric fields with different strengths enable the degree of deflection of liquid crystal molecules to be different, so that the transmittances of the sub-pixels are different, the sub-pixels can realize the brightness of different gray scales, and further, the picture display is realized.

In the following, it is taken as an example in the description that the display panel in the embodiment of the present disclosure is a liquid crystal display panel, and the pixel unit includes a red sub-pixel SPX, a green sub-pixel SPX, and a blue sub-pixel SPX. However, the reader should understand that the color of the sub-pixel SPX in the liquid crystal display panel is not limited thereto.

Figure 3:
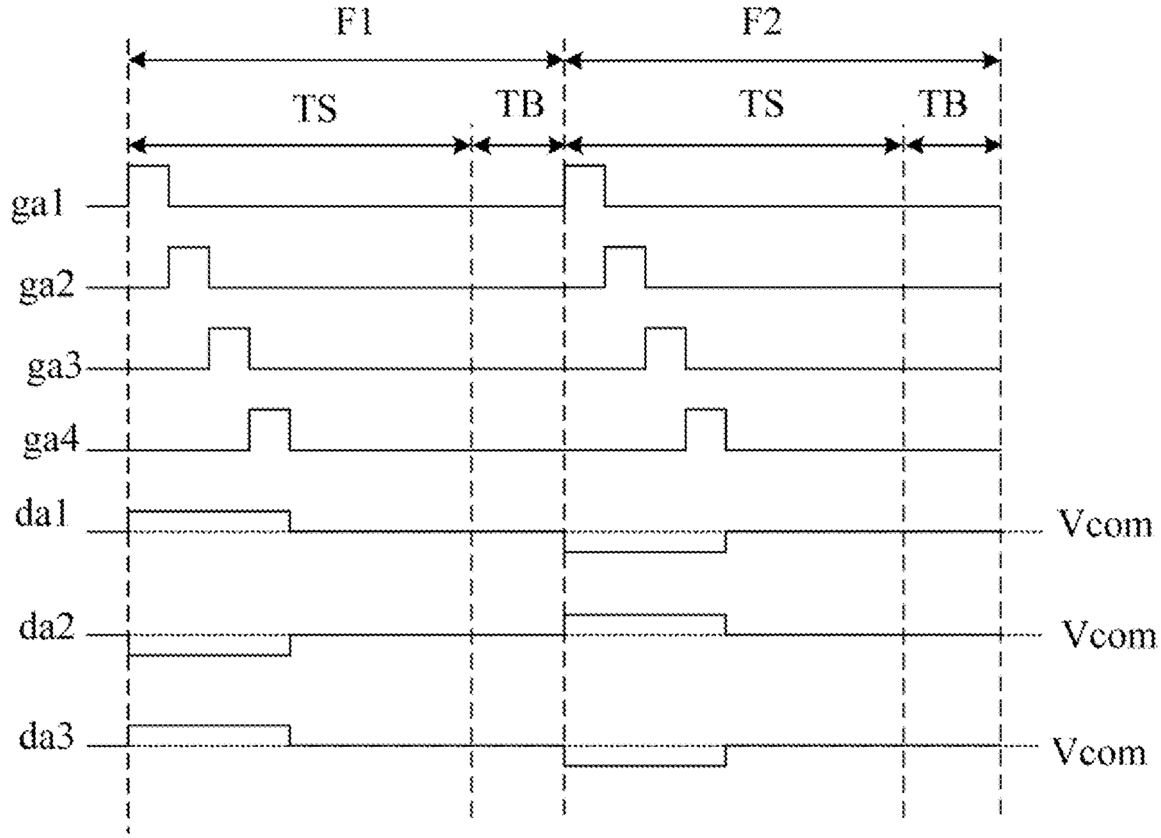
FIG. 3 is a timing diagram illustrating some signals provided by an embodiment of the present disclosure.

Illustratively, referring to FIG. 3, taking a sub-pixel SPX as an example, Vcom represents a common electrode voltage. When the data voltage input to the pixel electrode of the sub-pixel SPX is greater than the common electrode voltage Vcom, the liquid crystal molecules in the sub-pixel SPX may have a positive polarity, and the polarity corresponding to the data voltage in the sub-pixel SPX is a positive polarity. When the data voltage input to the pixel electrode of the sub-pixel SPX is less than the common electrode voltage Vcom, the liquid crystal molecules in the sub-pixel SPX may have a negative polarity, and the polarity corresponding to the data voltage in the sub-pixel SPX is a negative polarity. Illustratively, referring to FIGS. 2 and 3, a frame inversion (which may alternatively be a dot inversion, a column inversion, a row inversion, etc., and the present disclosure is only described taking the frame inversion as an example) is taken as an example, where, as shown in FIG. 3, ga1 represents a scan drive signal loaded on the scan signal line GA1, ga2 represents a scan drive signal loaded on the scan signal line GA2, da1 represents a data voltage loaded on the data signal line DA1, and da2 represents a data voltage loaded on the data signal line DA2.

Illustratively, as shown in FIGS. 2 and 3, the display panel may include a data refresh phase TS and a blanking time phase TB in each of different display frames F1 and F2. In the data refresh phase TS of the display frame F1, data voltages input to the sub-pixels in the display panel may be controlled, so that the display panel displays a picture of the display frame F1. Specifically, the scan drive signal ga1 is loaded on the scan signal line GA1, the scan drive signal ga2 is loaded on the scan signal line GA2, and when an active level (e.g., a high level signal in each of the scan drive signals ga1 to ga4) appears in each of the signals ga1 to ga4, the switch transistor 01, which is coupled to a corresponding one of the scan signal lines GA1 to GA4, is controlled to be turned on. For example, when a high level signal appears in the scan drive signal ga1, the switch transistors 01 in the first row of sub-pixels may all be controlled to be turned on. In addition, the data signal line DA1 is loaded with a data voltage da1 corresponding to the positive polarity, the data signal line DA2 is loaded with a data voltage da2 corresponding to the negative polarity, and the data signal line DA3 is loaded with a data voltage da3 corresponding to the positive polarity, so that the data voltages loaded on the data signal lines DA1 to DA3 are input to the pixel electrodes 02 in the first row of sub-pixels, through the turned-on switch transistors 01 in the first row of sub-pixels, so that the corresponding data voltages can be input to the pixel electrodes 02 in the first row of sub-pixels, and further, each sub-pixel in the first row can be input with the data voltage, thereby realizing the charging of each sub-pixel in the first row.

Then, in a blanking time phase TB of the display frame F1, the scan drive signals ga1 to ga4 are all low level signals, the switch transistor 01 in each sub-pixel in the display panel is in a turned-off state, and the pixel electrode 02 in each sub-pixel can be controlled to maintain the data voltage, so that the sub-pixels in the display panel can be controlled to maintain the data voltages, and the display panel can continue to display the picture of the display frame F1.

The implementation of the remaining sub-pixels is similarly performed in sequence, until charging the corresponding data voltages is finished throughout the sub-pixels in the whole display panel, which is not repeated herein.

Illustratively, in the data refresh phase TS of the display frame F2, data voltages input to the sub-pixels in the display panel may be controlled, so that the display panel displays a picture of the display frame F2. Specifically, the scan drive signal ga1 is loaded on the scan signal line GA1, the scan drive signal ga2 is loaded on the scan signal line GA2, and when an active level (e.g., a high level signal in each of the scan drive signals ga1 to ga4) appears in each of the signals ga1 to ga4, the switch transistor 01, which is coupled to a corresponding one of the scan signal lines GA1 to GA4, is controlled to be turned on. For example, when a high level signal appears in the scan drive signal ga1, the switch transistors 01 in the first row of sub-pixels may all be controlled to be turned on. In addition, the data signal line DA1 is loaded with a data voltage da1 corresponding to the negative polarity, the data signal line DA2 is loaded with a data voltage da2 corresponding to the positive polarity, and the data signal line DA3 is loaded with a data voltage da3 corresponding to the negative polarity, so that the data voltages loaded on the data signal lines DA1 to DA3 are input to the pixel electrodes 02 in the first row of sub-pixels, through the turned-on switch transistors 01 in the first row of sub-pixels, so that the corresponding data voltages can be input to the pixel electrodes 02 in the first row of sub-pixels, and further, each sub-pixel in the first row can be input with the data voltage, thereby realizing the charging of each sub-pixel in the first row.

Then, in a blanking time phase TB of the display frame F2, the scan drive signals ga1 to ga4 are all low level signals, the switch transistor 01 in each sub-pixel in the display panel is in a turned-off state, and the pixel electrode 02 in each sub-pixel can be controlled to maintain the data voltage, so that the sub-pixels in the display panel can be controlled to maintain the data voltage, and the display panel can continue to display the picture of the display frame F2.

The implementation of the remaining sub-pixels is similarly performed in sequence until charging the corresponding data voltages is finished throughout the sub-pixels in the whole display panel, which is not repeated herein.

In general, in a display panel such as a Liquid Crystal Display (LCD) panel, an Organic Light Emitting Diode (OLED) display panel, a Quantum Dot Light Emitting Diodes (QLED) display panel, an electronic paper display panel, or the like, power consumption, especially logic drive power consumption, has always been a key consideration in device design. As the resolution and the refresh rate of the display panel continue to increase, the logic drive power consumption also increases. On the other hand, with the increasing demand for low-carbon living, the demand for low power consumption performance of the display panel is also increasing. Therefore, under the condition of satisfying the requirements of people on high image quality of the display panel with high resolution and high refresh rate, the reduction of power consumption is becoming an important subject and a difficult problem of research and development of the display panel.

In the conventional display panel, a picture of each display frame is displayed at a fixed refresh rate, and even if an area, such as upper and lower black areas of a movie, has no display content, the data voltage is normally refreshed at the fixed refresh rate in each display frame. In addition, in an area where text content or an image is still, the data voltage is normally refreshed at the fixed refresh rate for each display frame even though the picture is not changed. These refresh processes are all meaningless refreshes, resulting in wasted logic drive power consumption.

In order to reduce logic drive power consumption, it is possible to independently drive for a black picture area or a still picture area. For example, the black picture area and the still picture area are defined as non-refresh areas, and the remaining areas are defined as refresh areas. The non-refresh area and the refresh area can be independently refreshed, for example, the non-refresh area is not refreshed or is refreshed at a reduced refresh rate, the refresh area is normally refreshed, and a range of the refresh area can be adaptively and dynamically adjusted according to a change of the display content of the picture, so that the logic drive power consumption of the display panel is greatly reduced as far as possible on the premise of not influencing the high-quality display of the picture.

In general, a gate driver circuit coupled to all scan signal lines is provided in the display panel, to output scan drive signals to the coupled gate lines through the gate driver circuit. In addition, the gate driver circuit generally includes a plurality of cascaded shift registers, and the shift registers may operate in sequence, to input scan drive signals to the scan signal lines line by line, so that the scan signal lines can be driven line by line and the data voltages can be refreshed line by line. However, such a gate driver circuit is disadvantageous to realize that the non-refresh area is not refreshed or is refreshed at a reduced refresh rate, and the refresh area is normally refreshed.

For this reason, an embodiment of the present disclosure provides a drive control circuit 200, and the drive control circuit 200 includes a first control circuit 210 and a second control circuit. The first control circuit 210 may acquire image data, so that a first selection command signal can be output according to the acquired image data. In addition, by providing the second control circuit, the second control circuit is coupled to the scan signal lines in the display panel, and the second control circuit is further coupled to the first control circuit 210, so that the second control circuit can receive the first selection command signal output by the first control circuit 210, and thus, according to the received first selection command signal, target scan signal lines, to which scan drive signals are to be input, are determined from the scan signal lines in the display panel, and the scan drive signals are output to the target scan signal lines. Therefore, the display panel can be driven independently in different areas, and the logic drive power consumption of the display panel can be greatly reduced.

Illustratively, the first control circuit may be a timing controller (TCON) or a System On Chip (SOC), or the like, and is not limited herein.

In some embodiments of the present disclosure, as shown in FIG. 1, the drive control circuit 200 may include a first control circuit 210 and at least one second control circuit 220. All the second control circuits are coupled to the first control circuit 210, each of the second control circuits is coupled to at least one scan signal line, and different second control circuits are coupled to different scan signal lines. Moreover, the first control circuit 210 may be configured to acquire image data and output a first selection command signal according to the image data. In addition, the at least one second control circuit is configured to receive the first selection command signal, determine, according to the first selection command signal, target scan signal lines from among the scan signal lines in the display panel, and output scan drive signals to the target scan signal lines. Therefore, an area where the determined target scan signal lines are located in the display panel can serve as an area to be independently driven, so that independent driving is realized, and the logic drive power consumption of the display panel can be greatly reduced.

In some embodiments of the present disclosure, the present disclosure does not limit the number of the second control circuits. For example, one, two, three, four, six, eight, or more second control circuits may be provided. Moreover, the scan signal lines coupled to different second control circuits are different. A plurality of scan signal lines may be coupled to one second control circuit, or one scan signal line may be coupled to one second control circuit. In practical applications, the number of the second control circuits may be set according to the number of the scan signal lines in the display panel.

In some embodiments of the present disclosure, a plurality of scan signal lines provided in a display panel are divided into at least one scan signal line group, each including at least one scan signal line. Moreover, the second control circuits are arranged in one-to-one correspondence with the scan signal line groups. Illustratively, the plurality of scan signal lines provided in the display panel are divided into one scan signal line group, and one second control circuit may be provided in the drive control circuit, so that the second control circuit determines, according to the received first selection command signal, target scan signal lines from among the plurality of scan signal lines, that is, determines scan signal lines that need to be independently driven, and inputs scan drive signals to these determined scan signal lines, to drive these determined target scan signal lines in one display frame without driving the scan signal lines other than the target scan signal lines. Alternatively, two second control circuits may be provided, and the two second control circuits each are coupled to the scan signal line group, and each may be configured to determine, according to the received first selection command signal, target scan signal lines from among the plurality of scan signal lines, that is, to determine scan signal lines that need to be independently driven, and input scan drive signals to these determined scan signal lines, to drive these determined target scan signal lines in one display frame without driving the scan signal lines other than the target scan signal lines.

Figure 4:
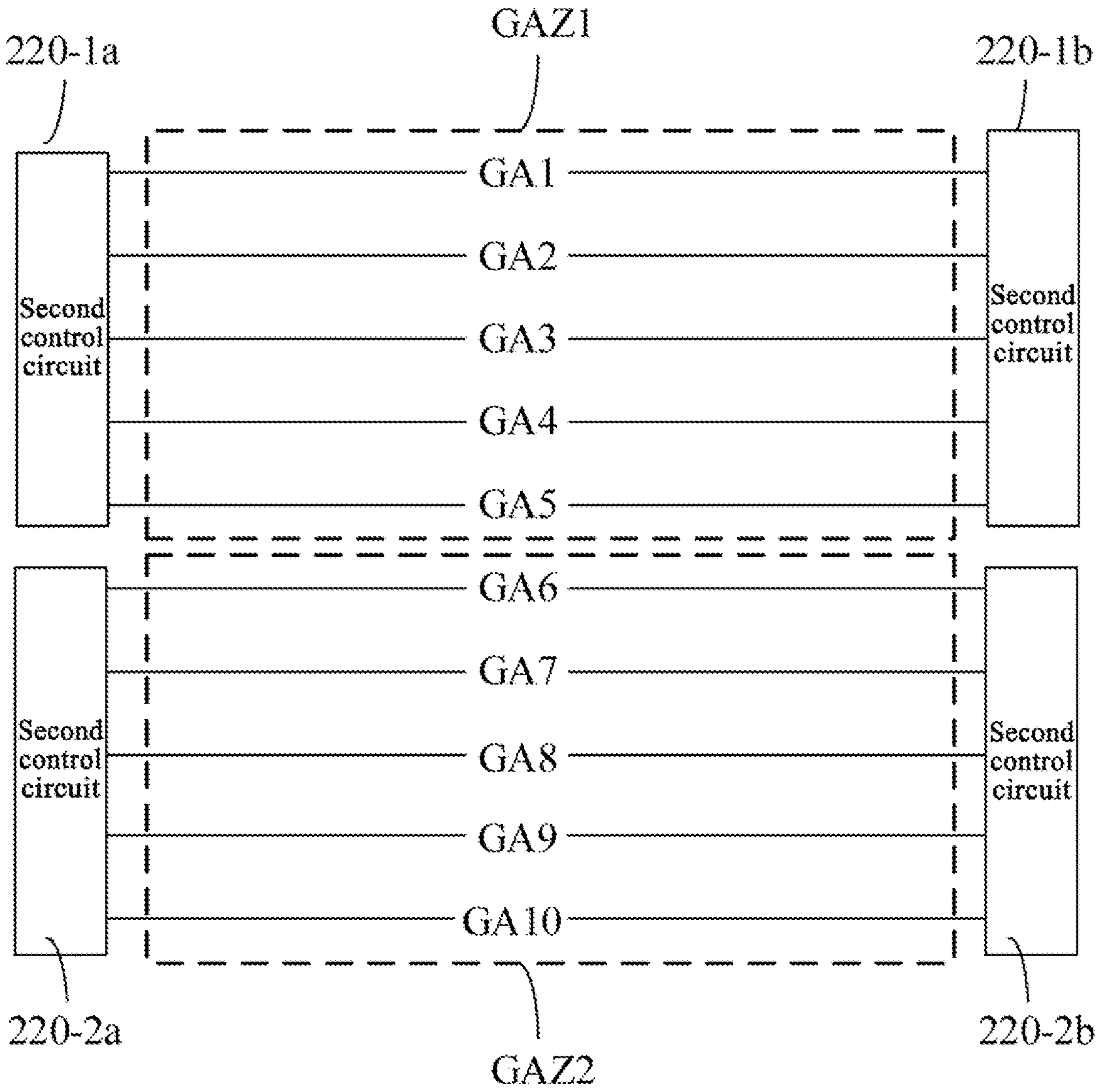
FIG. 4 is a schematic diagram illustrating other structures of a display apparatus provided by an embodiment of the present disclosure.

In some embodiments of the present disclosure, as shown in FIG. 4, optionally, the plurality of scan signal lines arranged in the display panel are divided into two scan signal line groups, where the two scan signal line groups are a first scan signal line group GAZ1 and a second scan signal line group GAZ2, respectively. Moreover, the first scan signal line group GAZ1 is provided with a second control circuit, and the second scan signal line group GAZ2 is provided with a second control circuit. Illustratively, the first scan signal line group GAZ1 may be provided with two second control circuits, which are a first second control circuit 220-1*a* and a second second control circuit 220-1*b*, respectively. The scan signal lines each have opposite first and second ends in an extending direction thereof. The first second control circuit 220-1*a* is coupled to the scan signal lines in the first scan signal line group GAZ1, for example, the first second control circuit 220-1*a* is coupled to first ends (e.g., left ends) of the scan signal lines in the first scan signal line group GAZ1. The second control circuit 220-1*b* is also coupled to the scan signal lines in the first scan signal line group GAZ1, for example, the second second control circuit 220-1*b* is coupled to second ends (e.g., right ends) of the scan signal lines in the first scan signal line group GAZ1.

Illustratively, the second scan signal line group GAZ2 may be provided with two second control circuits, which are a third second control circuit 220-2*a* and a fourth second control circuit 220-2*b*, respectively. The scan signal lines each have first and second ends opposite to each other in an extending direction thereof. The third second control circuit 220-2*a* is coupled to the scan signal lines in the second scan signal line group GAZ2, for example, the third second control circuit 220-2*a* is coupled to first ends (e.g., left ends) of the scan signal lines in the second scan signal line group GAZ2. The fourth second control circuit 220-2*b* is also coupled to the scan signal lines in the second scan signal line group GAZ2, for example, the fourth second control circuit 220-2*b* is coupled to second ends (e.g., right ends) of the scan signal lines in the second scan signal line group GAZ2.

Illustratively, taking ten scan lines GA in the display panel (i.e. scan lines GA1 to GA10) as an example, the first scan line group GAZ1 may include a first scan line GA1 to a fifth scan line GA5, and the second scan line group GAZ2 may include a sixth scan line GA6 to a tenth scan line GA10. Thus, the first second control circuit 220-1*a* is coupled to the first ends of the first to fifth scan signal lines GA1 to GA5, and the second second control circuit 220-1*b* is coupled to the second ends of the first to fifth scan signal lines GA1 to GA5. In addition, this also allows the third second control circuit 220-2*a* to be coupled to the first ends of the sixth to tenth scan signal lines GA6 to GA10, and allows the fourth second control circuit 220-2*b* to be coupled to the second ends of the sixth to tenth scan signal lines GA6 to GA10.

In some embodiments of the present disclosure, the first control circuit 210 is further configured to pre-store address information of the second control circuit coupled to the first control circuit 210, so that the first control circuit 210 can determine the first selection command signal and outputs the determined first selection command signal to the second control circuit, according to the image data and the pre-stored address information of the second control circuit coupled to the first control circuit 210. That is, the first selection command signal includes address information corresponding to the second control circuit coupled to the target scan signal lines and data selected information corresponding to the target scan signal lines. Moreover, each second control circuit is further configured to receive the first selection command signal, and determine, according to the data selected information in the first selection command signal corresponding to the address information of the second control circuit, target scan signal lines from among the scan signal lines in the display panel.

Illustratively, the address information may be identity documents (ID) of different second control circuits. Optionally, the address information may be a digital signal, for example, the address information of the first second control circuit 220-1*a* may be 000, the address information of the second second control circuit 220-1*b* may be 001, the address information of the third second control circuit 220-2*a* may be 010, and the address information of the fourth second control circuit 220-2*b* may be 011.

Illustratively, when the first selection command signal includes address information of 000 and 001, the first second control circuit 220-1*a* may determine, according to the data selected information in the first selection command signal corresponding to the address information of the first second control circuit 220-1*a*, target scan signal lines from among the scan signal lines in the display panel/coupled scan signal lines coupled to the first second control circuit 220-1*a*. In addition, the second second control circuit 220-1*b* may determine, according to the data selected information in the first selection command signal corresponding to the address information of the second second control circuit 220-1*b*, target scan signal lines from among the scan signal lines in the display panel/coupled scan signal lines coupled to the second second control circuit 220-1*b*. Illustratively, when the first selection command signal includes address information of 010 and 011, the third second control circuit 220-2*a* may determine, according to the data selected information in the first selection command signal corresponding to the address information of the third second control circuit 220-2*a*, target scan signal lines from among the scan signal lines in the display panel/coupled scan signal lines coupled to the third second control circuit 220-2*a*. The fourth second control circuit 220-2*b* may determine, according to the data selected information in the first selection command signal corresponding to the address information of the fourth second control circuit 220-2*b*, target scan signal lines from among the scan signal lines in the display panel/coupled scan signal lines coupled to the fourth second control circuit 220-2*b*.

Illustratively, the data selected information may be identity documents (ID) of different scan signal lines. Optionally, the data selected information may be a digital signal, for example, the data selected information corresponding to the first scan signal line GA1 may be 0000, the data selected information corresponding to the second scan signal line GA2 may be 0001, the data selected information corresponding to the third scan signal line GA3 may be 0010, the data selected information corresponding to the fourth scan signal line GA4 may be 0011, the data selected information corresponding to the fifth scan signal line GA5 may be 0100, the data selected information corresponding to the sixth scan signal line GA6 may be 0101, the data selected information corresponding to the seventh scan signal line GA7 may be 0110, the data selected information corresponding to the eighth scan signal line GA8 may be 0111, the data selected information corresponding to the ninth scan signal line GA9 may be 1000, and the data selected information corresponding to the tenth scan signal line GA10 may be 1001.

Illustratively, when the first selection command signal includes address information of 000 and 001 and the data selected information may be 0000 to 0001, the first second control circuit 220-1*a* may determine, according to data selected information in the first selection command signal: 0000 to 0001, the first scan signal line GA1 and the second scan signal line GA2 from among the scan signal lines in the display panel, as target scan signal lines, so that the scan drive signals are input to only the first scan signal line GA1 and the second scan signal line GA2. Moreover, scan-off signals (e.g., low level signals) are input to the third to fifth scan signal lines GA3 to GA5. In addition, the second second control circuit 220-1*b* may determine, according to the data selected information in the first selection command signal: 0000 to 0001, the first scan signal line GA1 and the second scan signal line GA2 from among the scan signal lines in the display panel, as target scan signal lines, so that the scan drive signals are input to only the first scan signal line GA1 and the second scan signal line GA2. Moreover, scan-off signals (e.g., low level signals) are input to the third to fifth scan signal lines GA3 to GA5. Further, the first second control circuit 220-1*a* may determine, according to the data selected information in the first selection command signal: 0000 to 0001, the first scan signal line GA1 and the second scan signal line GA2 from among the coupled scan signal lines, as target scan signal lines, so that the scan drive signals are input to only the first scan signal line GA1 and the second scan signal line GA2. Moreover, scan-off signals (e.g., low level signals) are input to the third to fifth scan signal lines GA3 to GA5. In addition, the second second control circuit 220-1*b* may determine, according to the data selected information: 0000 to 0001 in the first selection command signal, the first scan signal line GA1 and the second scan signal line GA2 from among the coupled scan signal lines, as target scan signal lines, so that the scan drive signals are input to only the first scan signal line GA1 and the second scan signal line GA2. Moreover, scan-off signals (e.g., low level signals) are input to the third to fifth scan signal lines GA3 to GA5.

Illustratively, when the first selection command signal includes address information of 010 and 011 and the data selected information may be 1000 to 1001, the third second control circuit 220-2*a* may determine, according to the data selected information: 1000 to 1001 in the first selection command signal, the ninth scan signal line GA9 and the tenth scan signal line GA10 from among the scan signal lines in the display panel, as target scan signal lines, so that the scan drive signals are input to only the ninth scan signal line GA9 and the tenth scan signal line GA10. Moreover, scan-off signals (e.g., low level signals) are input to the sixth to eighth scan signal lines GA6 to GA8. In addition, the fourth second control circuit 220-2*b* may determine, according to the data selected information: 1000 to 1001 in the first selection command signal, the ninth scan signal line GA9 and the tenth scan signal line GA10 from among the scan signal lines in the display panel, as target scan signal lines, so that the scan drive signals are input to only the ninth scan signal line GA9 and the tenth scan signal line GA10. Moreover, scan-off signals (e.g., low level signals) are input to the sixth to eighth scan signal lines GA6 to GA8. Further, the third second control circuit 220-2*a* may determine, according to the data selected information: 1000 to 1001 in the first selection command signal, the ninth scan signal line GA9 and the tenth scan signal line GA10 from among the coupled scan signal lines, as target scan signal lines, so that the scan drive signals are input to only the ninth scan signal line GA9 and the tenth scan signal line GA10. Moreover, scan-off signals (e.g., low level signals) are input to the sixth to eighth scan signal lines GA6 to GA8. In addition, the fourth second control circuit 220-2*b* may determine, according to the data selected information: 1000 to 1001 in the first selection command signal, the ninth scan signal line GA9 and the tenth scan signal line GA10 from among the coupled scan signal lines, as target scan signal lines, so that the scan drive signals are input to only the ninth scan signal line GA9 and the tenth scan signal line GA10. Moreover, scan-off signals (e.g., low level signals) are input to the sixth to eighth scan signal lines GA6 to GA8.

In some embodiments of the present disclosure, the first control circuit 210 may be further configured to acquire image data corresponding to a plurality of consecutive display frames. That is, image data corresponding to each of two or more consecutive display frames may be acquired. Then, the first control circuit 210 may compare the image data of the consecutive display frames, to determine whether set picture data in a same first image area in image data of at least two adjacent display frames exists in the consecutive display frames. When it is determined that the consecutive display frames includes at least two adjacent display frames, the image data of which each has the set picture data in the same first image area, it is possible to determine an area outside the first image area as a second image area TX2, determine scan signal lines coupled to the pixel units in the first image area as target scan signal lines, and output a first selection command signal according to the determined scan signal lines, in each of the at least two adjacent display frames. This makes it possible for the second control circuit to output the scan drive signals to the scan signal lines in the first image area, so that it is possible to drive only the scan signal lines in the first image area, without driving the scan signal lines in the second image area TX2. Thus, independently driving the first image area can be realized, and the logic drive power consumption can be reduced.

In some embodiments, the set picture data may be a black picture data, and the first image area may be a black picture area. Illustratively, the black picture data may be set to display data corresponding to 0 gray scale.

In other embodiments, the set picture data may be still/static picture data, and the second image area TX2 may be a still/static picture area.

In some embodiments of the present disclosure, the first control circuit 210 may be further configured to acquire image data corresponding to a plurality of consecutive display frames. That is, image data corresponding to each of two or more consecutive display frames may be acquired. Thereafter, the first control circuit 210 may compare the image data of the consecutive display frames, to determine whether set picture data in a same first image area in image data of at least two adjacent display frames exists in the consecutive display frames. When it is determined that the consecutive display frames includes at least two adjacent display frames, the image data of which each has the set picture data in the same first image area, it is possible to determine an area outside the first image area as the second image area TX2, determine the scan signal lines coupled to the pixel units in the second image area TX2 as target scan signal lines, and output the first selection command signal according to the determined scan signal lines, in each of the at least two adjacent display frames. This makes it possible for the second control circuit to output the scan drive signals to the scan signal lines in the second image area TX2, so that it is possible to drive only the scan signal lines in the second image area TX2, without driving the scan signal lines in the first image area. Thus, independently driving the first image area can be realized, and the logic drive power consumption can be reduced.

Figure 5:
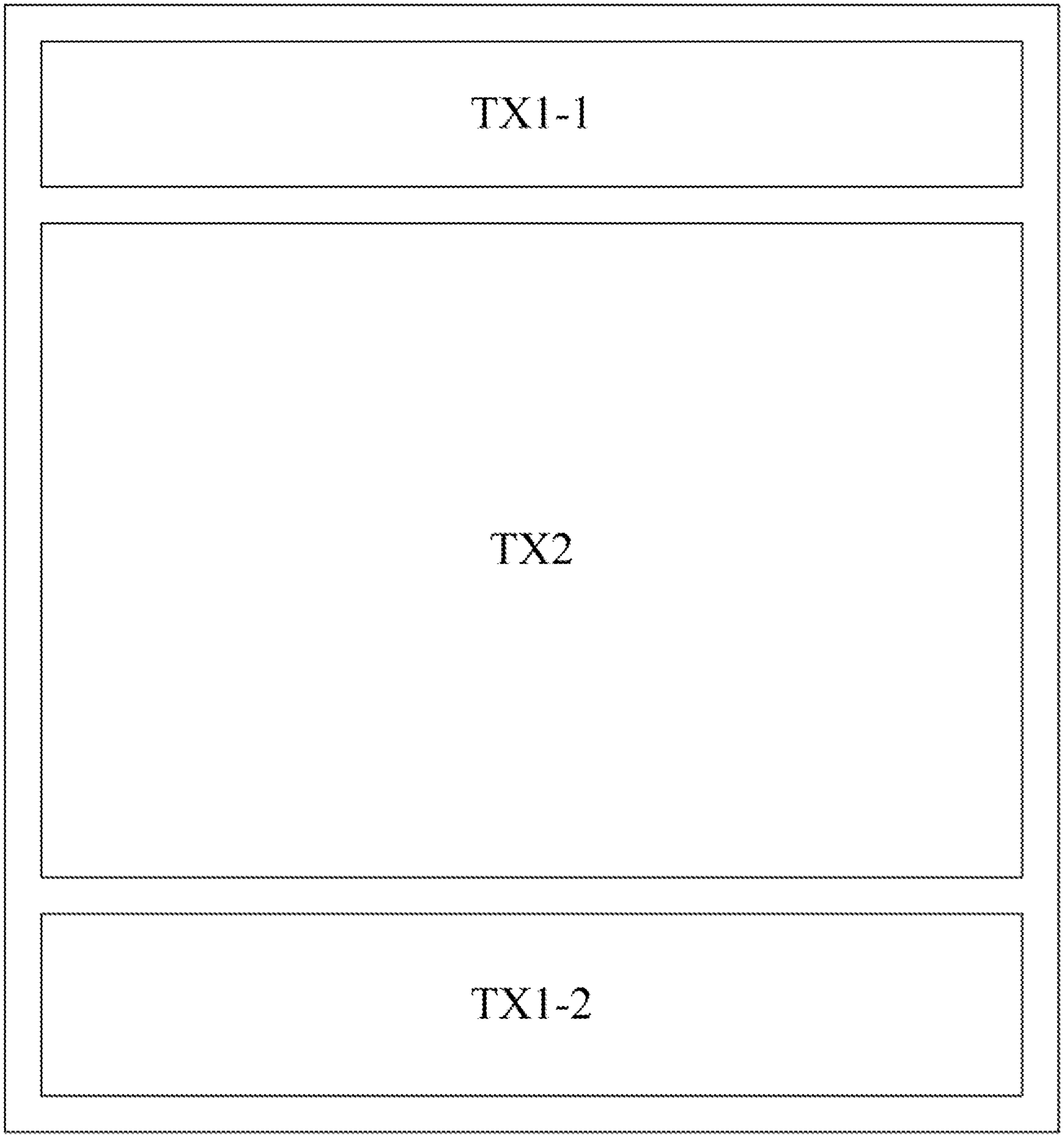
FIG. 5 is a schematic diagram illustrating other structures of a display panel provided by an embodiment of the present disclosure.

In some embodiments of the present disclosure, the first image area may include a plurality of adjacent pixel unit rows, and the second image area TX2 may also include a plurality of adjacent pixel unit rows. Moreover, the first image area includes different pixel unit rows from the second image area TX2. Moreover, the number of pixel unit rows in the first image area may be the same as or different from the number of pixel unit rows in the second image area TX2. Illustratively, at least one first image area may be set, and at least one second image area TX2 may also be set. The at least one first image area and the at least one second image area TX2 are alternately arranged. Alternatively, as shown in FIG. 5, two first image areas are provided, which are a first first image area TX1-1 and a second first image area TX1-2, respectively. One second image area TX2 is provided, that is the second image area TX2. In addition, the second image area TX2 is arranged between the first first image area TX1-1 and the second first image area TX1-2.

Illustratively, taking the display panel provided with ten scan signal lines and correspondingly provided with the first second control circuit 220-1*a* to the fourth second control circuit 220-2*b* as an example, for example, the first first image area TX1-1 includes a first pixel unit row and a second pixel unit row, and the scan signal lines corresponding to the first first image area TX1-1 are the first scan signal line GA1 and the second scan signal line GA2; the second image area TX2 includes third to eighth pixel unit rows, and the scan signal lines corresponding to the second image area TX2 are the third to eighth scan signal lines GA3 to GA8; and the second first image area TX1-2 includes a ninth pixel unit row and a tenth pixel unit row, and the scan signal lines corresponding to the second first image area TX1-2 are the ninth scan signal line GA9 and the tenth scan signal line GA10. Then, during one display frame, the first control circuit 210 outputs a first selection command signal CX1, and the first selection command signal CX1 includes address information of 000, 001, 010, and 011, and may include data selected information of 0000 to 0001 and 1000 to 1001. The first second control circuit 220-1*a* may determine, according to the data selected information: 0000 to 0001 in the first selection command signal CX1, the first scan signal line GA1 and the second scan signal line GA2 from among the coupled scan signal lines, as target scan signal lines, so that the scan drive signals are input to only the first scan signal line GA1 and the second scan signal line GA2. Moreover, scan-off signals (e.g., low level signals) are input to the third to fifth scan signal lines GA3 to GA5. In addition, the second second control circuit 220-1*b* may determine, according to the data selected information: 0000 to 0001 in the first selection command signal CX1, the first scan signal line GA1 and the second scan signal line GA2 from among the coupled scan signal lines, as target scan signal lines, so that the scan drive signals are input to only the first scan signal line GAL and the second scan signal line GA2. Moreover, scan-off signals (e.g., low level signals) are input to the third to fifth scan signal lines GA3 to GA5. This allows for independently driving the first first image area TX1-1.

In addition, the third second control circuit 220-2*a* may determine, according to the data selected information: 1000 to 1001 in the first selection command signal CX1, the ninth scan signal line GA9 and the tenth scan signal line GA10 from among the coupled scan signal lines, as target scan signal lines, so that the scan drive signals are input to only the ninth scan signal line GA9 and the tenth scan signal line GA10. Moreover, scan-off signals (e.g., low level signals) are input to the sixth to eighth scan signal lines GA6 to GA8. In addition, the fourth second control circuit 220-2*b* may determine, according to the data selected information: 1000 to 1001 in the first selection command signal CX1, the ninth scan signal line GA9 and the tenth scan signal line GA10 from among the coupled scan signal lines, as target scan signal lines, so that the scan drive signals are input to only the ninth scan signal line GA9 and the tenth scan signal line GA10. Moreover, scan-off signals (e.g., low level signals)

are input to the sixth to eighth scan signal lines GA6 to GA8. This allows for independently driving the second first image area TX1-2.

Illustratively, taking the display panel provided with ten scan signal lines and correspondingly provided with the first second control circuit 220-1*a* to the fourth second control circuit 220-2*b* as an example, for example, the first first image area TX1-1 includes a first pixel unit row and a second pixel unit row, and the scan signal lines corresponding to the first first image area TX1-1 are the first scan signal line GA1 and the second scan signal line GA2; the second image area TX2 includes third to eighth pixel unit rows, and the scan signal lines corresponding to the second image area TX2 are the third to eighth scan signal lines GA3 to GA8; and the second first image area TX1-2 includes a ninth pixel unit row and a tenth pixel unit row, and the scan signal lines corresponding to the second first image area TX1-2 are the ninth scan signal line GA9 and the tenth scan signal line GA10. Then, during one display frame, the first control circuit 210 outputs a first selection command signal CX2, and the first selection command signal CX2 includes address information of 000, 001, 010, and 011, and may include data selected information of 0010 to 0111. The first second control circuit 220-1*a* may determine, according to the data selected information: 0010 to 0100 in the first selection command signal CX2, the third to fifth scan signal lines GA3 to GA5 from among the coupled scan signal lines, as target scan signal lines, so that the scan drive signals are input to only the third to fifth scan signal lines GA3 to GA5. Moreover, scan-off signals (e.g., low level signals) are input to the first scan signal line GA1 and the second scan signal line GA2. In addition, the second second control circuit 220-1*b* may determine, according to the data selected information: 0010 to 0100 in the first selection command signal CX2, the third to fifth scan signal lines GA3 to GA5 from among the coupled scan signal lines, as target scan signal lines, so that the scan drive signals are input only to the third to fifth scan signal lines GA3 to GA5. Moreover, scan-off signals (e.g., low level signals) are input to the first scan signal line GA1 and the second scan signal line GA2.

In addition, the third second control circuit 220-2*a* may determine, according to the data selected information: 0101 to 0111 in the first selection command signal CX2, the sixth to eighth scan signal lines GA6 to GA8 from among the coupled scan signal lines, as target scan signal lines, so that the scan drive signals are input to only the sixth to eighth scan signal lines GA6 to GA8. Moreover, scan-off signals (e.g., low level signals) are input to the ninth scan signal line GA9 and the tenth scan signal line GA10. In addition, the fourth second control circuit 220-2*b* may determine, according to the data selected information: 0101 to 0111 in the first selection command signal CX2, the sixth to eighth scan signal lines GA6 to GA8 from among the coupled scan signal lines, as target scan signal lines, so that the scan drive signals are input to only the sixth to eighth scan signal lines GA6 to GA8. Moreover, scan-off signals (e.g., low level signals) are input to the ninth scan signal line GA9 and the tenth scan signal line GA10. This allows for independently driving the second image area TX2.

In general, in a display panel, electrons flow to generate a current, the current passes through elements such as a signal line, a transistor, and the like, and the element itself has a resistance, and electric charges may be consumed through a resistance heating effect. An expression for power consumption P is:

$$P = \frac{1}{T}\int_0^r u(t)\, i(t) dt, \tag{1}$$

where u(t) represents a voltage at time t during the T time period, and i(t) represents a current at time t during the T time period. Therefore, according to the above formula, the power consumption is an integral of a product of the voltage and the current per unit time. For a square wave pulse signal, under a certain period, the higher the voltage jump amplitude and the current are, the higher the power consumption is. In a case where the product of voltage and current is constant, the shorter the period is, that is, the higher the frequency is, the higher the power consumption is.

An expression for the current is:

$$i(t) = C \cdot \frac{du(t)}{dt}, \tag{2}$$

where C represents a parasitic capacitance of the signal line. As can be seen from the above formula, in a case where the voltage jump amplitude is constant, the higher the parasitic capacitance of the signal line is, the higher the generated current is.

Therefore, reducing the number of signal outputs (no refresh) and reducing a refresh rate of the signal are straightforward and effective ways to reduce the logic drive power consumption.

As shown in FIG. 5, in the display scene, the second image area TX2 in which the middle third to eighth rows of sub-pixels are located may be defined as a dynamic display area, the first first image area TX1-1 in which the first and second rows of sub-pixels are located may be defined as a black picture area, and the second first image area TX1-2 in which the ninth and tenth rows of sub-pixels are located may also be defined as a black picture area. Illustratively, in each of at least two adjacent display frames, scan drive signals may be output to only scan signal lines in the second image area TX2 based on the foregoing implementation manner, so that only the dynamic display area may be scanned, while no scan drive signal is input to scan signal lines in the first first image area TX1-1 and the second first image area TX1-2. That is, other areas than the second image area TX2 are not scanned, and the data signals are normally output. The scheme can realize reduction of the drive power consumption at the scan side, which is reduced by $$\left(1 - \frac{n-m}{N}\right).$$

N represents a total number of pixel unit rows in the display panel, n represents an $n^{th}$ pixel unit row in the display panel, and m represents an $m^{th}$ pixel unit row in the display panel. Illustratively, based on the above embodiment, it may be set to m=3 and n=8. It should be noted that specific values of m and n may be designed and determined according to requirements of practical applications, and are not limited herein.

As shown in FIG. 5, in the display scene, the second image area TX2 in which the middle third to eighth rows of sub-pixels are located may be defined as a dynamic display area, the first first image area TX1-1 in which the first and second rows of sub-pixels are located may be defined as a black picture area, and a second first image area TX1-2 in which the ninth and tenth rows of sub-pixels are located may also be defined as a black picture area. Illustratively, in each of at least two adjacent display frames, scan drive signals may be output to only scan signal lines in the first first image area TX1-1 and the second first image area TX1-2 based on the foregoing implementation, so that only the first first image area TX1-1 and the second first image area TX1-2 may be scanned, while no scan drive signal is input to scan signal lines in the second image area TX2. That is, other areas than the first first image area TX1-1 and the second first image area TX1-2 are not scanned, and the data signals are normally output. The scheme can realize reduction of the drive power consumption at the scan side, which is reduced by $$\left(1 - \frac{n1 - m1}{N} - \frac{n2 - m2}{N}\right),$$

where n1 represents an $(n1)^{th}$ pixel unit row in the display panel, m1 represents an $(m1)^{th}$ pixel unit row in the display panel, n2 represents an $(n2)^{th}$ pixel unit row in the display panel, and m2 represents an $(m2)^{th}$ pixel unit row in the display panel. Illustratively, based on the above embodiment, it may be set to m1=1, n1=2, m2=10, and n2=9. The specific values of m1, n1, m2 and n2 may be designed and determined according to the requirements of practical applications, and are not limited herein.

In other embodiments, a plurality of first image areas may be set, a plurality of second image areas may be set, and the first image areas and the second image areas are alternately arranged. Illustratively, the number of the first image areas may be greater than the number of the second image areas. Alternatively, the number of first image areas may be less than the number of the second image areas. Alternatively, the number of the first image areas may be equal to the number of the second image areas. It should be noted that, these specific configurations may be determined according to the requirements of the practical application, and are not limited by the present disclosure.

Illustratively, the numbers of pixel unit rows in different first image areas may be the same as or different from each other. These specific settings may be determined according to the requirements of the practical application, and are not limited by the present disclosure.

Illustratively, the numbers of pixel unit rows in different second image areas may be the same as or different from each other. These specific settings may be determined according to the requirements of the practical application, and are not limited by the present disclosure.

Figure 6:
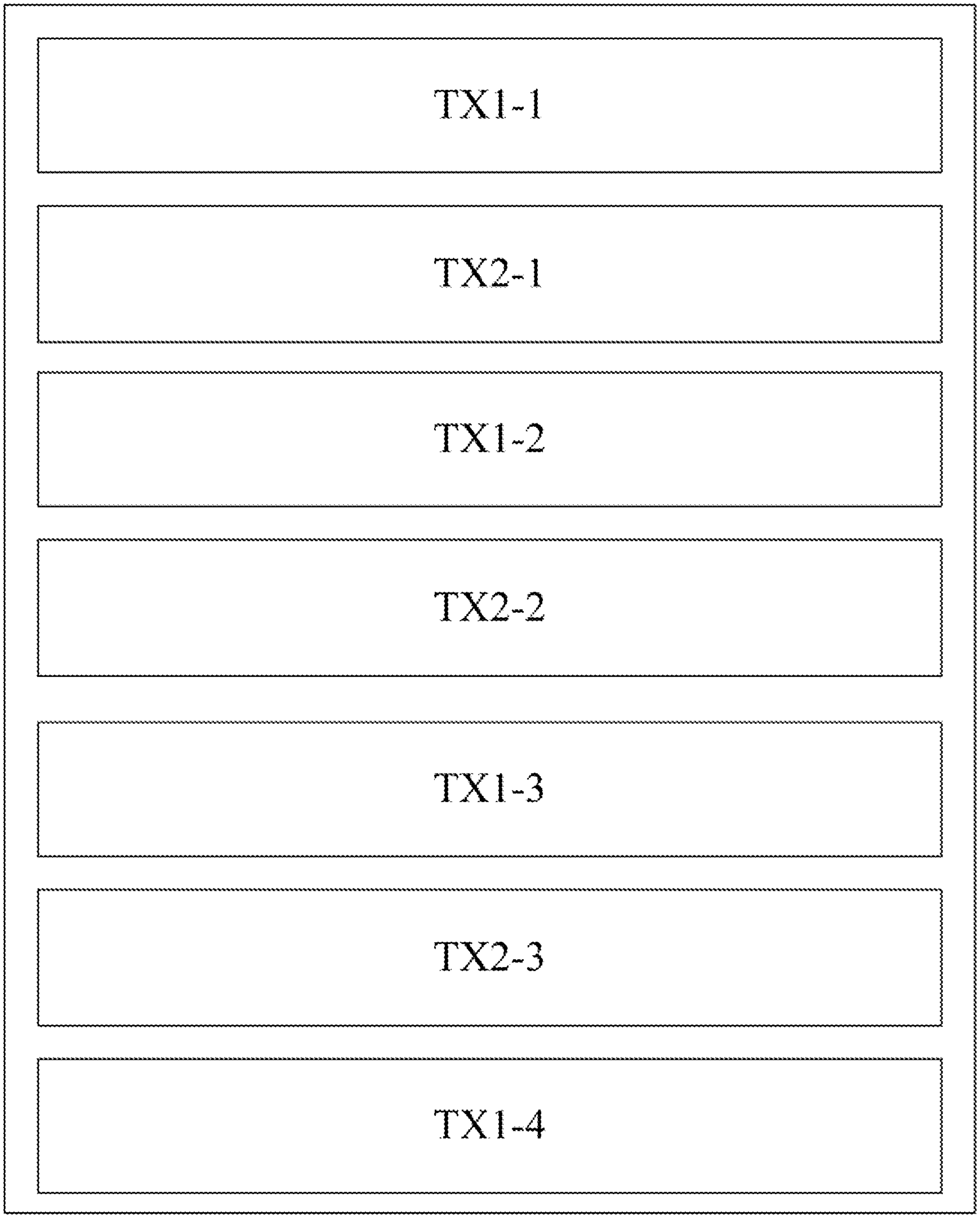
FIG. 6 is a schematic diagram illustrating other structures of a display panel provided by an embodiment of the present disclosure.

Illustratively, as shown in FIG. 6, four first image areas may be provided, and are a first first image area TX1-1, a second first image area TX1-2, a third first image area TX1-3 and a fourth first image area TX1-4. Three second image areas may be provided, and are a first second image area TX2-1, a second second image area TX2-2 and a third second image area TX2-3. Moreover, the first second image area TX2-1 is arranged between the first first image area TX1-1 and the second first image area TX1-2, the second second image area TX2-2 is arranged between the second first image area TX1-2 and the third first image area TX1-3, and the third second image area TX2-3 is arranged between the third first image area TX1-3 and the fourth first image area TX1-4. It should be noted that, in this embodiment, an operation of independently driving the first image area or the second image area may refer to the above description, and is not repeated herein.

In some embodiments of the present disclosure, the second control circuit may include a frame start signal control circuit and at least one first shift register unit. Each first shift register unit has a drive signal output terminal GP coupled to at least one scan signal line. In the same second control circuit, the frame start signal control circuit is coupled to an input signal terminal INP of each of the at least one first shift register unit. Illustratively, the second control circuit may include the frame start signal control circuit and one first shift register unit, that is, one frame start signal control circuit is coupled to the input signal terminal INP of the one first shift register unit, and the drive signal output terminal GO of the one first shift register unit is coupled to one scan signal line. Alternatively, the second control circuit may include the frame start signal control circuit and two, three, four or more first shift register units, that is, one frame start signal control circuit is coupled to the input signal terminals INP of the two, three, four or more first shift register units, and the drive signal output terminal GO of each first shift register unit is coupled to one scan signal line.

In some embodiments of the present disclosure, the frame start signal control circuit is configured to receive the first selection command signal, determine, according to corresponding address information and data selected information in the first selection command signal, target scan signal lines from a corresponding coupled scan signal line group, generate first target frame start signals corresponding to the target scan signal lines, according to the determined target scan signal lines, and input the generated first target frame start signals corresponding to the target scan signal lines to the input signal terminals INP of the first shift register units coupled to the target scan signal lines.

In some embodiments of the present disclosure, the first shift register unit is configured to receive the first target frame start signal corresponding to the coupled target scan signal line through the input signal terminal INP, and provide a clock signal input to a clock control signal terminal CK to the coupled target scan signal line, according to the received first target frame start signal, to output a scan drive signal to the target scan signal line.

Figure 7:
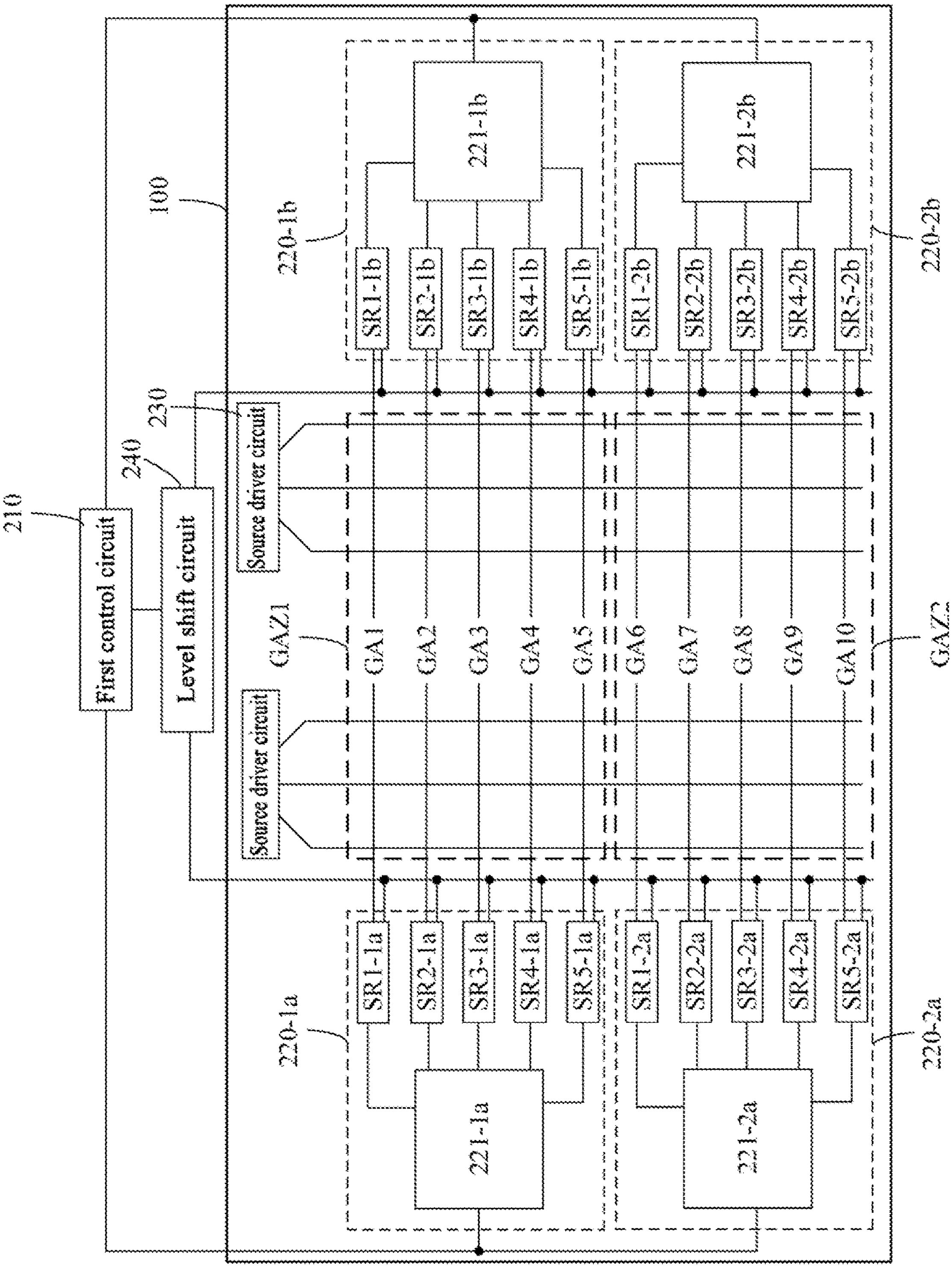
FIG. 7 is a schematic diagram illustrating other structures of a display apparatus provided by an embodiment of the present disclosure.

In some embodiments of the present disclosure, as shown in FIG. 7, the frame start signal control circuit and the first shift register unit are arranged in the display panel, and the display panel further includes a plurality of first clock control signal lines. A clock control signal terminal CK of the first shift register unit in the second control circuit is coupled to at least one of the plurality of first clock control signal lines. For example, the clock control signal terminal CK of the first shift register unit in the second control circuit is coupled to one of the plurality of first clock control signal lines. It should be noted that FIG. 7 simply illustrates the first clock control signal line.

Figure 8A:
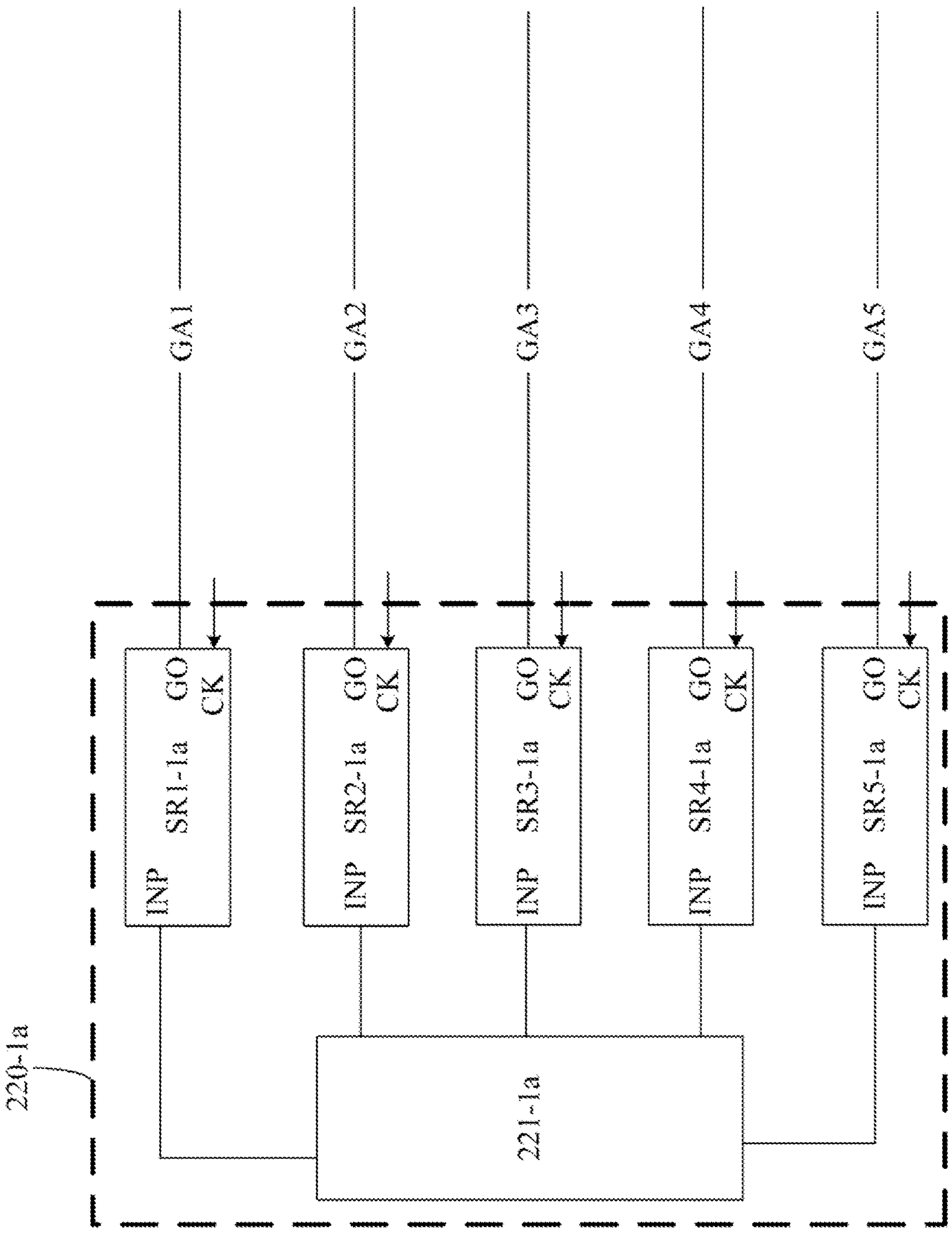
FIG. 8*a* is a schematic diagram illustrating other structures of a display apparatus provided by an embodiment of the present disclosure.

In some embodiments of the present disclosure, as shown in FIGS. 7 and 8*a*, the first second control circuit 220-1*a* may include a frame start signal control circuit 221-1*a* and first shift register units SR1-1*a* to SR5-1*a*. The frame start signal control circuit 221-1*a* is coupled to the input signal terminals INP of the first shift register units SR1-1*a* to SR5-1*a*, and the drive signal output terminals GO of the first shift register units SR1-1*a* to SR5-1*a* are coupled to the scan signal lines GA1 to GA5, respectively.

Figure 8B:
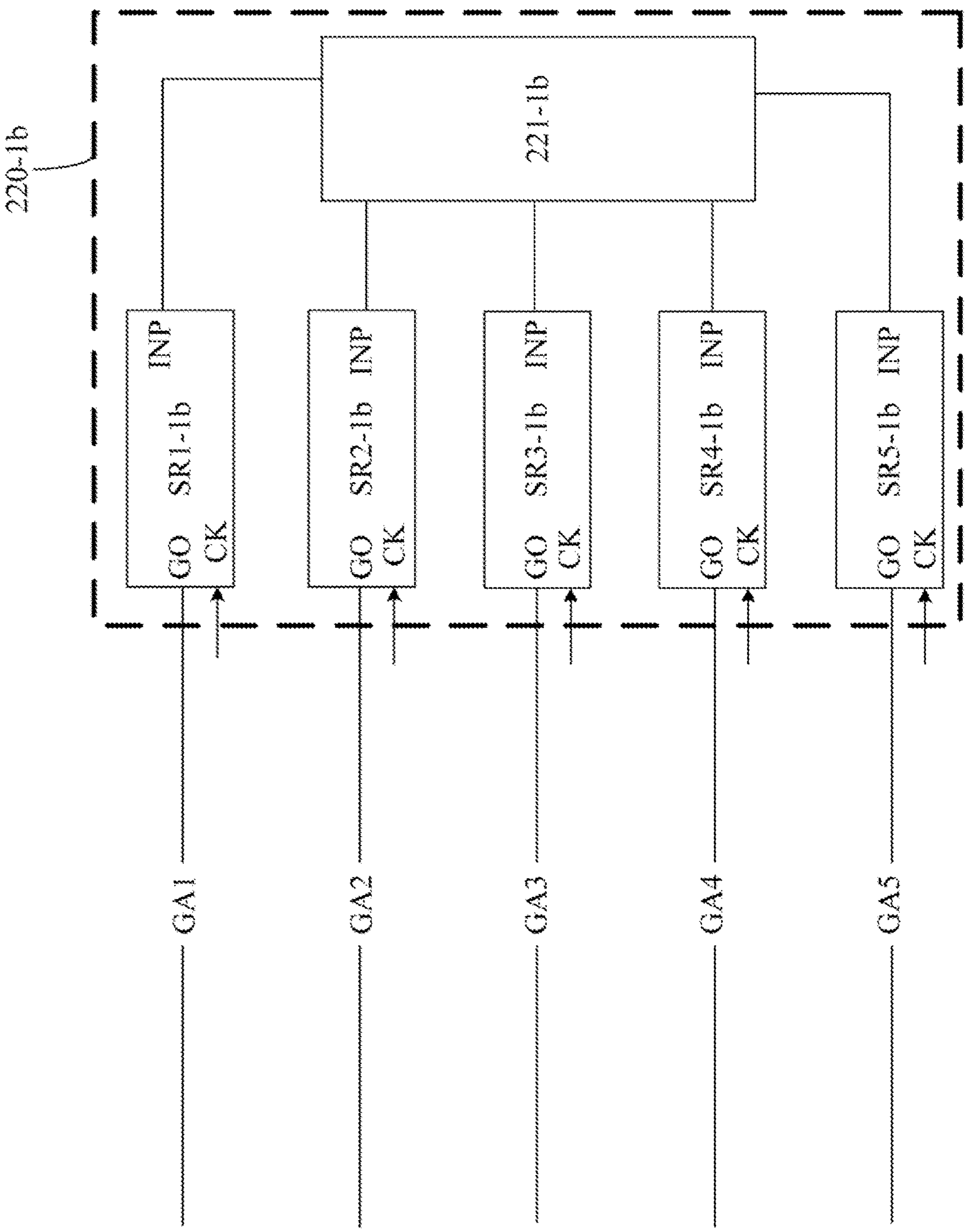
FIG. 8*b* is a schematic diagram illustrating other structures of a display apparatus provided by an embodiment of the present disclosure.

In some embodiments of the present disclosure, as shown in FIGS. 7 and 8*b*, the second second control circuit 220-1*b* may include a frame start signal control circuit 221-1*b* and first shift register units SR1-1*b* to SR5-1*b*. The frame start signal control circuit 221-1*b* is coupled to the input signal terminals INP of the first shift register units SR1-1*b* to SR5-1*b*, and the drive signal output terminals GO of the first shift register units SR1-1*b* to SR5-1*b* are coupled to the scan signal lines GA1 to GA5, respectively.

Figure 8C:
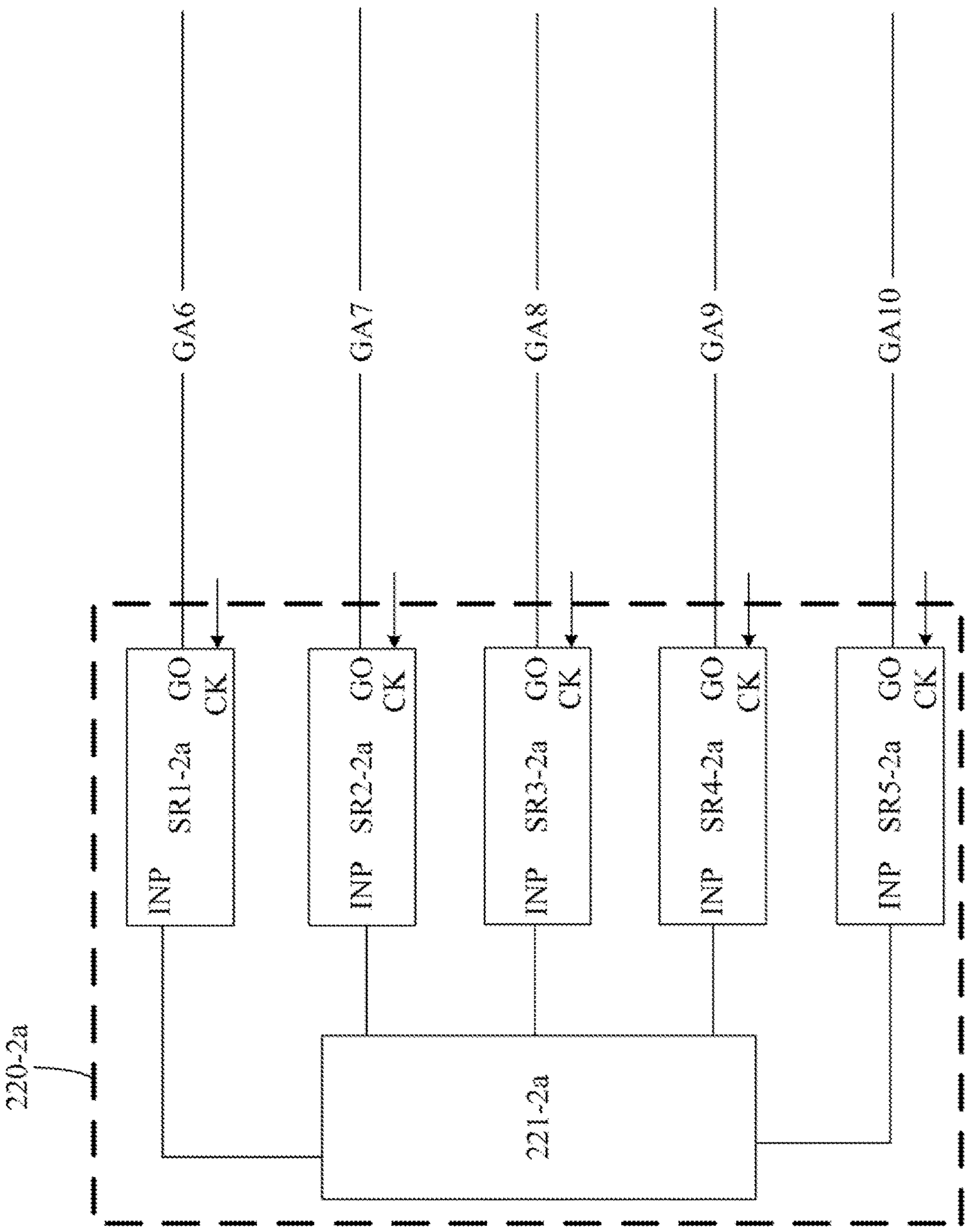
FIG. 8*c* is a schematic diagram illustrating other structures of a display apparatus provided by an embodiment of the present disclosure.

In some embodiments of the present disclosure, as shown in FIGS. 7 and 8*c*, the third second control circuit 220-2*a* may include a frame start signal control circuit 221-2*a* and first shift register units SR1-2*a* to SR5-2*a*. The frame start signal control circuit 221-2*a* is coupled to the input signal terminals INP of the first shift register units SR1-2*a* to SR5-2*a*, and the drive signal output terminals GO of the first shift register units SR1-2*a* to SR5-2*a* are coupled to the scan signal lines GA6 to GA10, respectively.

Figure 8D:
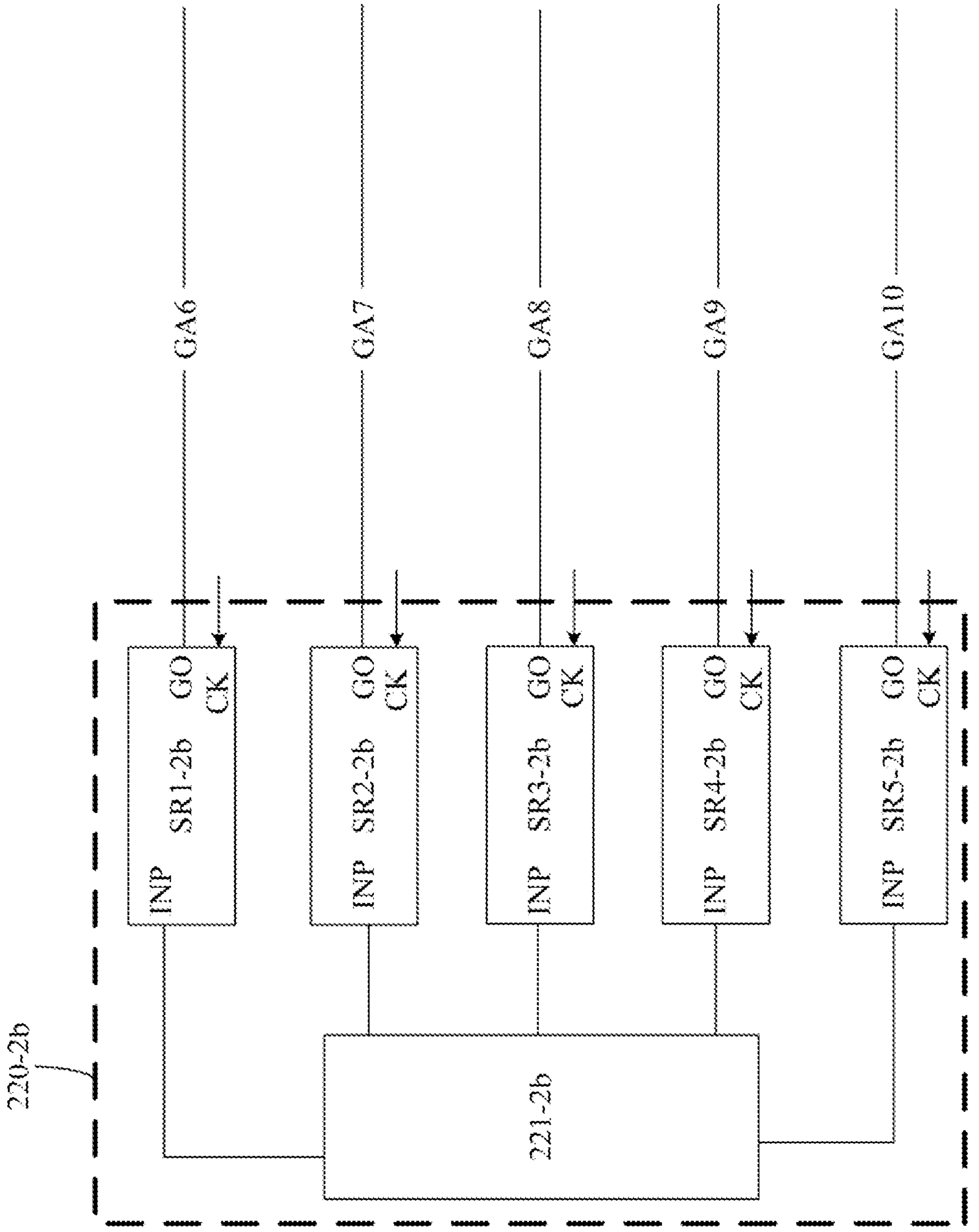
FIG. 8*d* is a schematic diagram illustrating other structures of a display apparatus provided by an embodiment of the present disclosure.

In some embodiments of the present disclosure, as shown in FIGS. 7 and 8*d*, the fourth second control circuit 220-2*b* may include a frame start signal control circuit 221-2*b* and first shift register units SR1-2*b* to SR5-2*b*. The frame start signal control circuit 221-2*b* is coupled to the input signal terminals INP of the first shift register units SR1-2*b* to SR5-2*b*, and the drive signal output terminals GO of the first shift register units SR1-2*b* to SR5-2*b* are coupled to the scan signal lines GA6 to GA10, respectively.

In some embodiments of the present disclosure, as shown in FIG. 7, the drive control circuit 200 may further include a level shift circuit 240. The first control circuit 210 may be further configured to generate reference clock control signals according to the acquired image data, and send the generated reference clock control signals to the level shift circuit 240. The level shift circuit 240 may be configured to receive a first reference voltage VREF1 and a second reference voltage VREF2 (VREF2<VREF1), generate clock signals according to the received reference clock control signals and the first and second reference voltages VREF1 and VREF2, and send the generated clock signals to the first shift register units. The first shift register unit outputs a scan drive signal according to the received clock signal and the first target frame start signal. The clock signals input to the first shift register units correspond to the reference clock control signals in one-to-one correspondence, so that each clock signal correspond to one reference clock control signal, and the timing of the clock signal input to the first shift register unit is the same as that of the corresponding reference clock control signal. The first reference voltage VREF1 serves to generate a high level voltage of the clock signal, that is, the high level voltage of the clock signal is the first reference voltage VREF1. The second reference voltage VREF2 serves to generate a low level voltage of the clock signal, that is, the low level voltage of the clock signal is the second reference voltage VREF2. This also allows the high level voltage of the scan drive signal to be the first reference voltage VREF1, and the low level voltage to be the second reference voltage VREF2.

Figure 9:
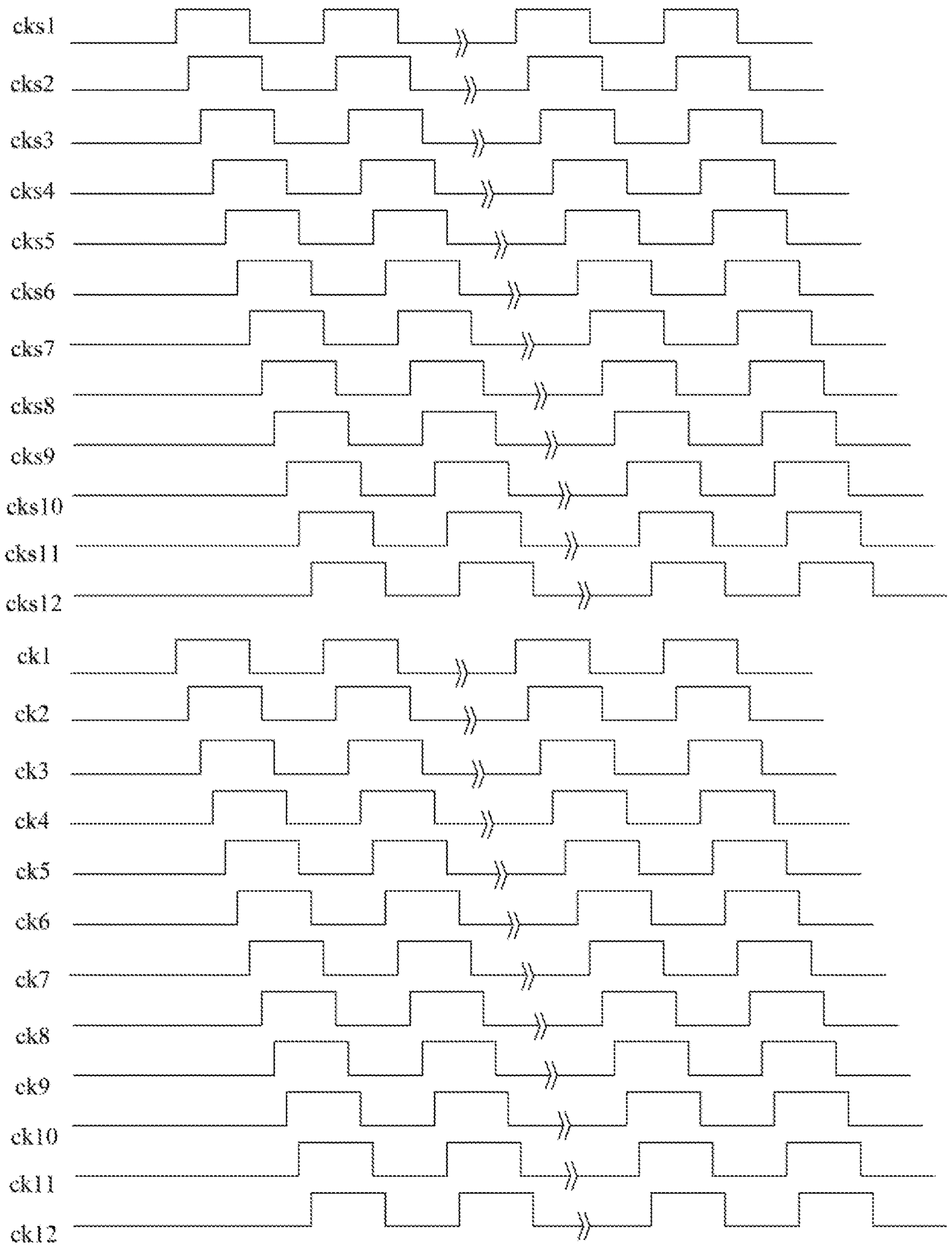
FIG. 9 is a timing diagram illustrating other signals provided by an embodiment of the present disclosure.
Figure 10A:
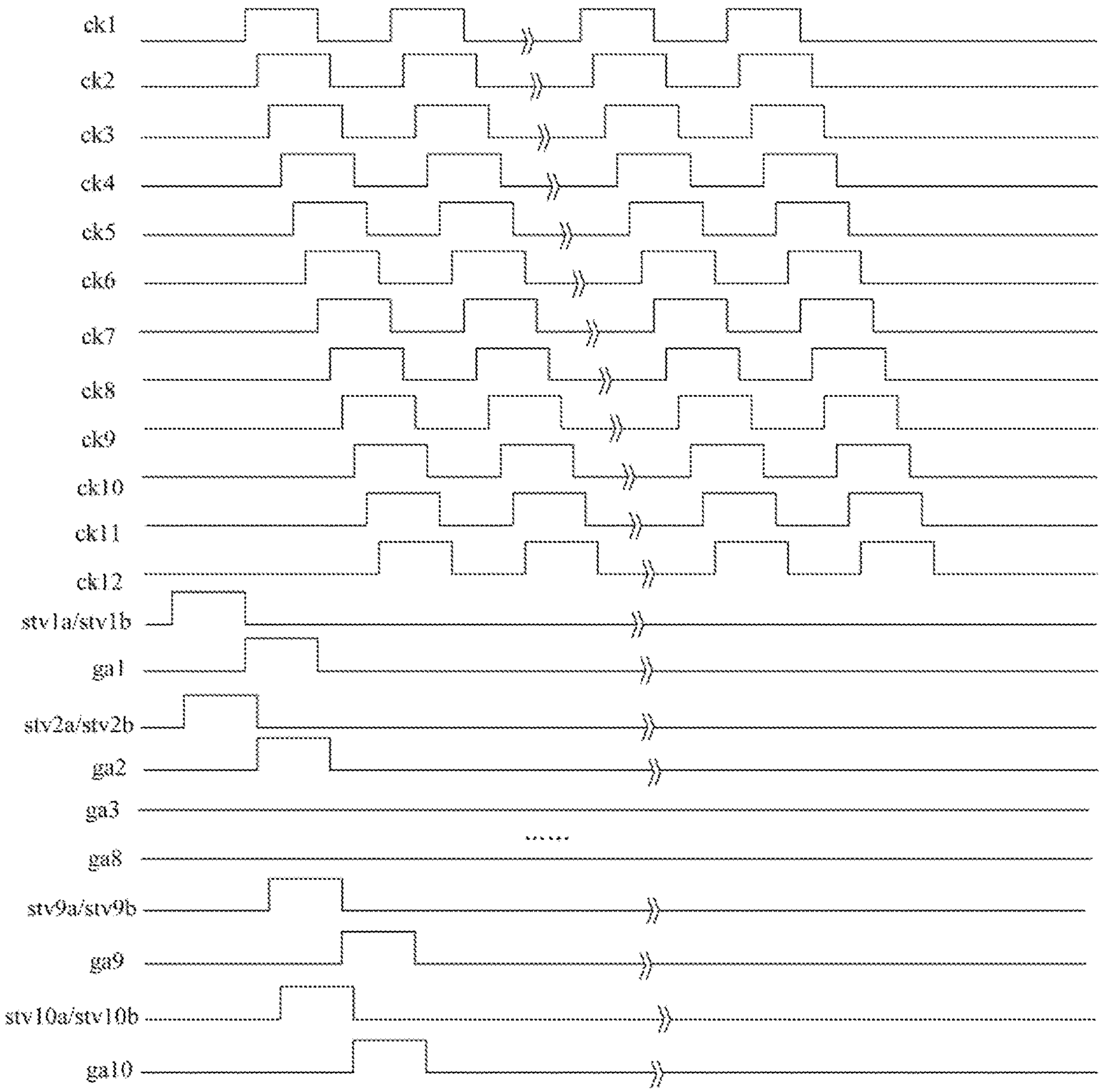
FIG. 10*a* is a timing diagram illustrating other signals provided by an embodiment of the present disclosure.
Figure 10B:
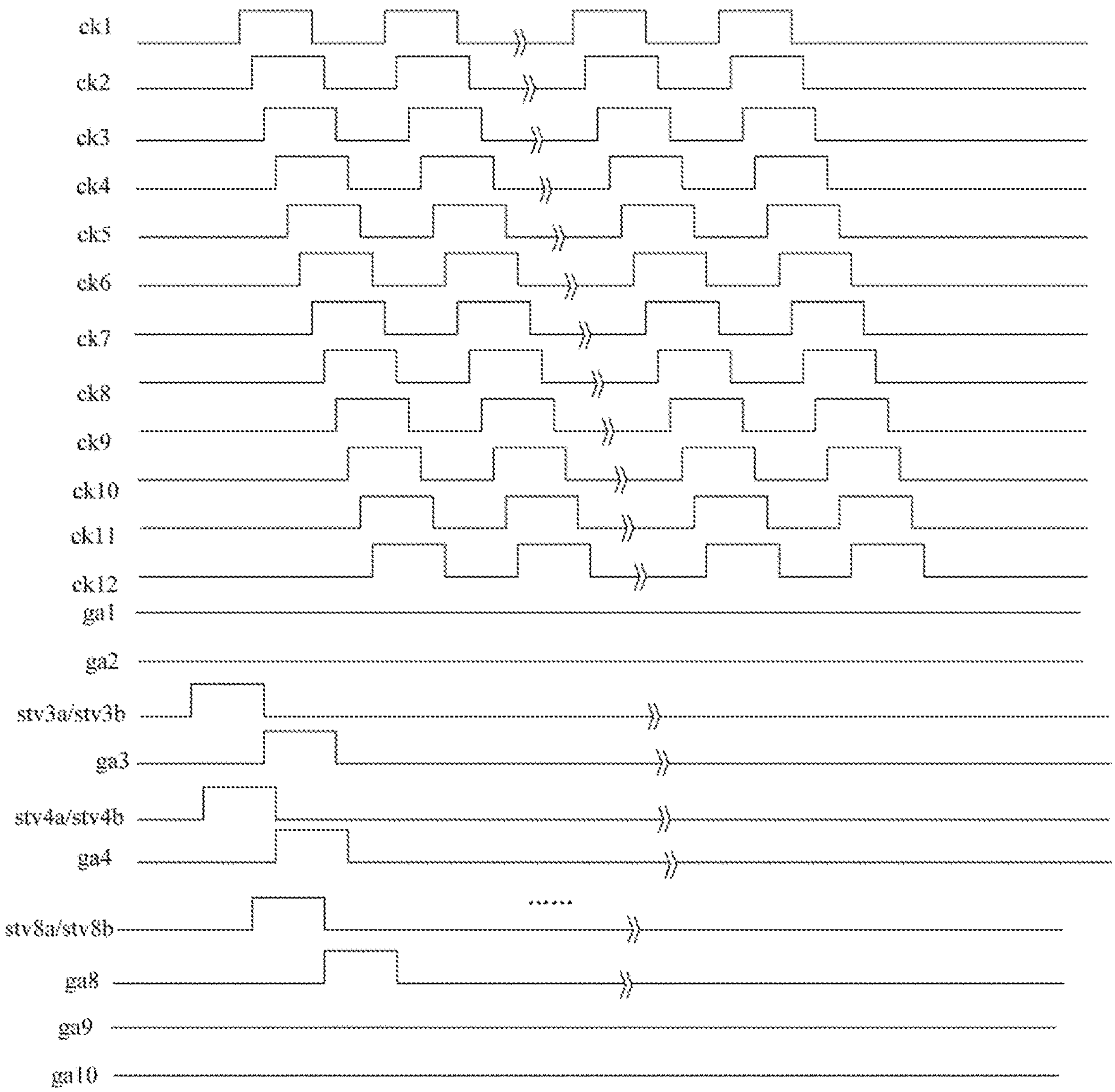
FIG. 10*b* is a timing diagram illustrating other signals provided by an embodiment of the present disclosure.

Illustratively, as shown in FIG. 9, the first control circuit 210 may generate reference clock control signals cks1 to cks2 according to the acquired image data, and send the generated reference clock control signals cks1 to cks2 to the level shift circuit 240. The level shift circuit 240 generates a clock signal ck1 according to the timing of the reference clock control signal cks1 and the first and second reference voltages VREF1 and VREF2. The level shift circuit 240 generates a clock signal ck2 according to the timing of the reference clock control signal cks2 and the first and second reference voltages VREF1 and VREF2. Other clock signals are similar and may be analogized, and are not described herein.

Illustratively, referring to FIGS. 7, 8*a* to 8*d*, 9 and 10*a*, taking the display panel provided with ten scan signal lines and correspondingly provided with first second control circuit 220-1*a* to fourth second control circuit 220-2*b* as an example, for example, the first first image area TX1-1 includes a first pixel unit row and a second pixel unit row, and the scan signal lines corresponding to the first first image area TX1-1 are the first scan signal line GA1 and the second scan signal line GA2; the second image area TX2 includes third to eighth pixel unit rows, and the scan signal lines corresponding to the second image area TX2 are the third to eighth scan signal lines GA3 to GA8; and the second first image area TX1-2 includes a ninth pixel unit row and a tenth pixel unit row, and the scan signal lines corresponding to the second first image area TX1-2 are the ninth scan signal line GA9 and the tenth scan signal line GA10. Then, during one display frame, the first control circuit 210 outputs a first selection command signal CX1, and the first selection command signal CX1 includes address information of 000, 001, 010, and 011, and may include data selected information of 0000 to 0001 and 1000 to 1001. The frame start signal control circuit 221-1*a* in the first second control circuit 220-1*a* may determine, according to the address information: 000 and the data selected information: 0000 to 0001 in the first selection command signal CX1, the first scan signal line GA1 and the second scan signal line GA2 from among the correspondingly coupled scan signal lines, as target scan signal lines, generate a first target frame start signal stv1*a* corresponding to the first scan signal line GA and a first target frame start signal stv2*a* corresponding to the second scan signal line GA2, and input the generated first target frame start signal stv1*a* to the input signal terminal INP of the first shift register unit SR1-1*a*, and input the generated first target frame start signal stv2*a* to the input signal terminal INP of the first shift register unit SR2-1*a*. Moreover, the first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck1 is input to the clock control signal terminal CK of the first shift register unit SR1-1*a*, so that the first shift register unit SR1-1*a* may output a scan drive signal ga1 from the drive signal output terminal GO thereof, based on the first target frame start signal stv1*a* input to the input signal terminal INP thereof and the clock signal ck1 input to the clock control signal terminal CK thereof. In addition, the clock signal ck2 is input to the clock control signal terminal CK of the first shift register unit SR2-1*a*, so that the first shift register unit SR2-1a may output a scan drive signal ga2 from the drive signal output terminal GO thereof, based on the first target frame start signal stv2*a* input to the input signal terminal INP thereof and the clock signal ck2 input to the clock control signal terminal CK thereof. In addition, the first target frame start signals are not input to the first shift register units SR3-1*a* to SR5-1*a*, so that the first shift register units SR3-1*a* to SR5-1*a* do not output the scan drive signals, but each keep outputting the scan-off signal.

In addition, the frame start signal control circuit 221-1*b* in the second second control circuit 220-1*b* may determine, according to the address information: 001 and the data selected information: 0000 to 0001 in the first selection command signal CX1, the first scan signal line GA1 and the second scan signal line GA2 from among the correspondingly coupled scan signal lines, as target scan signal lines, generate a first target frame start signal stv1b corresponding to the first scan signal line GA1 and a first target frame start signal stv2b corresponding to the second scan signal line GA2, and input the generated first target frame start signal stv1b to the input signal terminal INP of the first shift register unit SR1-1b, and input the generated first target frame start signal stv2b to the input signal terminal INP of the first shift register unit SR2-1b. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck1 is input to the clock control signal terminal CK of the first shift register unit SR1-1b, so that the first shift register unit SR1-1b may output a scan drive signal gb1 from the drive signal output terminal GO thereof, based on the first target frame start signal stv1b input to the input signal terminal INP thereof and the clock signal ck1 input to the clock control signal terminal CK thereof. In addition, the clock signal ck2 is input to the clock control signal terminal CK of the first shift register unit SR2-1b, so that the first shift register unit SR2-1b may output a scan drive signal gb2 from the drive signal output terminal GO thereof, based on the first target frame start signal stv2b input to the input signal terminal INP thereof and the clock signal ck2 input to the clock control signal terminal CK thereof. In addition, the first target frame start signals are not input to the first shift register units SR3-1b to SR5-1b, so that the first shift register units SR3-1b to SR5-1b do not output the scan drive signals, but each keep outputting the scan-off signal. This allows for independently driving the first first image area TX1-1.

In addition, the frame start signal control circuit 221-2a in the third second control circuit 220-2a may determine, according to the address information: 010 and the data selected information: 1000 to 1001 in the first selection command signal CX1, the ninth scan signal line GA9 and the tenth scan signal line GA10 from among the correspondingly coupled scan signal lines, as target scan signal lines, generate a first target frame start signal stv9a corresponding to the ninth scan signal line GA9 and a first target frame start signal stv10a corresponding to the tenth scan signal line GA10, and input the generated first target frame start signal stv9a to the input signal terminal INP of the first shift register unit SR4-2a, and input the generated first target frame start signal stv10a to the input signal terminal INP of the first shift register unit SR5-2a. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck9 is input to the clock control signal terminal CK of the first shift register unit SR4-2a, so that the first shift register unit SR4-2a may output a scan drive signal ga9 from the drive signal output terminal GO thereof, based on the first target frame start signal stv9a input to the input signal terminal INP thereof and the clock signal ck9 input to the clock control signal terminal CK thereof. In addition, the clock signal ck10 is input to the clock control signal terminal CK of the first shift register unit SR5-2a, so that the first shift register unit SR5-2a may output a scan drive signal ga10 from the drive signal output terminal GO thereof, based on the first target frame start signal stv10a input to the input signal terminal INP thereof and the clock signal ck10 input to the clock control signal terminal CK thereof. In addition, the first target frame start signals are not input to the first shift register units SR1-2a to SR3-2a, so that the first shift register units SR1-2a to SR3-2a do not output the scan drive signals, but each keep outputting the scan-off signal.

In addition, the frame start signal control circuit 221-2b in the fourth second control circuit 220-2b may determine, according to the address information: 011 and the data selected information: 1000 to 1001 in the first selection command signal CX1, the ninth scan signal line GA9 and the tenth scan signal line GA10 from among the correspondingly coupled scan signal lines, as target scan signal lines, generate a first target frame start signal stv9b corresponding to the ninth scan signal line GA9 and a first target frame start signal stv10b corresponding to the tenth scan signal line GA10, and input the generated first target frame start signal stv9b to the input signal terminal INP of the first shift register unit SR4-2b, and input the generated first target frame start signal stv10b to the input signal terminal INP of the first shift register unit SR5-2b. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck9 is input to the clock control signal terminal CK of the first shift register unit SR4-2b, so that the first shift register unit SR4-2b may output a scan drive signal gb9 from the drive signal output terminal GO thereof, based on the first target frame start signal stv9b input to the input signal terminal INP thereof and the clock signal ck9 input to the clock control signal terminal CK thereof. In addition, the clock signal ck10 is input to the clock control signal terminal CK of the first shift register unit SR5-2b, so that the first shift register unit SR5-2b may output a scan drive signal gb10 from the drive signal output terminal GO thereof, based on the first target frame start signal stv10b input to the input signal terminal INP thereof and the clock signal ck10 input to the clock control signal terminal CK thereof. In addition, the first target frame start signals are not input to the first shift register units SR1-2b to SR3-2b, so that the first shift register units SR1-2b to SR3-2b do not output the scan drive signals, but each keep outputting the scan-off signal. This allows for independently driving the second first image area TX1-2.

Illustratively, referring to FIGS. 7, 8a to 8d, 9 and 10b, taking the display panel provided with ten scan signal lines and correspondingly provided with the first second control circuit 220-1a to the fourth second control circuit 220-2b as an example, for example, the first first image area TX1-1 includes a first pixel unit row and a second pixel unit row, and the scan signal lines corresponding to the first first image area TX1-1 are the first scan signal line GA1 and the second scan signal line GA2; the second image area TX2 includes third to eighth pixel unit rows, and the scan signal lines corresponding to the second image area TX2 are the third to eighth scan signal lines GA3 to GA8; and the second first image area TX1-2 includes a ninth pixel unit row and a tenth pixel unit row, and the scan signal lines corresponding to the second first image area TX1-2 are the ninth scan signal line GA9 and the tenth scan signal line GA10. Then, during one display frame, the first control circuit 210 outputs a first selection command signal CX2, and the first selection command signal CX2 includes address information of 000, 001, 010, and 011, and may include data selected information of 0010 to 0111. The frame start signal control circuit 221-1*a* in the first second control circuit 220-1*a* may determine, according to the address information: 000 and the data selected information: 0010 to 0111 in the first selection command signal CX2, the third to fifth scan signal lines GA3 to GA5 from among the correspondingly coupled scan signal lines, as target scan signal lines, generate a first target frame start signal stv3*a* corresponding to the third scan signal line GA3, a first target frame start signal stv4*a* corresponding to the fourth scan signal line GA4, and a first target frame start signal stv5*a* corresponding to the fifth scan signal line GA5, and input the generated first target frame start signal stv3*a* to the input signal terminal INP of the first shift register unit SR3-1*a*, input the generated first target frame start signal stv4*a* to the input signal terminal INP of the first shift register unit SR4-1*a*, and input the generated first target frame start signal stv5*a* to the input signal terminal INP of the first shift register unit SR5-1*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck3 is input to the clock control signal terminal CK of the first shift register unit SR3-1*a*, so that the first shift register unit SR3-1*a* may output a scan drive signal ga3 from the drive signal output terminal GO thereof, based on the first target frame start signal stv3*a* input to the input signal terminal INP thereof and the clock signal ck3 input to the clock control signal terminal CK thereof. In addition, the clock signal ck4 is input to the clock control signal terminal CK of the first shift register unit SR4-1*a*, so that the first shift register unit SR4-1*a* may output a scan drive signal ga4 from the drive signal output terminal GO thereof, based on the first target frame start signal stv4*a* input to the input signal terminal INP thereof and the clock signal ck4 input to the clock control signal terminal CK thereof. In addition, the clock signal ck5 is input to the clock control signal terminal CK of the first shift register unit SR5-1*a*, so that the first shift register unit SR5-1*a* may output a scan drive signal ga5 from the drive signal output terminal GO thereof, based on the first target frame start signal stv5*a* input to the input signal terminal INP thereof and the clock signal ck5 input to the clock control signal terminal CK thereof. In addition, the first target frame start signals are not input to the first shift register units SR1-1*a* to SR2-1*a*, so that the first shift register units SR1-1*a* to SR2-1*a* do not output the scan drive signals, but each keep outputting the scan-off signal.

Similarly, the frame start signal control circuit 221-1*b* in the second second control circuit 220-1*b* may determine, according to the address information: 010 and the data selected information: 0010 to 0111 in the first selection command signal CX2, the third to fifth scan signal lines GA3 to GA5 from among the correspondingly coupled scan signal lines, as target scan signal lines, generate first target frame start signals stv3*b* to stv5*b* corresponding to the third to fifth scan signal lines GA3 to GA5, and input the generated first target frame start signals stv3*b* to stv5*b* to the input signal terminals INP of the first shift register units SR3-1*b* to SR5-1*b*, respectively. The first control circuit 210 further inputs the corresponding reference clock control signals cks1 to cks12 to the level shift circuit 240, and the level shift circuit 240 inputs the generated clock signals ck1 to ck12 to the corresponding first shift register units. The clock signal ck3 is input to the clock control signal terminal CK of the first shift register unit SR3-1*b*, so that the first shift register unit SR3-1*b* may output a scan drive signal gb3 from the drive signal output terminal GO thereof, based on the first target frame start signal stv3*b* input to the input signal terminal INP thereof and the clock signal ck3 input to the clock control signal terminal CK thereof. Similarly, the drive signal output terminals GO of the first shift register units SR4-1*b* and SR5-1*b* output scan drive signals gb4 and gb5, respectively. In addition, the first target frame start signals are not input to the first shift register units SR1-1*b* to SR2-1*b*, so that the first shift register units SR1-1*b* to SR2-1*b* do not output the scan drive signals, but each keep outputting the scan-off signal.

Similarly, the frame start signal control circuit 221-2*a* in the third second control circuit 220-2*a* may determine, according to the address information: 001 and the data selected information: 0010 to 0111 in the first selection command signal CX2, the sixth to eighth scan signal lines GA6 to GA8 from among the correspondingly coupled scan signal lines, as target scan signal lines, generate first target frame start signals stv6*a* to stv8*a* corresponding to the sixth to eighth scan signal lines GA6 to GA8, and input the generated first target frame start signals stv6*a* to stv8*a* to the input signal terminals INP of the first shift register units SR1-2*a* to SR3-2*a*, respectively. The first control circuit 210 further inputs the corresponding reference clock control signals cks1 to cks12 to the level shift circuit 240, and the level shift circuit 240 inputs the generated clock signals ck1 to ck12 to the corresponding first shift register units. The clock signal ck6 is input to the clock control signal terminal CK of the first shift register unit SR1-2*a*, so that the first shift register unit SR1-2*a* may output a scan drive signal ga6 from the drive signal output terminal GO thereof, based on the first target frame start signal stv6*a* input to the input signal terminal INP thereof and the clock signal ck6 input to the clock control signal terminal CK thereof. Similarly, the drive signal output terminals GO of the first shift register units SR2-2*a* to SR3-2*a* output scan drive signals ga7 to ga8, respectively. In addition, the first target frame start signals are not input to the first shift register units SR4-2*a* to SR5-2*a*, so that the first shift register units SR4-2*a* to SR5-2*a* do not output the scan drive signals, but each keep outputting the scan-off signal.

In addition, the frame start signal control circuit 221-2*b* in the fourth second control circuit 220-2*b* may determine, according to the address information: 001 and the data selected information: 0010 to 0111 in the first selection command signal CX2, the sixth to eighth scan signal lines GA6 to GA8 from among the correspondingly coupled scan signal lines, as target scan signal lines, generate first target frame start signals stv6*b* to stv8*b* corresponding to the sixth to eighth scan signal lines GA6 to GA8, and input the generated first target frame start signals stv6*b* to stv8*b* to the input signal terminals INP of the first shift register units SR1-2*b* to SR3-2*b*, respectively. The first control circuit 210 further inputs the corresponding reference clock control signals cks1 to cks12 to the level shift circuit 240, and the level shift circuit 240 inputs the generated clock signals ck1 to ck12 to the corresponding first shift register units. The clock signal ck6 is input to the clock control signal terminal CK of the first shift register unit SR1-2*b*, so that the first shift register unit SR1-2*b* may output a scan drive signal gb6 from the drive signal output terminal GO thereof, based on the first target frame start signal stv6*b* input to the input signal terminal INP thereof and the clock signal ck6 input to the clock control signal terminal CK thereof. Similarly, the drive signal output terminals GO of the first shift register units SR2-2*b* to SR3-2*b* output scan drive signals gb7 to gb8, respectively. In addition, the first target frame start signals are not input to the first shift register units SR4-2*b* to SR5-2*b*, so that the first shift register units SR4-2*b* to SR5-2*b* do not output the scan drive signals, but each keep outputting the scan-off signal. This allows for independently driving the second image area TX2.

It should be noted that the first shift register unit SR1-1*a* and the first shift register unit SR1-1*b* may output the first high level of the clock signal ck1 to the gate line GA1, to generate the high level of the scan drive signal ga1. The first shift register unit SR2-1*a* and the first shift register unit SR2-1*b* may output the first high level of the clock signal ck2 to the gate line GA2, to generate the high level of the scan drive signal ga2. Other signals are similar and may be analogized, and are not described herein. That is, the high level of the clock signal may be an active level thereof, and the low level of the clock signal may be an inactive level thereof. Alternatively, when the first shift register unit outputs a low level of the clock signal, to generate a low level signal, among the signals, that controls the switch transistors in the sub-pixels to be turned on, the low level of the clock signal may serve as an active level thereof, and the high level of the clock signal may serve as an inactive level thereof.

In other embodiments of the present disclosure, in the same second control circuit, all the first shift register units are arranged at a same end of the scan signal lines. Illustratively, as shown in FIGS. 7 to 8*d*, the first shift register units SR1-1*a* to SR5-1*a* of the first second control circuit 220-1*a* are coupled to first ends of the scan signal lines, and the first shift register units SR1-1*b* to SR5-1*b* of the second second control circuit 220-1*b* are coupled to second ends of the scan signal lines. The first shift register units SR1-2*a* to SR5-2*a* of the third second control circuit 220-2*a* are coupled to first ends of the scan signal lines, and the first shift register units SR1-2*b* to SR5-2*b* of the fourth second control circuit 220-2*b* are coupled to second ends of the scan signal lines.

In some embodiments of the present disclosure, as shown in FIGS. 7 to 8*d*, the scan signal line has opposite first and second ends. The first end and the second end of the scan signal line are each coupled to a first shift register unit. Illustratively, the first shift register units SR1-1*a* to SR5-1*a* of the first second control circuit 220-1*a* are coupled to the first ends of the scan signal lines, and the first shift register units SR1-1*b* to SR5-1*b* of the second second control circuit 220-1*b* are coupled to the second ends of the scan signal lines. The first shift register units SR1-2*a* to SR5-2*a* of the third second control circuit 220-2*a* are coupled to the first ends of the scan signal lines, and the first shift register units SR1-2*b* to SR5-2*b* of the fourth second control circuit 220-2*b* are coupled to the second ends of the scan signal lines. This enables a bilateral drive.

In other embodiments of the present disclosure, a unilateral drive may alternatively be adopted, so that all the first shift register units in the second control circuit are arranged at one of the first end and the second end. Illustratively, only the first second control circuit 220-1*a* and the third second control circuit 220-2*a* are provided, where the first shift register units SR1-1*a* to SR5-1*a* in the first control circuit and the first shift register units SR1-2*a* to SR5-2*a* in the third second control circuit 220-2*a* are coupled to the first ends of the scan signal lines. Alternatively, for example, only the second second control circuit 220-1*b* and the fourth second control circuit 220-2*b* are provided, where the first shift register units SR1-1*b* to SR5-1*b* in the second control circuit and the first shift register units SR1-2*b* to SR5-2*b* in the fourth second control circuit 220-2*b* are coupled to the second ends of the scan signal lines.

In other embodiments of the present disclosure, in a same second control circuit, the frame start signal control circuit and the first shift register units are arranged at a same end of the scan signal lines. Illustratively, as shown in FIGS. 7 to 8*d*, the frame start signal control circuit 221-1*a* and the first shift register units SR1-1*a* to SR5-1*a* in the first control circuit are arranged at the first ends of the scan signal lines. Moreover, the frame start signal control circuit 221-1*b* and the first shift register units SR1-1*b* to SR5-1*b* in the second second control circuit 220-1*b* are arranged at the second ends of the scan signal lines. Moreover, the frame start signal control circuit 221-2*a* and the first shift register units SR1-2*a* to SR5-2*a* in the third second control circuit 220-2*a* are arranged at the first ends of the scan signal lines. Moreover, the frame start signal control circuit 221-2*b* and first shift register units SR1-2*b* to SR5-2*b* in the fourth control circuit 220-2*b* are arranged at the second ends of the scan signal lines.

In some embodiments of the present disclosure, the frame start signal control circuit may include a first decoder, a first frame start signal generator and a first level shifter. The first decoder is configured to receive a first selection command signal, determine, according to corresponding address information and data selected information in the first selection command signal, target scan signal lines from a corresponding scan signal line group, and generate frame start generating signals corresponding to the target scan signal lines, according to the determined target scan signal lines. Moreover, the first frame start signal generator is configured to receive first frame start generating signals corresponding to the target scan signal lines, and generate first initial frame start signals corresponding to the target scan signal lines according to the received first frame start generating signals. Moreover, the first level shifter is configured to receive the first initial frame start signals corresponding to the target scan signal lines, perform voltage shift processing on the received first initial frame start signals, generate first target frame start signals corresponding to the target scan signal lines, and input the generated first target frame start signals corresponding to the target scan signal lines to the input signal terminals INP of the first shift register units coupled to the target scan signal lines.

Figure 11:
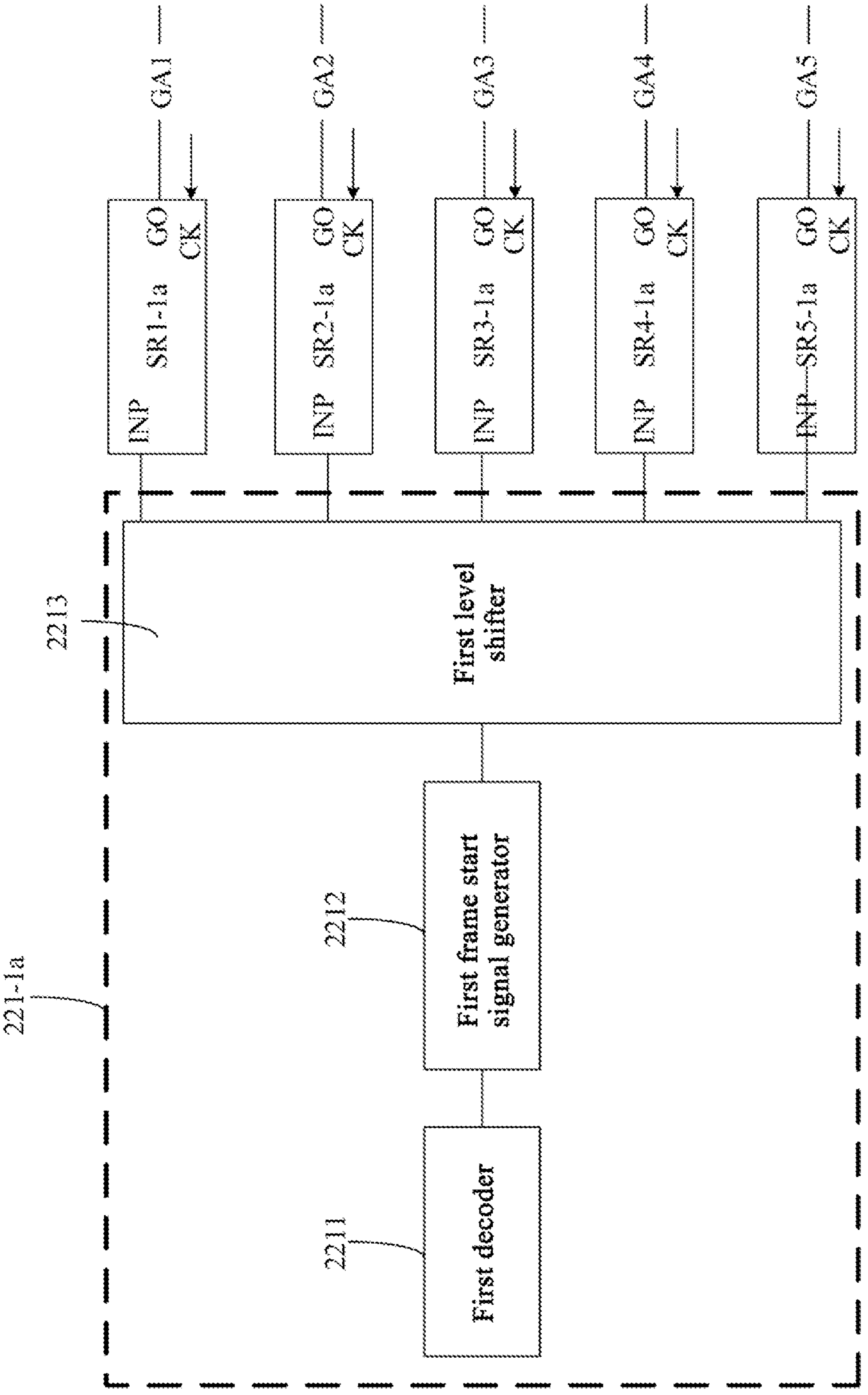
FIG. 11 is a schematic diagram illustrating other structures of a display apparatus provided by an embodiment of the present disclosure.

Illustratively, taking the frame start signal control circuit 221-1*a* in the first second control circuit 220-1*a* as an example, as shown in FIG. 11, the frame start signal control circuit 221-1*a* may include a first decoder 2211, a first frame start signal generator 2212, and a first level shifter 2213. The first decoder 2211 is configured to receive the first selection command signal, determine, according to corresponding address information and data selected information in the first selection command signal, target scan signal lines from among the corresponding scan signal line group, and generate frame start generating signals corresponding to the target scan signal lines according to the determined target scan signal lines. In addition, the first frame start signal generator 2212 is configured to receive the first frame start generating signals corresponding to the target scan signal lines, and generate first initial frame start signals corresponding to the target scan signal lines according to the received first frame start generating signals. In addition, the first level shifter 2213 is configured to receive the first initial frame start signals corresponding to target scan signal lines, perform voltage shift processing on the received first initial frame start signals, generate first target frame start signals corresponding to the target scan signal lines, and input the generated first target frame start signals corresponding to the target scan signal lines to the input signal terminals INP of the first shift register units coupled to the target scan signal lines.

Illustratively, taking a case where, during one display frame, the first control circuit 210 outputs a first selection command signal CX1 including address information of 000, 001, 010, and 011, and data selected information of 0000 to 0001 and 1000 to 1001, and taking the first second control circuit 220-1*a*, as an example, the first decoder 2211 receives the first selection command signal CX1, and may determine, according to the address information: 000 and the data selected information: 0000 to 0001 in the first selection command signal CX1, the first scan signal line GA1 and the second scan signal line GA2 from among the correspondingly coupled scan signal lines, as target scan signal lines, and generate a frame start generating signal corresponding to the first scan signal line GA1 and a frame start generating signal corresponding to the second scan signal line GA2. The first frame start signal generator 2212 receives the frame start generating signal corresponding to the first scan line GA1 and the frame start generating signal corresponding to the second scan line GA2, generates a first initial frame start signal according to the received frame start generating signal corresponding to the first scan line GA1, and generates a first initial frame start signal corresponding to the second scan line GA2 according to the received frame start generating signal corresponding to the second scan line GA2. Moreover, the first frame start signal generator 2212 sends the generated first initial frame start signals to the first level shifter, and the first level shifter 2213 performs voltage shift processing on the received first initial frame start signal corresponding to the first scan signal line GA1, to generate a first target frame start signal stv1*a*, and performs voltage shift processing on the received first initial frame start signal corresponding to the second scan signal line GA2, to generate a first target frame start signal stv2*a*. Moreover, the first level shifter inputs the generated first target frame start signal stv1*a* to the input signal terminal INP of the first shift register unit SR1-1*a*, and inputs the generated first target frame start signal stv2*a* to the input signal terminal INP of the first shift register unit SR2-1*a*. It should be noted that, an operation process of the first control circuit 210 when outputting the first selection command signal CX2 may be analogized, and the details thereof are not described herein.

In some embodiments of the present disclosure, as shown in FIGS. 1 and 7, the drive control circuit 200 may further include at least one source driver circuit 230. The source driver circuit 230 is coupled to data signal lines in the display panel 100. Illustratively, a plurality of source driver circuits 230 may be set, and different source driver circuits are coupled to different data signal lines. For example, as shown in FIG. 1, the number of the source driver circuits 230 may be set to 2, where one source driver circuit 230 is coupled to half of the data signal lines, and the other source driver circuit 230 is coupled to the other half of the data signal lines. Alternatively, three, four, or more source driver circuits may be set, and may be designed and determined according to the requirement of the practical application, which is not limited herein.

In some embodiments of the present disclosure, the first control circuit 210 may be further configured to send the acquired image data to the source driver circuit. Moreover, the source driver circuit may be configured to receive the image data, and apply corresponding data voltages to the coupled data signal lines according to the image data.

Illustratively, the first control circuit 210 may be further configured to send the acquired image data to the source driver circuit, and input, when the scan signal lines coupled to pixel units in the first image area are determined as the target scan signal lines, a first image enable signal to the source driver circuit coupled to the pixel units in the first image area. Moreover, the source driver circuit may be further configured to receive the first image enable signal, and apply, according to the first image enable signal and the image data, corresponding data voltages to the data signal lines coupled to the pixel units in the second image area.

Illustratively, the first control circuit 210 may be further configured to send the acquired image data to the source driver circuit 230, and input, when the scan signal lines coupled to pixel units in the second image area are determined as the target scan signal lines, a first image disable signal to the source driver circuit coupled to the pixel units in the second image area. Moreover, the source driver circuit is further configured to receive the first image disable signal, and apply, according to the first image disable signal and the image data, corresponding data voltages to the data signal lines coupled to the pixel units in the second image area.

Figure 12:
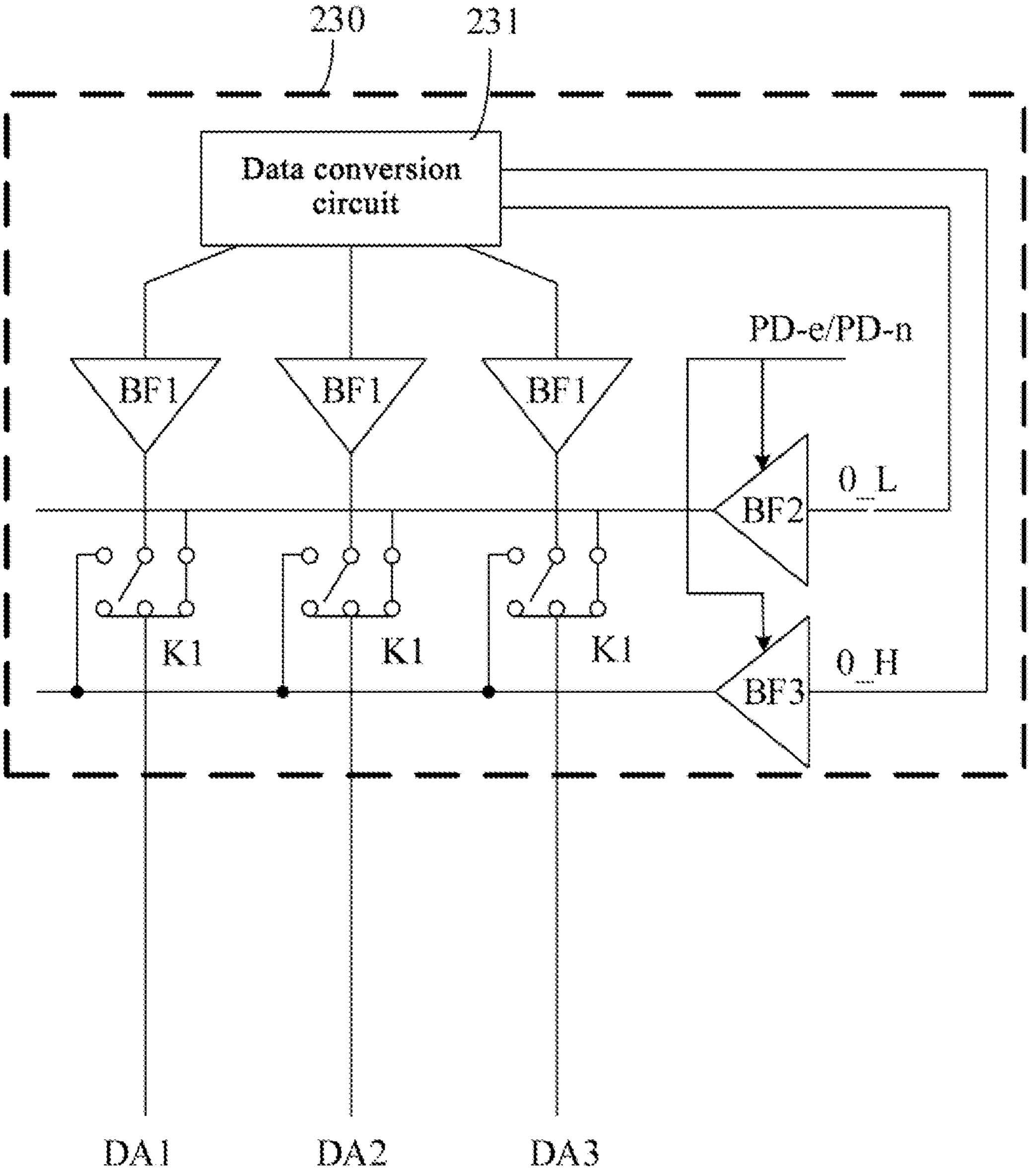
FIG. 12 is a schematic diagram illustrating other structures of a source driver circuit provided by an embodiment of the present disclosure.

In some embodiments of the present disclosure, as shown in FIG. 12, the source driver circuit 230 may include a data conversion circuit 231, a plurality of non-zero gray scale output buffers BF1, a first zero gray scale output buffer BF2, a second zero gray scale output buffer BF3, and a plurality of control switches K1. Each data signal line corresponds to one non-zero gray scale output buffer and one control switch. Illustratively, an input terminal of the data conversion circuit 231 is coupled to the first control circuit 210, and output terminals of the data conversion circuit 231 are coupled to the input terminals of respective non-zero gray scale output buffers BF1, respectively; an output terminal of each control switch K1 is coupled to a corresponding data signal line, a first input terminal of each control switch K1 is coupled to an output terminal of the corresponding non-zero gray scale output buffer BF1, a second input terminal of each control switch K1 is coupled to an output terminal of the first zero gray scale output buffer BF2, and a third input terminal of each control switch K1 is coupled to an output terminal of the second zero gray scale output buffer BF3; and an input terminal of the first zero gray scale output buffer BF2 and an input terminal of the second zero gray scale output buffer BF3 are each coupled to the data conversion circuit 231.

Illustratively, the data conversion circuit 231 may include a data receiver, a digital-to-analog converter and an output multiplexer. The data receiver receives serial signals output by the first control circuit, and converts the received data into parallel signals. The digital-to-analog converter converts the converted parallel signals into analog signals. Then the converted analog signals are input into the plurality of non-zero gray scale output buffers, the first zero gray scale output buffer and the second zero gray scale output buffer. The output multiplexer receives the first image enable signal and the first image disable signal output by the first control circuit, then controls each control switch according to the first image enable signal and the first image disable signal, and selects to output normal data or 0 gray scale.

Illustratively, when the source driver circuit receives the first image enable signal, the source driver circuit controls the first zero gray scale output buffer and the second zero gray scale output buffer not to operate, controls the non-zero gray scale output buffers to operate, and controls each control switch to turn it conductive between the first input terminal and the output terminal thereof. The data conversion circuit may perform a series of processing on the image data in the second image area according to the received image data in the second image area, and then input the processed image data into the coupled non-zero gray scale output buffers, to apply corresponding data voltages to the data signal lines in the second image area through the non-zero gray scale output buffers.

Illustratively, when the source driver circuit receives the first image disable signal, the source driver circuit controls the first zero gray scale output buffer and the second zero gray scale output buffer to operate, and controls the non-zero gray scale output buffer not to operate. The data conversion circuit may perform a series of processing on the image data in the first image area according to the received image data in the first image area, and then input the image data into the first zero gray scale output buffer and the second zero gray scale output buffer coupled thereto. Each control switch is controlled to turn it conductive between the second input terminal and the output terminal thereof, so that the data voltages corresponding to the negative polarity are applied to the data signal lines in the first image area through the first zero gray scale output buffer. Moreover, each control switch is controlled to turn it conductive between the third input terminal and the output terminal thereof, so that data voltages corresponding to the positive polarity are applied to the data signal lines in the first image area through the second zero gray scale output buffer.

Figure 13:
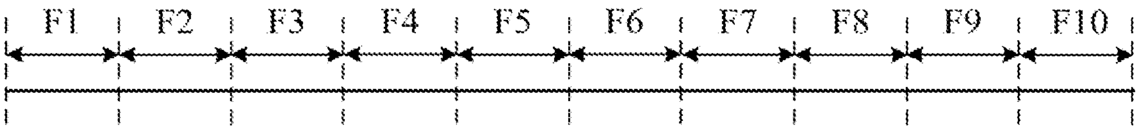
FIG. 13 is a timing diagram illustrating other signals provided by an embodiment of the present disclosure.

The following describes, with reference to FIGS. 7 to 14*a*, an operation process of the above drive control circuit provided by the embodiment of the present disclosure, taking the consecutive first to tenth display frames as an example. In FIG. 13, F1 represents the first display frame, F2 represents the second display frame, . . . , and F10 represents the tenth display frame. In the present disclosure, it is described taking only ten display frames as an example. In practical applications, the number of display frames may be determined according to requirements of practical applications, and is not limited herein.

The first control circuit 210 may acquire the image data of the first to tenth display frames, and compare the image data of the first to tenth display frames to determine whether black picture data in a same first image area exists in the first to tenth display frames. When it is determined that the black picture data in the first first image area TX1-1 and the second first image area TX1-2 exists in the first to tenth display frames, during each of the first to tenth display frames, the scan signal lines coupled to the pixel units in the second image area TX2 are determined as target scan signal lines. Moreover, a first selection command signal CX2 is output in the first to tenth display frames.

Figure 14A:
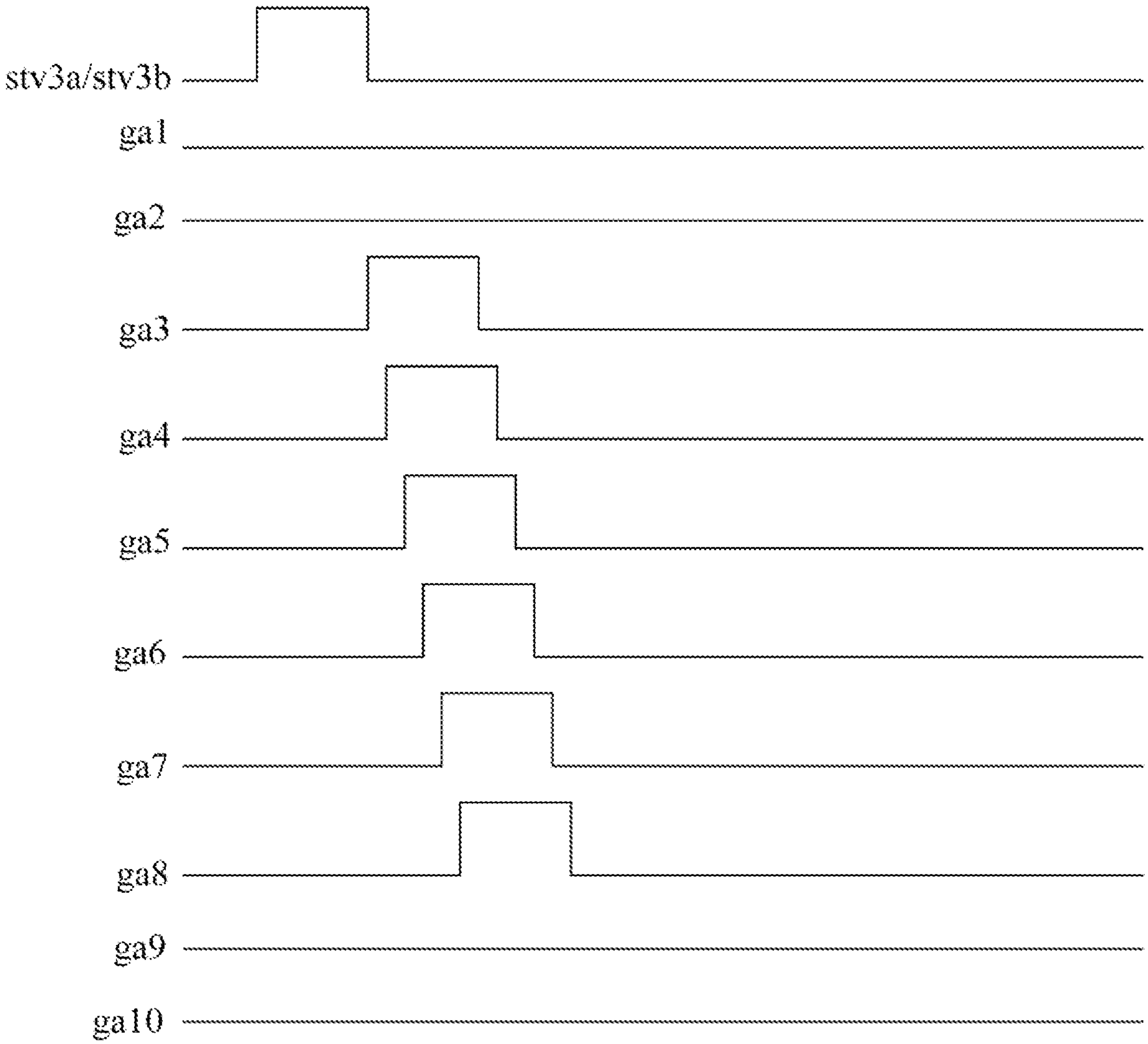
FIG. 14*a* is a timing diagram illustrating other signals provided by an embodiment of the present disclosure.

During the first display frame, as shown in FIG. 14*a*, the first control circuit 210 outputs the first selection command signal CX2, and the first selection command signal CX2 includes address information of 000, 001, 010, and 011, and may include data selected information of 0010 to 0111.

In addition, the first control circuit 210 further outputs a first image enable signal to the source driver circuit, and controls the first zero gray scale output buffer and the second zero gray scale output buffer not to operate, and controls the non-zero gray scale output buffers to operate. The source driver circuit controls each control switch to turn it conductive between the first input terminal and the output terminal of the control switch, thereby may perform a series of processing on the image data in the second image area TX2 according to the received image data in the second image area TX2, and then input the processed image data into the coupled non-zero gray scale output buffers, to apply the corresponding data voltages to the data signal lines in the second image area TX2 through the non-zero gray scale output buffers.

The frame start signal control circuit 221-1*a* in the first second control circuit 220-1*a* may determine, according to the address information: 000 and the data selected information: 0010 to 0111 in the first selection command signal CX2, the third to fifth scan signal lines GA3 to GA5 from among the correspondingly coupled scan signal lines, as target scan signal lines, generate a first target frame start signal stv3*a* corresponding to the third scan signal line GA3, a first target frame start signal stv4*a* corresponding to the fourth scan signal line GA4, and a first target frame start signal stv5*a* corresponding to the fifth scan signal line GA5, and input the generated first target frame start signal stv3*a* to the input signal terminal INP of the first shift register unit SR3-1*a*, input the generated first target frame start signal stv4*a* to the input signal terminal INP of the first shift register unit SR4-1*a*, and input the generated first target frame start signal stv5*a* to the input signal terminal INP of the first shift register unit SR5-1*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck3 is input to the clock control signal terminal CK of the first shift register unit SR3-1*a*, so that the first shift register unit SR3-1*a* may output a scan drive signal ga3 from the drive signal output terminal GO thereof, based on the first target frame start signal stv3*a* input to the input signal terminal INP thereof and the clock signal ck3 input to the clock control signal terminal CK thereof. In addition, the clock signal ck4 is input to the clock control signal terminal CK of the first shift register unit SR4-1*a*, so that the first shift register unit SR4-1*a* may output a scan drive signal ga4 from the drive signal output terminal GO thereof, based on the first target frame start signal stv4*a* input to the input signal terminal INP thereof and the clock signal ck4 input to the clock control signal terminal CK thereof. In addition, the clock signal ck5 is input to the clock control signal terminal CK of the first shift register unit SR5-1*a*, so that the first shift register unit SR5-1*a* may output a scan drive signal ga5 from the drive signal output terminal GO thereof, based on the first target frame start signal stv5*a* input to the input signal terminal INP thereof and the clock signal ck5 input to the clock control signal terminal CK thereof. In addition, the first target frame start signals are not input to the first shift register units SR1-1*a* to SR2-1*a*, so that the first shift register units SR1-1*a* to SR2-1*a* do not output the scan drive signals, but each keep outputting the scan-off signal.

In addition, the frame start signal control circuit 221-1*b* in the second second control circuit 220-1*b* may determine, according to the address information: 010 and the data selected information: 0010 to 0111 in the first selection command signal CX2, the third to fifth scan signal lines GA3 to GA5 from among the correspondingly coupled scan signal lines, as target scan signal lines, generate a first target frame start signal stv3*b* corresponding to the third scan signal line GA3, a first target frame start signal stv4*b* corresponding to the fourth scan signal line GA4, and a first target frame start signal stv5*b* corresponding to the fifth scan signal line GA5, and input the generated first target frame start signal stv3*b* to the input signal terminal INP of the first shift register unit SR3-1*b*, input the generated first target frame start signal stv4*b* to the input signal terminal INP of the first shift register unit SR4-1*b*, and input the generated first target frame start signal stv5*b* to the input signal terminal INP of the first shift register unit SR5-1*b*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck3 is input to the clock control signal terminal CK of the first shift register unit SR3-1*b*, so that the first shift register unit SR3-1*b* may output a scan drive signal gb3 from the drive signal output terminal GO thereof, based on the first target frame start signal stv3*b* input to the input signal terminal INP thereof and the clock signal ck3 input to the clock control signal terminal CK thereof. In addition, the clock signal ck4 is input to the clock control signal terminal CK of the first shift register unit SR4-1*b*, so that the first shift register unit SR4-1*b* may output a scan drive signal gb4 from the drive signal output terminal GO thereof, based on the first target frame start signal stv4*b* input to the input signal terminal INP thereof and the clock signal ck4 input to the clock control signal terminal CK thereof. In addition, the clock signal ck5 is input to the clock control signal terminal CK of the first shift register unit SR5-1*b*, so that the first shift register unit SR5-1*b* may output a scan drive signal gb5 from the drive signal output terminal GO thereof, based on the first target frame start signal stv5*b* input to the input signal terminal INP thereof and the clock signal ck5 input to the clock control signal terminal CK thereof. In addition, the first target frame start signals are not input to the first shift register units SR1-1*b* to SR2-1*b*, so that the first shift register units SR1-1*b* to SR2-1*b* do not output the scan drive signals, but each keep outputting the scan-off signal.

In addition, the frame start signal control circuit 221-2*a* in the third second control circuit 220-2*a* may determine, according to the address information: 001 and the data selected information: 0010 to 0111 in the first selection command signal CX2, the sixth to eighth scan signal lines GA6 to GA8 from among the correspondingly coupled scan signal lines, as target scan signal lines, generate a first target frame start signal stv6*a* corresponding to the sixth scan signal line GA6, a first target frame start signal stv7*a* corresponding to the seventh scan signal line GA7, and a first target frame start signal stv8*a* corresponding to the eighth scan signal line GA8, and input the generated first target frame start signal stv6*a* to the input signal terminal INP of the first shift register unit SR1-2*a*, input the generated first target frame start signal stv7*a* to the input signal terminal INP of the first shift register unit SR2-2*a*, and input the generated first target frame start signal stv8*a* to the input signal terminal INP of the first shift register unit SR3-2*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck6 is input to the clock control signal terminal CK of the first shift register unit SR1-2*a*, so that the first shift register unit SR1-2*a* may output a scan drive signal ga6 from the drive signal output terminal GO thereof, based on the first target frame start signal stv6*a* input to the input signal terminal INP thereof and the clock signal ck6 input to the clock control signal terminal CK thereof. In addition, the clock signal ck7 is input to the clock control signal terminal CK of the first shift register unit SR2-2*a*, so that the first shift register unit SR2-2*a* may output a scan drive signal ga7 from the drive signal output terminal GO thereof, based on the first target frame start signal stv7*a* input to the input signal terminal INP thereof and the clock signal ck7 input to the clock control signal terminal CK thereof. In addition, the clock signal ck8 is input to the clock control signal terminal CK of the first shift register unit SR3-2*a*, so that the first shift register unit SR3-2*a* may output a scan drive signal ga8 from the drive signal output terminal GO thereof, based on the first target frame start signal stv8*a* input to the input signal terminal INP thereof and the clock signal ck8 input to the clock control signal terminal CK thereof. In addition, the first target frame start signals are not input to the first shift register units SR4-2*a* to SR5-2*a*, so that the first shift register units SR4-2*a* to SR5-2*a* do not output the scan drive signals, but each keep outputting the scan-off signal.

In addition, the frame start signal control circuit 221-2*b* in the fourth second control circuit 220-2*b* may determine, according to the address information: 001 and the data selected information: 0010 to 0111 in the first selection command signal CX2, the sixth to eighth scan signal lines GA6 to GA8 from among the correspondingly coupled scan signal lines, as target scan signal lines, generate a first target frame start signal stv6*b* corresponding to the sixth scan signal line GA6, a first target frame start signal stv7*b* corresponding to the seventh scan signal line GA7, and a first target frame start signal stv8*b* corresponding to the eighth scan signal line GA8, and input the generated first target frame start signal stv6*b* to the input signal terminals INP of the first shift register units SR1-2*b*, input the generated first target frame start signal stv7*b* to the input signal terminal INP of the first shift register units SR2-2*b*, and input the generated first target frame start signal stv8*b* to the input signal terminal INP of the first shift register units SR3-2*b*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck6 is input to the clock control signal terminal CK of the first shift register unit SR1-2*b*, so that the first shift register unit SR1-2*b* may output a scan drive signal gb6 from the drive signal output terminal GO thereof, based on the first target frame start signal stv6*b* input to the input signal terminal INP thereof and the clock signal ck6 input to the clock control signal terminal CK thereof. In addition, the clock signal ck7 is input to the clock control signal terminal CK of the first shift register unit SR2-2*b*, so that the first shift register unit SR2-2*b* may output a scan drive signal gb7 from the drive signal output terminal GO thereof, based on the first target frame start signal stv7*b* input to the input signal terminal INP thereof and the clock signal ck7 input to the clock control signal terminal CK thereof. In addition, the clock signal ck8 is input to the clock control signal terminal CK of the first shift register unit SR3-2*b*, so that the first shift register unit SR3-2*b* may output a scan drive signal gb8 from the drive signal output terminal GO thereof, based on the first target frame start signal stv8*b* input to the input signal terminal INP thereof and the clock signal ck8 input to the clock control signal terminal CK thereof. In addition, the first target frame start signals are not input to the first shift register units SR4-2*b* to SR5-2*b*, so that the first shift register units SR4-2*b* to SR5-2*b* do not output the scan drive signals, but each keep outputting the scan-off signal.

Thus, when a high level signal appears in each of the scan drive signals input to the third to eighth scan signal lines GA3 to GA8, data voltages with corresponding polarities output from the data signal lines may be input to the pixel electrodes of the sub-pixels, to realize charging the sub-pixels in the second image area TX2.

During each of the second to tenth display frames, an operation process thereof may refer to the operation process of the first display frame, which is not repeated herein.

Embodiments of the present disclosure provide other implementations of the drive control circuit, which are modified from the implementations in the above embodiments. Only the differences between the present embodiment and the above embodiments will be described below, and the same parts will not be repeated herein.

If the first image area is a still picture or a dynamic picture with a slow motion, but with a brightness, the first image area is refreshed with a lower refresh rate. In some embodiments of the present disclosure, the first control circuit is further configured to determine a refresh rate corresponding to the first image area as a first refresh rate, and determine a refresh rate corresponding to the second image area as a second refresh rate, where the first refresh rate is less than the second refresh rate. Illustratively, the second refresh rate f2 may be an integer multiple of the first refresh rate f1. That is, f2=a×f1, where a is an integer greater than 1.

Illustratively, in a plurality of consecutive display frames, a data refresh process for the first image area may be performed in one display frame, and a data refresh process for the second image area may be performed in the next multiple display frames. Then, the data refresh process for the first image area is performed in one display frame, and so on. Therefore, the logic drive power consumption is reduced. Specifically, in this driving manner, when refreshed at a lower refresh rate, the blanking time phase is longer in the corresponding data voltage, and when refreshed at a higher refresh rate, the blanking time phase is shorter in the corresponding data voltage. The power consumption on the scan side and the data side can be simultaneously reduced by adopting this driving manner, and are each reduced by $$\left(1-\frac{n-m}{N}\right)\times\frac{f1-f2}{f1}.$$

The following describes, with reference with FIGS. 7 to 14*b*, the operation process of the above drive control circuit provided by the embodiment of the present disclosure, by taking the first to tenth display frames as an example.

The first control circuit 210 may acquire image data of the first to tenth display frames, and compare the image data of the first to tenth display frames to determine whether set picture data in a same first image area exists in the first to tenth display frames. When it is determined that black picture data in the first first image area TX1-1 and the second first image area TX1-2 exist in the first to tenth display frames, during each of the first and sixth display frames, scan signal lines coupled to pixel units in the first first image area TX1-1 and the second first image area TX1-2 are determined as target scan signal lines, and data voltages of the black picture (or static picture) are input to the corresponding data lines. During each of the second to fifth display frames and the seventh to tenth display frames, the scan signal lines coupled to the pixel units in the second image area TX2 are determined as target scan signal lines, and data voltages of the dynamic picture are input to the corresponding data lines. Moreover, a first selection command signal CX1 is output during each of the first and sixth display frames, and a first selection command signal CX2 is output during each of the second to fifth display frames and the seventh to tenth display frames. It should be noted that, it is illustrated herein as an example that the first control circuit 210 may compare the image data of the first to tenth display frames, while the number of the display frames to be compared may be determined according to practical settings, which is not limited herein, for example, the number of the display frames to be compared may be greater than or equal to 2.

Figure 14B:
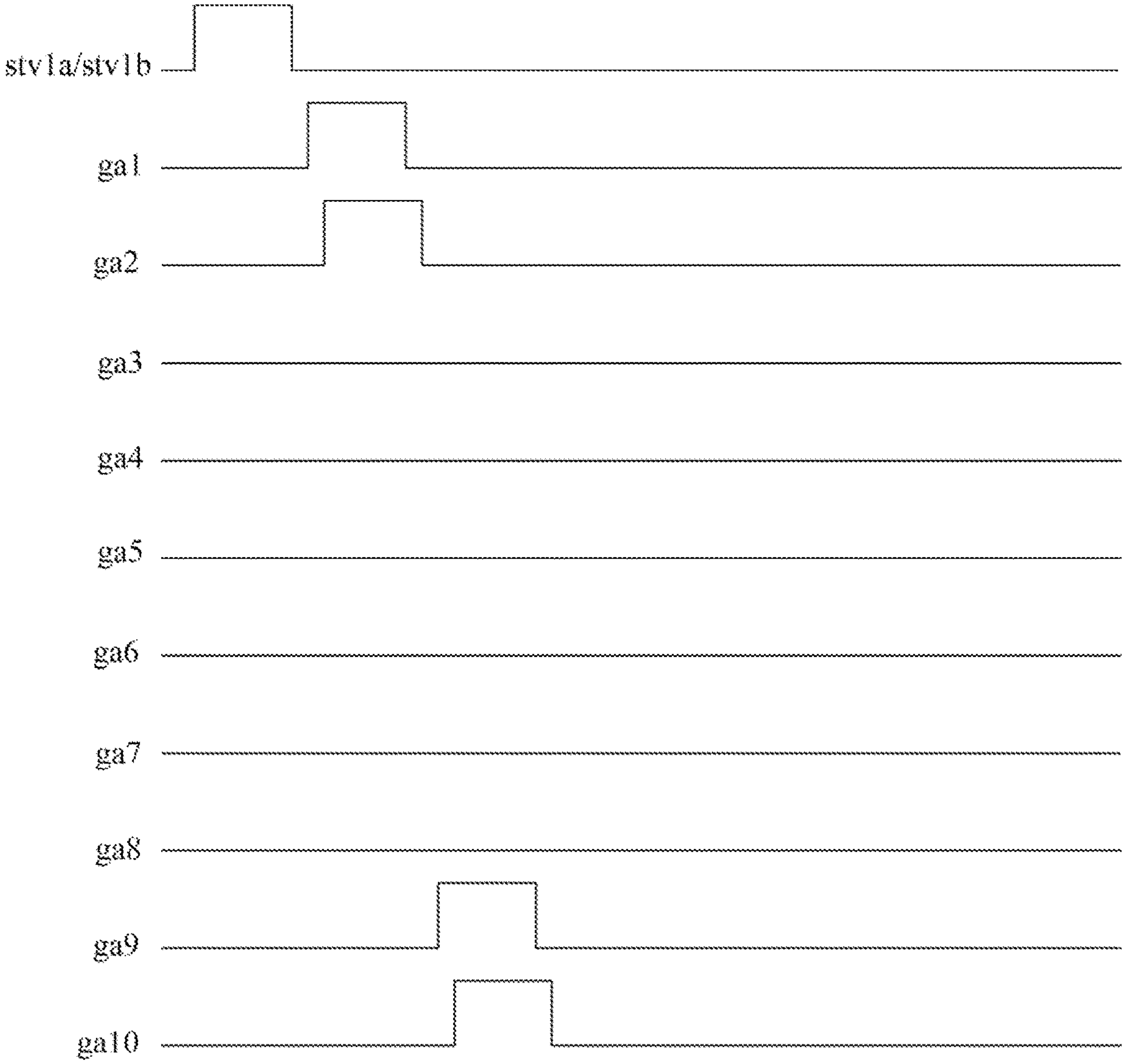
FIG. 14*b* is a timing diagram illustrating other signals provided by an embodiment of the present disclosure.

During the first display frame, as shown in FIG. 14*b*, the first circuit 210 outputs the first select command signal CX1, and the first select command signal CX1 includes address information of 000, 001, 010, and 011, and may include data selected information of 0000 to 0001 and 1000 to 1001.

In addition, the first control circuit 210 further outputs a first image disable signal to the source driver circuit 230, controls the first zero gray scale output buffer and the second zero gray scale output buffer to operate, and controls the non-zero gray scale output buffer not to operate. The data conversion circuit may perform a series of processing on the image data (i.e., 0 gray scale) in the first image area, according to the received image data in the first image area, and then input the image data into the first zero gray scale output buffer and the second zero gray scale output buffer coupled to the data conversion circuit. Each control switch is controlled to turn it conductive between the second input terminal and the output terminal thereof, so that the data voltage corresponding to the negative polarity is applied to the data signal lines in the first image area through the first zero gray scale output buffer. Moreover, each control switch is controlled to turn it conductive between the third input terminal and the output terminal thereof, so that the data voltage corresponding to the positive polarity is applied to the data signal lines in the first image area through the second zero gray scale output buffer.

The frame start signal control circuit 221-1*a* in the first second control circuit 220-1*a* may determine, according to the address information: 000 and the data selected information: 0000 to 0001 in the first selection command signal CX1, the first scan signal line GA1 and the second scan signal line GA2 from among the correspondingly coupled scan signal lines, as target scan signal lines, generate a first target frame start signal stv1*a* corresponding to the first scan signal line GA1 and a first target frame start signal stv2*a* corresponding to the second scan signal line GA2, and input the generated first target frame start signal stv1*a* to the input signal terminal INP of the first shift register unit SR1-1*a*, and input the generated first target frame start signal stv2*a* to the input signal terminal INP of the first shift register unit SR2-1*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck1 is input to the clock control signal terminal CK of the first shift register unit SR1-1*a*, so that the first shift register unit SR1-1*a* may output a scan drive signal ga1 from the drive signal output terminal GO thereof, based on the first target frame start signal stv1*a* input to the input signal terminal INP thereof and the clock signal ck1 input to the clock control signal terminal CK thereof. In addition, the clock signal ck2 is input to the clock control signal terminal CK of the first shift register unit SR2-1*a*, so that the first shift register unit SR2-1*a* may output a scan drive signal ga2 from the drive signal output terminal GO thereof, based on the first target frame start signal stv2*a* input to the input signal terminal INP thereof and the clock signal ck2 input to the clock control signal terminal CK thereof. In addition, the first target frame start signals are not input to the first shift register units SR3-1*a* to SR5-1*a*, so that the first shift register units SR3-1*a* to SR5-1*a* do not output the scan drive signals, but each keep outputting the scan-off signal.

In addition, the frame start signal control circuit 221-1*b* in the second second control circuit 220-1*b* may determine, according to the address information: 001 and the data selected information: 0000 to 0001 in the first selection command signal CX1, the first scan signal line GA1 and the second scan signal line GA2 from among the correspondingly coupled scan signal lines, as target scan signal lines, generate a first target frame start signal stv1*b* corresponding to the first scan signal line GA1 and a first target frame start signal stv2*b* corresponding to the second scan signal line GA2, and input the generated first target frame start signal stv1*b* to the input signal terminal INP of the first shift register unit SR1-1*b*, and input the generated first target frame start signal stv2*b* to the input signal terminal INP of the first shift register unit SR2-1*b*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck1 is input to the clock control signal terminal CK of the first shift register unit SR1-1*b*, so that the first shift register unit SR1-1*b* may output a scan drive signal gb1 based on the first target frame start signal stv1*b* input to the input signal terminal INP thereof and the clock signal ck1 input to the clock control signal terminal CK thereof. In addition, the clock signal ck2 is input to the clock control signal terminal CK of the first shift register unit SR2-1*b*, so that the first shift register unit SR2-1*b* may output a scan drive signal gb2 from the drive signal output terminal GO thereof, based on the first target frame start signal stv2*b* input to the input signal terminal INP thereof and the clock signal ck2 input to the clock control signal terminal CK thereof. In addition, the first target frame start signals are not input to the first shift register units SR3-1*b* to SR5-1*b*, so that the first shift register units SR3-1*b* to SR5-1*b* do not output the scan drive signals, but each keep outputting the scan-off signal.

Thus, when a high level signal appears in each of the scan drive signals input to the first scan signal line GA1 and the second scan signal line GA2, the data voltages with corresponding polarities output from the data signal lines may be input to the pixel electrodes of the sub-pixels, to realize charging the sub-pixels in the first first image area TX1-1.

Moreover, the frame start signal control circuit 221-2*a* in the third second control circuit 220-2*a* may determine, according to the address information: 010 and the data selected information: 1000 to 1001 in the first selection command signal CX1, the ninth scan signal line GA9 and the tenth scan signal line GA10 from among the correspondingly coupled scan signal lines, as target scan signal lines, generate a first target frame start signal stv9*a* corresponding to the ninth scan signal line GA9 and a first target frame start signal stv10*a* corresponding to the tenth scan signal line GA10, and input the generated first target frame start signal stv9*a* to the input signal terminal INP of the first shift register unit SR4-2*a*, and input the generated first target frame start signal stv10*a* to the input signal terminal INP of the first shift register unit SR5-2*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck9 is input to the clock control signal terminal CK of the first shift register unit SR4-2*a*, so that the first shift register unit SR4-2*a* may output a scan drive signal ga9 from the drive signal output terminal GO thereof, based on the first target frame start signal stv9*a* input to the input signal terminal INP thereof and the clock signal ck9 input to the clock control signal terminal CK thereof. In addition, the clock signal ck10 is input to the clock control signal terminal CK of the first shift register unit SR5-2*a*, so that the first shift register unit SR5-2*a* may output a scan drive signal ga10 from the drive signal output terminal GO thereof, based on the first target frame start signal stv10*a* input to the input signal terminal INP thereof and the clock signal ck10 input to the clock control signal terminal CK thereof. In addition, the first target frame start signals are not input to the first shift register units SR1-2*a* to SR3-2*a*, so that the first shift register units SR1-2*a* to SR3-2*a* do not output the scan drive signals, but each keep outputting the scan-off signal.

In addition, the frame start signal control circuit 221-2*b* in the fourth second control circuit 220-2*b* may determine, according to the address information: 011 and the data selected information: 1000 to 1001 in the first selection command signal CX1, the ninth scan signal line GA9 and the tenth scan signal line GA10 from among the correspondingly coupled scan signal lines, as target scan signal lines, generate a first target frame start signal stv9*b* corresponding to the ninth scan signal line GA9 and a first target frame start signal stv10*b* corresponding to the tenth scan signal line GA10, and input the generated first target frame start signal stv9*b* to the input signal terminal INP of the first shift register unit SR4-2*b*, and input the generated first target frame start signal stv10*b* to the input signal terminal INP of the first shift register unit SR5-2*b*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck9 is input to the clock control signal terminal CK of the first shift register unit SR4-2*b*, so that the first shift register unit SR4-2*b* may output a scan drive signal gb9 based on the first target frame start signal stv9*b* input to the input signal terminal INP thereof and the clock signal ck9 input to the clock control signal terminal CK thereof. In addition, the clock signal ck10 is input to the clock control signal terminal CK of the first shift register unit SR5-2*b*, so that the first shift register unit SR5-2*b* may output a scan drive signal gb10 from the drive signal output terminal GO thereof, based on the first target frame start signal stv10*b* input to the input signal terminal INP thereof and the clock signal ck10 input to the clock control signal terminal CK thereof. In addition, the first target frame start signals are not input to the first shift register units SR1-2*b* to SR3-2*b*, so that the first shift register units SR1-2*b* to SR3-2*b* do not output the scan drive signals, but each keep outputting the scan-off signal.

Thus, when a high level signal appears in each of the scan drive signals input to the ninth scan signal line GA9 and the tenth scan signal line GA10, the data voltages with corresponding polarities output from the data signal lines may be input to the pixel electrodes of the sub-pixels, to realize charging the sub-pixels in the second first image area TX1-2.

During the second display frame, referring to FIG. 14*a*, the first control circuit 210 outputs a first selection command signal CX2, and the first selection command signal CX2 includes address information of 000, 001, 010, and 011, and may include data selected information of 0010 to 0111.

Moreover, the first control circuit 210 further outputs a first image enable signal to the source driver circuit 230, and controls the first zero gray scale output buffer and the second zero gray scale output buffer not to operate, and controls the non-zero gray scale output buffers to operate. The source driver circuit controls each control switch to turn it conductive between the first input terminal and the output terminal of the control switch, thereby may perform a series of processing on the image data in the second image area TX2 according to the received image data in the second image area TX2, and then input the processed image data into the coupled non-zero gray scale output buffers, to apply the corresponding data voltage to the data signal lines in the second image area TX2 through the non-zero gray scale output buffers.

The frame start signal control circuit 221-1*a* in the first second control circuit 220-1*a* may determine, according to the address information: 000 and the data selected information: 0010 to 0111 in the first selection command signal CX2, the third to fifth scan signal lines GA3 to GA5 from among the correspondingly coupled scan signal lines, as target scan signal lines, generate a first target frame start signal stv3*a* corresponding to the third scan signal line GA3, a first target frame start signal stv4*a* corresponding to the fourth scan signal line GA4, and a first target frame start signal stv5*a* corresponding to the fifth scan signal line GA5, and input the generated first target frame start signal stv3*a* to the input signal terminal INP of the first shift register unit SR3-1*a*, input the generated first target frame start signal stv4*a* to the input signal terminal INP of the first shift register unit SR4-1*a*, and input the generated first target frame start signal stv5*a* to the input signal terminal INP of the first shift register unit SR5-1*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck3 is input to the clock control signal terminal CK of the first shift register unit SR3-1*a*, so that the first shift register unit SR3-1*a* may output a scan drive signal ga3 from the drive signal output terminal GO thereof, based on the first target frame start signal stv3*a* input to the input signal terminal INP thereof and the clock signal ck3 input to the clock control signal terminal CK thereof. In addition, the clock signal ck4 is input to the clock control signal terminal CK of the first shift register unit SR4-1*a*, so that the first shift register unit SR4-1*a* may output a scan drive signal ga4 from the drive signal output terminal GO thereof, based on the first target frame start signal stv4*a* input to the input signal terminal INP thereof and the clock signal ck4 input to the clock control signal terminal CK thereof. In addition, the clock signal ck5 is input to the clock control signal terminal CK of the first shift register unit SR5-1*a*, so that the first shift register unit SR5-1*a* may output a scan drive signal ga5 from the drive signal output terminal GO thereof, based on the first target frame start signal stv5*a* input to the input signal terminal INP thereof and the clock signal ck5 input to the clock control signal terminal CK thereof. In addition, the first target frame start signals are not input to the first shift register units SR1-1*a* to SR2-1*a*, so that the first shift register units SR1-1*a* to SR2-1*a* do not output the scan drive signals, but each keep outputting the scan-off signal.

In addition, the frame start signal control circuit 221-1*b* in the second second control circuit 220-1*b* may determine, according to the address information: 010 and the data selected information: 0010 to 0111 in the first selection command signal CX2, the third to fifth scan signal lines GA3 to GA5 from among the correspondingly coupled scan signal lines, as target scan signal lines, generate a first target frame start signal stv3*b* corresponding to the third scan signal line GA3, a first target frame start signal stv4*b* corresponding to the fourth scan signal line GA4, and a first target frame start signal stv5*b* corresponding to the fifth scan signal line GA5, and input the generated first target frame start signal stv3*b* to the input signal terminal INP of the first shift register unit SR3-1*b*, input the generated first target frame start signal stv4*b* to the input signal terminal INP of the first shift register unit SR4-1*b*, and input the generated first target frame start signal stv5*b* to the input signal terminal INP of the first shift register unit SR5-1*b*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck3 is input to the clock control signal terminal CK of the first shift register unit SR3-1*b*, so that the first shift register unit SR3-1*b* may output a scan drive signal gb3 from the drive signal output terminal GO thereof, based on the first target frame start signal stv3*b* input to the input signal terminal INP thereof and the clock signal ck3 input to the clock control signal terminal CK thereof. In addition, the clock signal ck4 is input to the clock control signal terminal CK of the first shift register unit SR4-1*b*, so that the first shift register unit SR4-1*b* may output a scan drive signal gb4 from the drive signal output terminal GO thereof, based on the first target frame start signal stv4*b* input to the input signal terminal INP thereof and the clock signal ck4 input to the clock control signal terminal CK thereof. In addition, the clock signal ck5 is input to the clock control signal terminal CK of the first shift register unit SR5-1*b*, so that the first shift register unit SR5-1*b* may output a scan drive signal gb5 from the drive signal output terminal GO thereof, based on the first target frame start signal stv5*b* input to the input signal terminal INP thereof and the clock signal ck5 input to the clock control signal terminal CK thereof. In addition, the first target frame start signals are not input to the first shift register units SR1-1*b* to SR2-1*b*, so that the first shift register units SR1-1*b* to SR2-1*b* do not output the scan drive signals, but each keep outputting the scan-off signal.

In addition, the frame start signal control circuit 221-2*a* in the third second control circuit 220-2*a* may determine, according to the address information: 001 and the data selected information: 0010 to 0111 in the first selection command signal CX2, the sixth to eighth scan signal lines GA6 to GA8 from among the correspondingly coupled scan signal lines, as target scan signal lines, generate a first target frame start signal stv6*a* corresponding to the sixth scan signal line GA6, a first target frame start signal stv7*a* corresponding to the seventh scan signal line GA7, and a first target frame start signal stv8*a* corresponding to the eighth scan signal line GA8, and input the generated first target frame start signal stv6*a* to the input signal terminal INP of the first shift register unit SR1-2*a*, input the generated first target frame start signal stv7*a* to the input signal terminal INP of the first shift register unit SR2-2*a*, and input the generated first target frame start signal stv8*a* to the input signal terminal INP of the first shift register unit SR3-2*a*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck6 is input to the clock control signal terminal CK of the first shift register unit SR1-2*a*, so that the first shift register unit SR1-2*a* may output a scan drive signal ga6 from the drive signal output terminal GO thereof, based on the first target frame start signal stv6*a* input to the input signal terminal INP thereof and the clock signal ck6 input to the clock control signal terminal CK thereof. In addition, the clock signal ck7 is input to the clock control signal terminal CK of the first shift register unit SR2-2*a*, so that the first shift register unit SR2-2*a* may output a scan drive signal ga7 from the drive signal output terminal GO thereof, based on the first target frame start signal stv7*a* input to the input signal terminal INP thereof and the clock signal ck7 input to the clock control signal terminal CK thereof. In addition, the clock signal ck8 is input to the clock control signal terminal CK of the first shift register unit SR3-2*a*, so that the first shift register unit SR3-2*a* may output a scan drive signal ga8 from the drive signal output terminal GO thereof, based on the first target frame start signal stv8*a* input to the input signal terminal INP thereof and the clock signal ck8 input to the clock control signal terminal CK thereof. In addition, the first target frame start signals are not input to the first shift register units SR4-2*a* to SR5-2*a*, so that the first shift register units SR4-2*a* to SR5-2*a* do not output the scan drive signals, but each keep outputting the scan-off signal.

In addition, the frame start signal control circuit 221-2*b* in the fourth second control circuit 220-2*b* may determine, according to the address information: 001 and the data selected information: 0010 to 0111 in the first selection command signal CX2, the sixth to eighth scan signal lines GA6 to GA8 from among the correspondingly coupled scan signal lines, as target scan signal lines, generate a first target frame start signal stv6*b* corresponding to the sixth scan signal line GA6, a first target frame start signal stv7*b* corresponding to the seventh scan signal line GA7, and a first target frame start signal stv8*b* corresponding to the eighth scan signal line GA8, and input the generated first target frame start signal stv6*b* to the input signal terminal INP of the first shift register units SR1-2*b*, input the generated first target frame start signal stv7*b* to the input signal terminal INP of the first shift register units SR2-2*b*, and input the generated first target frame start signal stv8*b* to the input signal terminal INP of the first shift register units SR3-2*b*. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck6 is input to the clock control signal terminal CK of the first shift register unit SR1-2*b*, so that the first shift register unit SR1-2*b* may output a scan drive signal gb6 based on the first target frame start signal stv6*b* input to the input signal terminal INP thereof and the clock signal ck6 input to the clock control signal terminal CK thereof. In addition, the clock signal ck7 is input to the clock control signal terminal CK of the first shift register unit SR2-2*b*, so that the first shift register unit SR2-2*b* may output a scan drive signal gb7 from the drive signal output terminal GO thereof, based on the first target frame start signal stv7*b* input to the input signal terminal INP thereof and the clock signal ck7 input to the clock control signal terminal CK thereof. In addition, the clock signal ck8 is input to the clock control signal terminal CK of the first shift register unit SR3-2*b*, so that the first shift register unit SR3-2*b* may output a scan drive signal gb8 from the drive signal output terminal GO thereof, based on the first target frame start signal stv8*b* input to the input signal terminal INP thereof and the clock signal ck8 input to the clock control signal terminal CK thereof. In addition, the first target frame start signals are not input to the first shift register units SR4-2*b* to SR5-2*b*, so that the first shift register units SR4-2*b* to SR5-2*b* do not output the scan drive signals, but each keep outputting the scan-off signal.

Thus, when a high level signal appears in each of the scan drive signals input to the third to eighth scan signal lines GA3 to GA8, data voltages with corresponding polarities output from the data signal lines may be input to the pixel electrodes of the sub-pixels, to realize charging the sub-pixels in the second image area TX2.

During the third to fifth display frames, an operation process of each of the third to fifth display frames may refer to the operation process of the second display frame, which is not repeated herein.

During the sixth display frame, an operation process of the sixth display frame may refer to the operation process of the first display frame, which is not repeated herein.

During the seventh display frame to the tenth display frame, an operation process of each of the display frame may refer to the operation process of the display frame, which is not repeated herein.

Embodiments of the present disclosure provide further implementations of the drive control circuit, which are modified from the implementations in the above embodiments. Only the differences between the present embodiment and the above embodiments will be described below, and the same parts will not be repeated herein.

In some embodiments of the present disclosure, the first image area may include a plurality of adjacent pixel unit columns, and the second image area may include a plurality of adjacent pixel unit columns. The first image area includes different pixel unit columns than the second image area includes. Moreover, the number of the pixel unit columns in the first image area and the number of the pixel unit columns in the second image area may be the same as or different from each other. Illustratively, at least one first image area is provided, and at least one second image area is provided, where the at least one first image area and the at least one second image area are alternately arranged.

Figure 15:
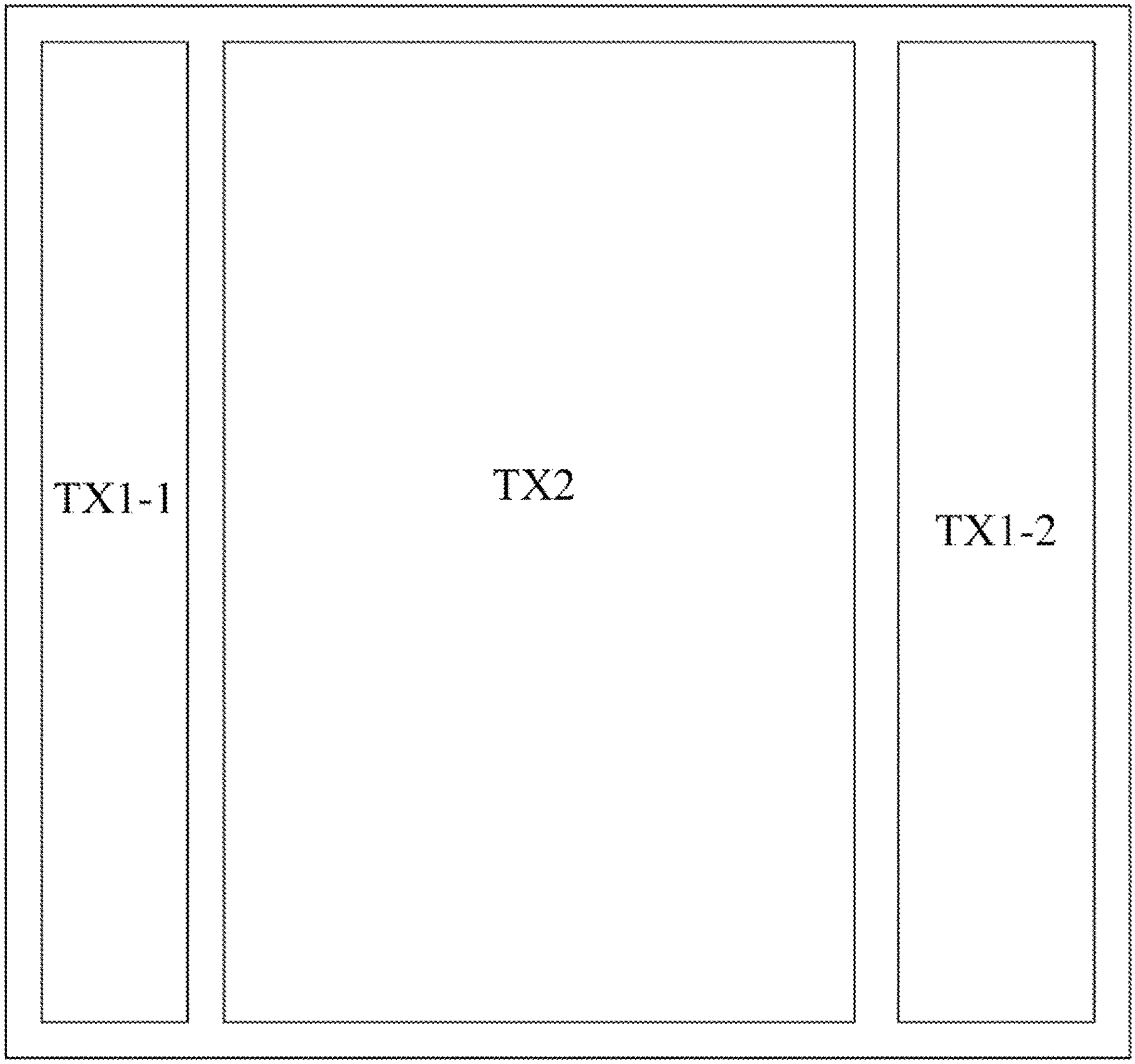
FIG. 15 is a schematic diagram illustrating other structures of a display panel provided by an embodiment of the present disclosure.

Alternatively, as shown in FIG. 15, two first image areas are provided, and are a first first image area TX1-1 and a second first image area TX1-2, respectively. One second image area is provided, and is the second image area TX2. In addition, the second image area TX2 is arranged between the first first image area TX1-1 and the second first image area TX1-2.

Alternatively, a plurality of first image areas may be set, a plurality of second image areas may be set, and the first image areas and the second image areas may be alternately arranged. The specific setting manner thereof may be determined according to the requirements of practical application, and are not limited by the present disclosure.

Illustratively, the display panel has a resolution of M×N, the second image area TX2 includes $p^{th}$ to $q^{th}$ sub-pixel columns, and the other areas (i.e., the first first image area TX1-1 and the second first image area TX1-2) are black pictures. By normally scanning the scan signal lines line by line, data voltages are only normally output to the corresponding $p^{th}$ to $q^{th}$ sub-pixel columns. The other areas, i.e., the first first image area TX1-1 and the second first image area TX1-2, are not refreshed. Moreover, the number of sub-pixel columns in the second image area TX2 is not less than 1. The driving scheme can reduce the power consumption of the source driver circuit, which is reduced by $$\left(1 - \frac{q-p}{M}\right).$$

Next, the operation process of the drive control circuit provided by the embodiment of the present disclosure is described with reference to FIGS. 7 to 13, 15 and 16, taking the first to tenth consecutive display frames as an example.

The first control circuit 210 may acquire image data of the first to tenth display frames, and compare the image data of the first to tenth display frames to determine whether set picture data in a same first image area exists in the first to tenth display frames. When it is determined that the black picture data in the first first image area TX1-1 and the second first image area TX1-2 exists in the first to tenth display frames, during each of the first and sixth display frames, the scan signal lines coupled to the pixel units in the first first image area TX1-1 and the second first image area TX1-2 are determined as target scan signal lines, and during each of the second to fifth display frames and the seventh to tenth display frames, the scan signal lines coupled to the pixel units in the second image area TX2 are determined as target scan signal lines. Moreover, a first selection command signal CX3 is output during each of the first to tenth display frames.

Figure 16:
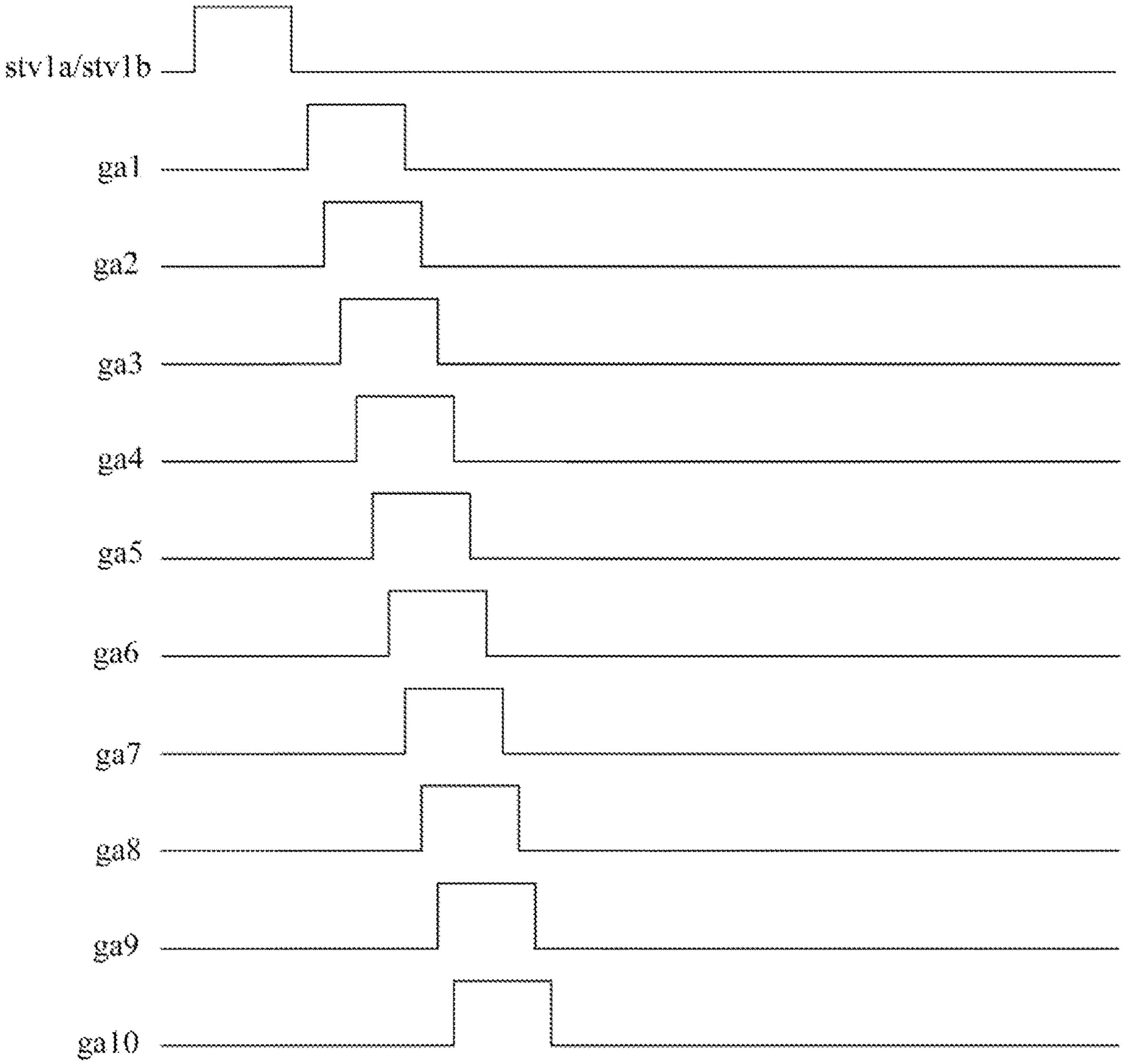
FIG. 16 is a timing diagram illustrating other signals provided by an embodiment of the present disclosure.

During the first display frame, as shown in FIG. 16, the first control circuit 210 outputs a first select command signal CX3, and the first select command signal CX3 includes address information of 000, 001, 010, and 011, and may include data selected information of 0000 to 1001.

Moreover, the first control circuit 210 further outputs a first image enable signal to the source driver circuit 230, and controls the first zero gray scale output buffer and the second zero gray scale output buffer not to operate, and controls the non-zero gray scale output buffers to operate. The source drive circuit controls each control switch such that each of the control switches coupled to the data signal lines in the second image region TX2 is turned conductive between the first input terminal and the output terminal of, and each of the control switches coupled to the data signal lines in the first image region TX1-1 and the second first image region TX1-2 is disconnected between the output terminal and its either input terminal. Therefore, a series of processing may be performed on the received image data in the second image region TX2, according to the received image data in the second image region TX2, and then the processed image data in the second image region TX2 may be input into the coupled non-zero gray scale output buffers, and the corresponding data voltage may be applied to the data signal lines in the second image region TX2 through the non-zero gray scale output buffers.

The frame start signal control circuit 221-1*a* in the first second control circuit 220-1*a* may determine, according to the address information: 000 and the data selected information: 0000 to 1001 in the first selection command signal CX3, the first to fifth scan signal lines GA1 to GA5 as target scan signal lines, and generate a first target frame start signal stv1*a* corresponding to the first scan signal line GA1, a first target frame start signal corresponding to the second scan signal line GA2, a first target frame start signal corresponding to the third scan signal line GA3, a first target frame start signal corresponding to the fourth scan signal line GA4, and a first target frame start signal corresponding to the fifth scan signal line GA5. Moreover, the generated first target frame start signal stv1*a* is input to the input signal terminal INP of the first shift register unit SR1-1*a*, and the remaining generated first target frame start signals are input to the input signal terminals INP of the corresponding first shift register units, respectively. The first control circuit 210 further inputs the corresponding reference clock control signals cks1 to cks12 to the level shift circuit 240, and the level shift circuit 240 generates clock signals ck1 to ck12 based on the received reference clock control signals cks1 to cks12, the first reference voltage VREF1, and the second reference voltage VREF2, and inputs the generated clock signals ck1 to ck12 to the corresponding first shift register units. The clock signal ck1 is input to the clock control signal terminal CK of the first shift register unit SR1-1*a*, so that the first shift register unit SR1-1*a* may output a scan drive signal ga1 from the drive signal output terminal GO thereof, based on the first target frame start signal stv1*a* input to the input signal terminal INP thereof and the clock signal ck1 input to the clock control signal terminal CK thereof. Similarly, the first shift register unit SR2-1*a* may output a scan drive signal ga2 from the drive signal output terminal GO thereof, based on the first target frame start signal input to its input signal terminal INP and the clock signal ck2 input to its clock control signal terminal CK. The first shift register unit SR3-1*a* may output a scan drive signal ga3 from the drive signal output terminal GO thereof, based on the first target frame start signal input to the input signal terminal INP thereof and the clock signal ck3 input to the clock control signal terminal CK thereof. The first shift register unit SR4-1*a* may output a scan drive signal ga4 from the drive signal output terminal GO thereof, based on the first target frame start signal input to the input signal terminal INP thereof and the clock signal ck4 input to the clock control signal terminal CK thereof. The first shift register unit SR5-1*a* may output a scan drive signal ga5 from the drive signal output terminal GO thereof, based on the first target frame start signal input to the input signal terminal INP thereof and the clock signal ck5 input to the clock control signal terminal CK thereof.

The frame start signal control circuit 221-1*b* of the second second control circuit 220-1*b* may determine, according to the address information: 001 and the data selected information: 0000 to 1001 in the first selection command signal CX3, the first to fifth scan signal lines GA1 to GA5 as target scan signal lines, and generate first target frame start signals corresponding to the first to fifth scan signal lines GA1 to GA5. Moreover, the generated first target frame start signals are input to the input signal terminals INP of the corresponding first shift register units, respectively. The first control circuit 210 further inputs the generated clock signals ck1 to ck12 to the corresponding first shift register units. The clock signal ck1 is input to the clock control signal terminal CK of the first shift register unit SR1-1*b*, so that the first shift register unit SR1-1*b* may output a scan drive signal gb1 from the drive signal output terminal GO thereof, based on the first target frame start signal stv1*b* input to the input signal terminal INP thereof and the clock signal ck1 input to the clock control signal terminal CK thereof. The rest are similar and may be analogized, and the details thereof are not repeated herein.

The frame start signal control circuit 221-2*a* in the third second control circuit 220-2*a* may determine, according to the address information: 010 and the data selected information: 0000 to 1001 in the first selection command signal CX3, the sixth to tenth scan signal lines GA6 to GA10 as target scan signal lines, and generate first target frame start signals corresponding to the sixth to tenth scan signal lines GA6 to GA10. Moreover, the generated first target frame start signals are input to the input signal terminals INP of the corresponding first shift register units, respectively. The first control circuit 210 further inputs the corresponding reference clock control signals cks1 to cks12 to the level shift circuit 240, and the level shift circuit 240 inputs the generated clock signals ck1 to ck12 to the corresponding first shift register units. The clock signal ck6 is input to the clock control signal terminal CK of the first shift register unit SR1-2*a*, so that the first shift register unit SR1-2*a* may output a scan drive signal ga6 from the drive signal output terminal GO thereof, based on the first target frame start signal stv2*a* input to the input signal terminal INP thereof and the clock signal ck6 input to the clock control signal terminal CK thereof. The rest are similar and may be analogized, and the details thereof are not repeated herein.

The frame start signal control circuit 221-2*b* in the fourth second control circuit 220-2*b* may determine, according to the address information: 011 and the data selected information: 0000 to 1001 in the first selection command signal CX3, the sixth to tenth scan signal lines GA6 to GA10 as target scan signal lines, and generate first target frame start signals corresponding to the sixth to tenth scan signal lines GA6 to GA10. Moreover, the generated first target frame start signals are input to the input signal terminals INP of the corresponding first shift register units, respectively. The first control circuit 210 further inputs the corresponding reference clock control signals cks1 to cks12 to the level shift circuit 240, and the level shift circuit 240 inputs the generated clock signals ck1 to ck12 to the corresponding first shift register units. The clock signal ck6 is input to the clock control signal terminal CK of the first shift register unit SR1-2*b*, so that the first shift register unit SR1-2*b* may output a scan drive signal gb6 from the drive signal output terminal GO thereof, based on the first target frame start signal stv2*b* input to the input signal terminal INP thereof and the clock signal ck6 input to the clock control signal terminal CK thereof. The rest are similar and may be analogized, and the details thereof are not repeated herein.

Thus, when a high level signal appears in each of the scan drive signals input to the first scan signal line GA1 to the tenth scan signal line GA10, the data voltages with corresponding polarities output from the data signal lines in the second image area TX2 may be input to the pixel electrodes of the sub-pixels, to realize charging the sub-pixels in the second image area TX2.

Embodiments of the present disclosure provide further implementations of the drive control circuit, which are modified from the implementations in the above embodiments. Only the differences between the present embodiment and the above embodiments will be described below, and the same parts will not be repeated herein.

In some embodiments of the present disclosure, the first image area includes adjacent a1 columns×b1 rows of pixel units, where $1 \leq a1 < M$, $1 \leq b1 < N$, M represents the total number of pixel unit columns in the display panel, N represents the total number of pixel unit rows in the display panel, and both of a1 and b1 are integers. The second image area includes adjacent a2 columns×b2 rows of pixel units, where $1 \leq a2 < M$, $1 \leq b2 < N$, and both of a2 and b2 are integers. In practical applications, specific values of a1, b1, a2 and b2 may be determined according to requirements of practical applications, which are not limited by the present disclosure.

Figure 17:
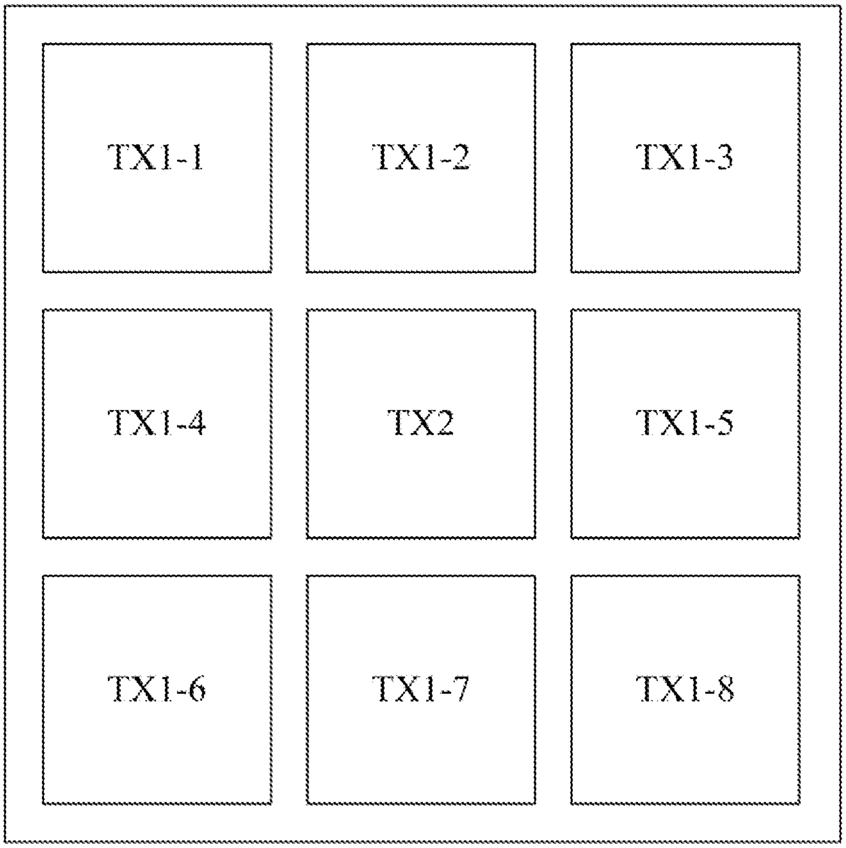
FIG. 17 is a schematic diagram illustrating other structures of a display panel provided by an embodiment of the present disclosure.

Illustratively, at least one first image area and at least one second image area are provided, where the at least one first image area and the at least one second image area are uniformly distributed. For example, as shown in FIG. 17, eight first image areas are set, and are a first first image area TX1-1 to an eighth first image area TX1-8, respectively. One second image area TX2 is set.

It should be noted that, the division manner of the first image area and the second image area in the display panel shown in FIG. 17 may correspond to signal timings as shown in FIGS. 14*a* and 14*b*. In addition, an operation process of the display panel shown in FIG. 17 adopting the signal timings shown in FIGS. 14*a* and 14*b* may refer to the above embodiment, and is not repeated herein.

The display panel resolution is M×N, and the second display area is as shown in FIG. 17. By setting the scan drive signals to scan only the $m^{th}$ sub-pixel row to the $n^{th}$ sub-pixel row, outputting the data voltages to only the $p^{th}$ sub-pixel column to the $q^{th}$ sub-pixel column, and holding potentials for other areas, the scheme can reduce the power consumption of the scan drive and the data drive at the same time, which is reduced by $$\left(1 - \frac{(q-p)*(n-m)}{M*N}\right).$$

Embodiments of the present disclosure provide further implementations of the drive control circuit, which are modified from the implementations in the above embodiments. Only the differences between the present embodiment and the above embodiments will be described below, and the same parts will not be repeated herein.

Figure 18:
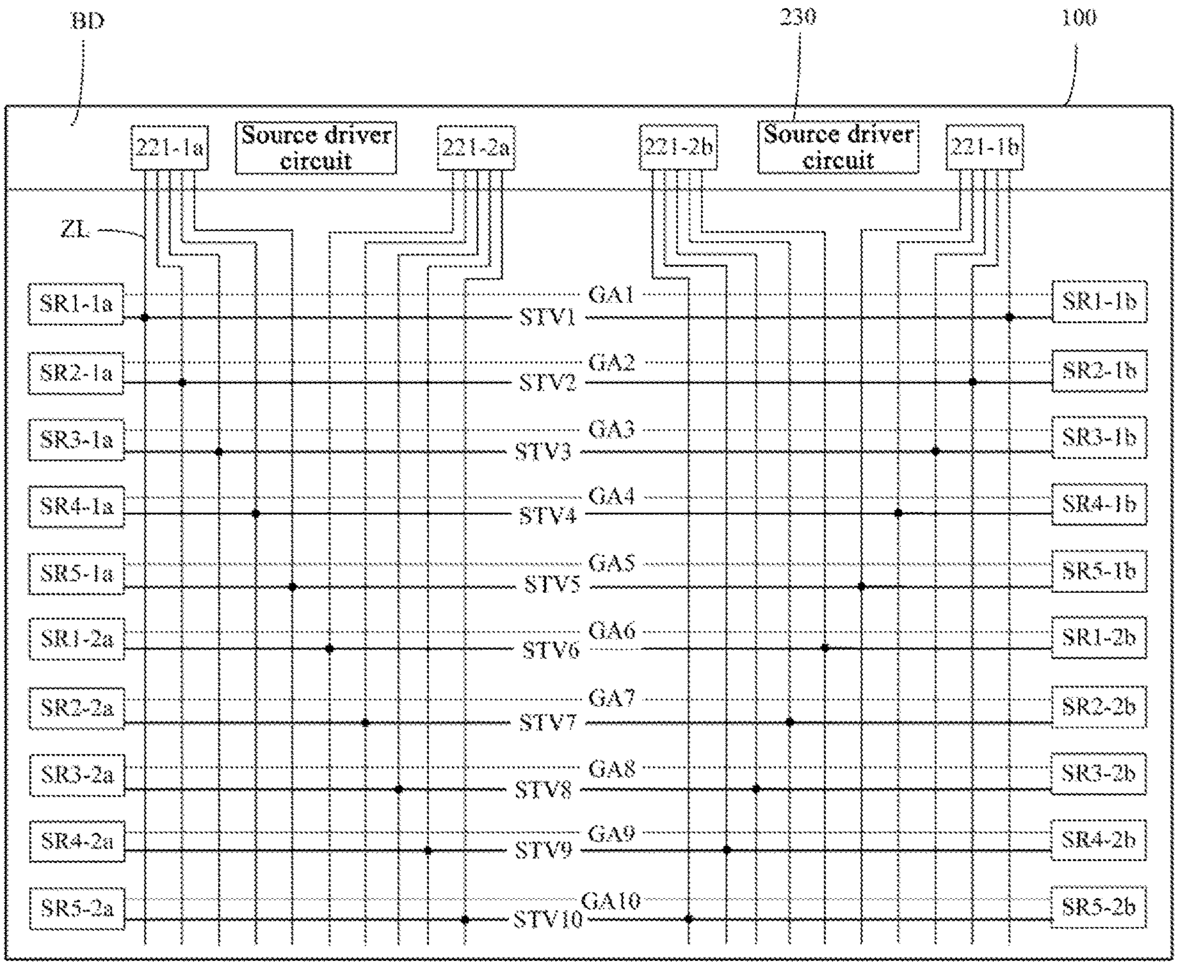
FIG. 18 is a schematic diagram illustrating other structures of a display apparatus provided by an embodiment of the present disclosure.

In some embodiments of the present disclosure, as shown in FIG. 18, the display panel has a bonding area BD, where the bonding area BD includes a fanout area coupled to the data signal lines; and all of the frame start signal control circuits (e.g., 221-1*a*, 221-2*a*, 221-1*b*, 221-2*b*) in the second control circuits are provided in the bonding area BD. In addition, all the source driver circuits 230 are also provided in the bonding area BD. Alternatively, the frame start signal control circuits (e.g., 221-1*a*, 221-2*a*, 221-1*b*, 221-2*b*) and the source driver circuit 230 are all provided in the bonding area BD of the display panel. Alternatively, the frame start signal control circuits (e.g., 221-1*a*, 221-2*a*, 221-1*b*, 221-2*b*) and the source driver circuit 230 are all bonded on a flexible circuit board, which is then bonded to the bonding area BD of the display panel. Alternatively, the frame start signal control circuits (e.g., 221-1*a*, 221-2*a*, 221-1*b*, 221-2*b*) or the source driver circuit 230 are arranged at the bonding area BD of the display panel, and the other ones of the frame start signal control circuits (e.g., 221-1*a*, 221-2*a*, 221-1*b*, 221-2*b*) or the source driver circuit 230 are bonded on the flexible circuit board, which is then bonded to the bonding area BD of the display panel.

With continued reference to FIG. 18, optionally, pads electrically intended to be connected to the flexible circuit board or the PCB board are provided in the bonding area, and optionally, the pads corresponding to the source driver circuits and the pads corresponding to the frame start signal control circuits may be arranged in two rows, respectively, where each row is arranged along an extending direction of gate lines. The term "corresponding" means that the pads may be electrically connected thereto.

Figure 19:
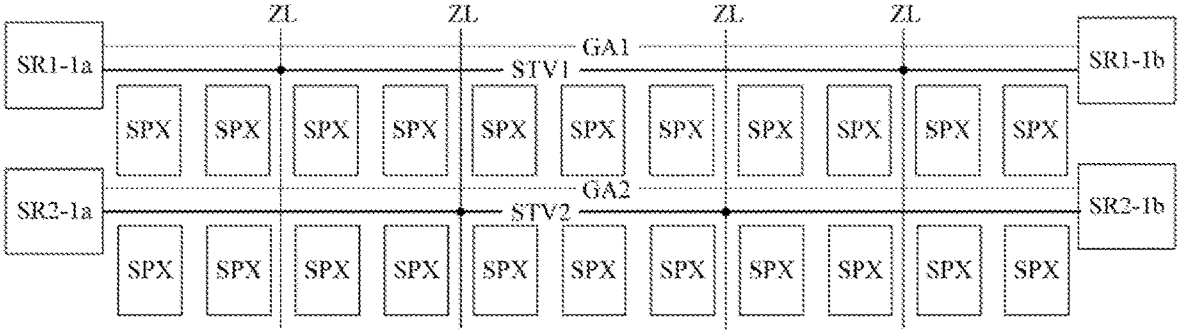
FIG. 19 is a schematic diagram illustrating other structures of a display apparatus provided by an embodiment of the present disclosure.

In some embodiments of the present disclosure, as shown in FIGS. 18 and 19, the display panel may further include: a plurality of first frame start signal lines STV1 to STV10 and a plurality of first transfer signal lines ZL. The input signal terminal of the first shift register unit is coupled to one of the first frame start signal lines, and this first frame start signal line is then coupled to one of the first transfer signal lines ZL. In a same second control circuit, the frame start signal control circuit is coupled to the first transfer signal lines ZL of the corresponding first shift register units.

Illustratively, the input signal terminals of the first shift register units coupled to the same scan signal line are coupled to the same first frame start signal line. For example, the first shift register unit SR1-1*a* and the first shift register unit SR1-1*b* are both coupled to the first frame start signal line STV1, the first shift register unit SR2-1*a* and the first shift register unit SR2-1*b* are both coupled to the first frame start signal line STV2 . . . , and the first shift register unit SR5-2*a* and the first shift register unit SR5-2*b* are both coupled to the first frame start signal line STV10.

In addition, the first frame start signal line STV1 is coupled to the frame start signal control circuit 221-1*a* through a first transfer signal line ZL, and the first frame start signal line STV1 is also coupled to the frame start signal control circuit 221-1*b* through a first transfer signal line ZL. The first frame start signal line STV2 is coupled to the frame start signal control circuit 221-1*a* through a first transfer signal line ZL, and the first frame start signal line STV2 is also coupled to the frame start signal control circuit 221-1*b* through a first transfer signal line ZL. See FIG. 18, the rest are similar and may be analogized. The first frame start signal line STV9 is coupled to the frame start signal control circuit 221-2*a* through a first transfer signal line ZL, and the first frame start signal line STV9 is also coupled to the frame start signal control circuit 221-2*b* through a first transfer signal line ZL. The first frame start signal line STV10 is coupled to the frame start signal control circuit 221-2*a* through a first transfer signal line ZL, and the first frame start signal line STV10 is also coupled to the frame start signal control circuit 221-2*b* through a first transfer signal line ZL.

In some embodiments of the present disclosure, the first frame start signal lines may be arranged in a same layer and/or made of a same material as the scan signal lines. Thus, the first frame start signal lines and the scan signal lines can be formed through a same patterning process, so that the process difficulty can be reduced, and the cost can be reduced.

In some embodiments of the present disclosure, the first transfer signal lines may be arranged in a same layer and/or made of a same material as the data signal lines. Thus, the first transfer signal lines and the data signal lines can be formed through a same patterning process, so that the process difficulty can be reduced, and the cost can be reduced.

In some embodiments of the present disclosure, as shown in FIGS. 18 and 19, the plurality of pixel units may be divided into a plurality of pixel unit row groups, where each pixel unit row group in the pixel unit row groups includes one pixel unit row or at least two adjacent pixel unit rows. Between any two adjacent pixel unit row groups is arranged at least one first frame start signal line. Thus, the first frame start signal line is arranged in the display area of the display panel, so that a width of the bezel can be reduced. In addition, this can also ensure the maximized transmissivity between the gate lines of the display panel.

Illustratively, as shown in FIGS. 18 and 19, the pixel unit row group includes one pixel unit row; and between every two adjacent pixel unit row groups is arranged one first frame start signal line. Alternatively, the pixel unit row group may include a plurality of pixel unit rows, and between any two adjacent pixel unit row groups may be provided a plurality of first frame start signal lines. In practical applications, the arrangement manner of the first frame start signal lines may be determined according to requirements of practical applications, which is not limited by the present disclosure.

In some embodiments of the present disclosure, as shown in FIGS. 18 and 19, the plurality of pixel units may be divided into a plurality of pixel unit column groups, where each of the plurality of pixel unit column groups includes one pixel unit column or at least two adjacent pixel unit columns. Moreover, between any two adjacent pixel unit column groups is arranged at least one first transfer signal line. Thus, the first transfer lines are arranged in the display area of the display panel, so that the width of the bezel can be reduced. In addition, this can also ensure the maximized transmissivity between the gate lines of the display panel.

Illustratively, as shown in FIGS. 18 and 19, the pixel unit column group includes one pixel unit column; and between every two adjacent pixel unit column groups in at least part of area is arranged one first transfer signal line. Alternatively, the pixel unit column group includes a plurality of pixel unit columns, and between any two adjacent pixel unit column groups are provided a plurality of first transfer signal lines. In practical applications, the arrangement manner of the first transfer signal line may be determined according to requirements of practical applications, which is not limited by the present disclosure.

In some embodiments of the present disclosure, the display panel may further include a black matrix, where the black matrix covers the scan signal lines and the first frame start signal lines, in a direction perpendicular to a plane where the display panel is located. This can prevent the scan signal lines and the first frame start signal lines from adversely affecting the display.

In some embodiments of the present disclosure, the black matrix covers the data signal lines and the first transfer signal lines, in the direction perpendicular to the plane where the display panel is located. This can prevent the data signal lines and the first transfer signal lines from adversely affecting the display.

It should be noted that, the embodiment shown in FIG. 18 may have an operation process substantially the same as the operation process of the foregoing embodiment, and the specific operation process thereof may refer to the foregoing description, and are not repeated herein.

Embodiments of the present disclosure provide further implementations of the drive control circuit, which are modified from the implementations in the above embodiments. Only the differences between the present embodiment and the above embodiments will be described below, and the same parts will not be repeated herein.

In some embodiments of the present disclosure, the drive signal output terminal of the first shift register unit may alternatively be coupled to a plurality of scan signal lines. Moreover, the first shift register unit may include a first shift register sub-unit and a second shift register sub-unit, where the second shift register sub-unit is coupled to the plurality of scan signal lines. In addition, the first shift register sub-unit is configured to receive a first target frame start signal corresponding to the coupled target scan signal lines, and provide a signal at a first cascade clock signal terminal CLK to a cascade signal output terminal according to the received first target frame start signal, to output a cascade drive signal through the cascade signal output terminal. Moreover, the second shift register sub-unit is configured to receive the cascade drive signal output by a coupled cascade signal output terminal, and provide a signal input to a clock control signal terminal CK to a coupled target scan signal line in response to the cascade drive signal, to output a scan drive signal to the target scan signal line.

Figure 20:
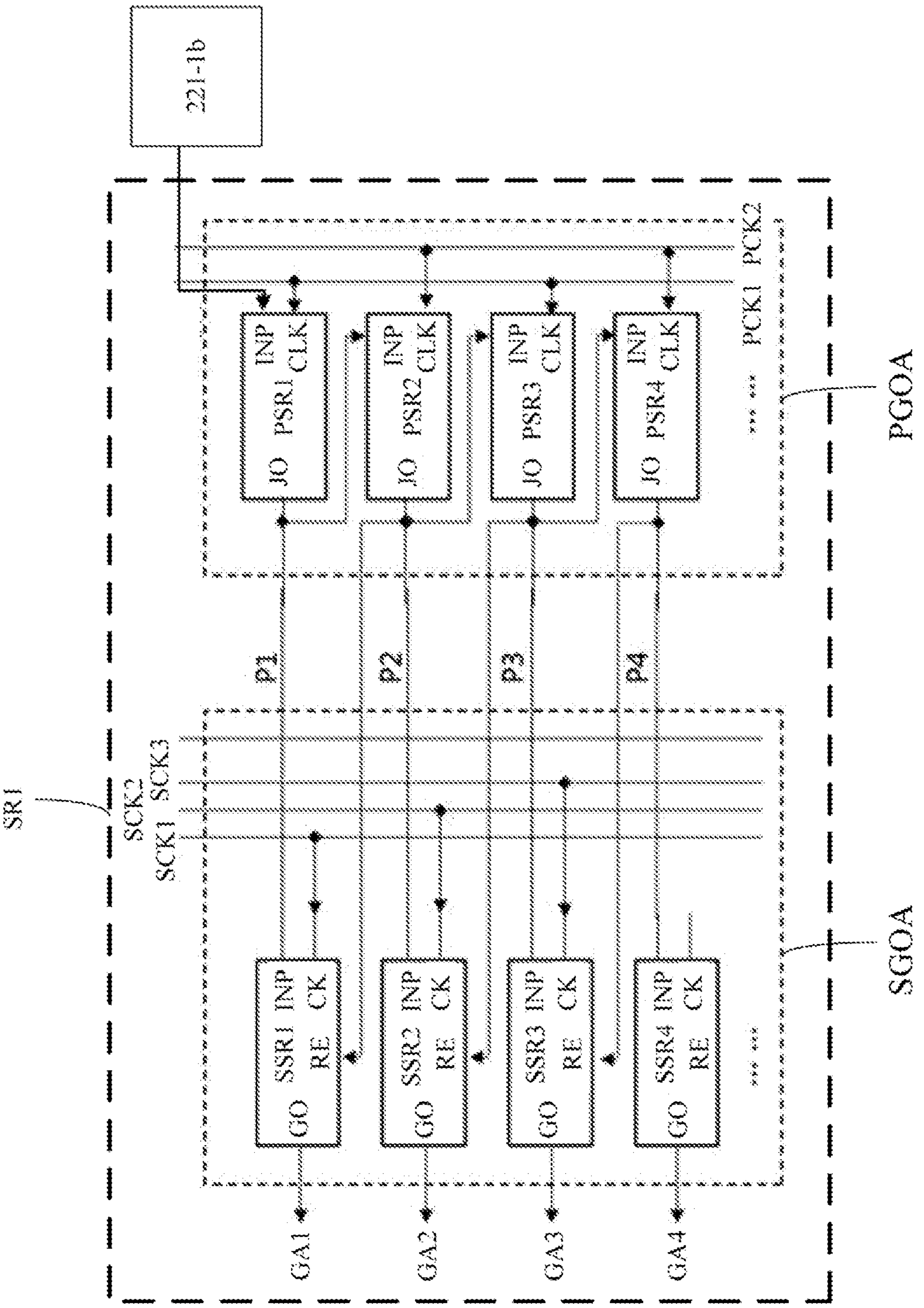
FIG. 20 is a schematic diagram illustrating other structures of a display apparatus provided by an embodiment of the present disclosure.

Illustratively, as shown in FIG. 20, taking the second second control circuit 220-1*b* as an example, the first shift register unit SR1 includes a first shift register sub-unit PGOA and a second shift register sub-unit SGOA. The first shift register sub-unit PGOA is coupled to the frame start signal control circuit 221-1*b*, receives a first target frame start signal output by the frame start signal control circuit 221-1*b*, and provides a signal at a first cascade clock signal terminal CLK to a cascade signal output terminal according to the received first target frame start signal, to output the cascade drive signal corresponding to a target scan signal line through the cascade signal output terminal. The drive signal output terminals GO of the second shift register sub-unit SGOA are coupled to the plurality of scan signal lines, respectively, and the second shift register sub-unit SGOA receives the cascade drive signal output by a coupled cascade signal output terminal, and provides a signal input to a clock control signal terminal CK to a coupled target scan signal line in response to the cascade drive signal, to output the scan drive signal to the target scan signal line.

In some embodiments of the present disclosure, the first shift register sub-unit PGOA may include a plurality of first shift registers (e.g., PSR1 to PSR4), where the plurality of first shift registers (e.g., PSR1 to PSR4) are cascaded together. In addition, the second shift register sub-unit SGOA may include a plurality of second shift registers (e.g., SSR1 to SSR4), where the plurality of first shift registers (e.g., PSR1 to PSR4) are arranged in one-to-one correspondence with the plurality of second shift registers (e.g., SSR1 to SSR4); and the cascade signal output terminal of the first shift register is coupled to the input signal terminal INP of a corresponding second shift register. Moreover, the plurality of first shift registers are configured to receive a first target frame start signal corresponding to the coupled target scan signal lines through an input signal terminal INP, and sequentially operate according to the received first target frame start signal, so that each first shift register provides a signal at a first cascade clock signal terminal CLK to the cascade signal output terminal, to output a cascade drive signal through the cascade signal output terminal. Moreover, the second shift register is configured to receive the cascade drive signal output by the coupled cascade signal output terminal, and provide a signal input to a clock control signal terminal CK to a coupled target scan signal line in response to the cascade drive signal, to output a scan drive signal to the target scan signal line.

Illustratively, as shown in FIG. 20, the first shift register sub-unit PGOA may include first shift registers PSR1 to PSR4. The first shift registers PSR1 to PSR4 are cascaded together. For example, the input signal terminal INP of the first shift register PSR1 is coupled to the frame start signal control circuit 221-1*b* for receiving the first target frame start signal, the input signal terminal INP of the first shift register PSR2 is coupled to the cascade signal output terminal of the first shift register PSR1, the input signal terminal INP of the first shift register PSR3 is coupled to the cascade signal output terminal of the first shift register PSR2, and the input signal terminal INP of the first shift register PSR4 is coupled to the cascade signal output terminal of the first shift register PSR3. The rest are similar and may be analogized, and the details thereof are not repeated herein. It should be noted that FIG. 20 illustrates one cascade relationship, and the specific cascade relationship is not limited. For example, the input signal terminal INP of the third first shift register PSR3 may be coupled to the cascade signal output terminal of the first shift register PSR1, or the cascade signal output terminal of the shift registers at another stage.

Illustratively, as shown in FIG. 20, the second shift register sub-unit SGOA may include second shift registers SSR1, SSR2, SSR3, SSR4, and the like. The input signal terminal INP of the second shift register SSR1 is coupled to the cascade signal output terminal of the first shift register PSR1, and the drive signal output terminal GO of the second shift register SSR1 is coupled to the gate line GA1. The input signal terminal INP of the second shift register SSR2 is coupled to the cascade signal output terminal of the first shift register PSR2, and the drive signal output terminal GO of the second shift register SSR2 is coupled to the gate line GA2. The rest are similar and may be analogized, and the details thereof are not repeated herein.

The cascade signal output terminal of the first shift register PSR2 is coupled to a reset signal terminal RE of the second shift register SSR1, the cascade signal output terminal of the first shift register PSR3 is coupled to a reset signal terminal RE of the second shift register SSR2, and the rest are similar and may be analogized, and the details thereof are not repeated herein. It should be noted that FIG. 20 illustrates one cascade reset relationship, and the specific cascade reset relationship is not limited. For example, the cascade signal output terminal of the first shift register PSR3 may be coupled to the reset signal terminal RE of the second shift register SSR3, or the reset signal terminal RE of another second shift register, which is not limited herein.

Illustratively, as shown in FIG. 20, the first clock control signal lines may include a plurality of first clock control signal sub-lines (e.g., PCK1 and PCK2). The first shift register sub-unit PGOA may be coupled to the plurality of first clock control signal sub-lines, and the first cascade clock signal terminals CLK of odd-numbered first shift registers of the first shift register sub-unit PGOA are coupled to a same first clock control signal sub-line PCK1, and the first cascade clock signal terminals CLK of even-numbered first shift registers of the first shift register sub-unit PGOA are coupled to a same first clock control signal sub-line PCK2. For example, as shown in FIG. 20, the first cascade clock signal terminals CLK of the first shift register PSR1 and the first shift register PSR3 are coupled to the first clock control signal sub-line PCK1, and the first cascade clock signal terminals CLK of the first shift register PSR2 and the first shift register PSR4 are coupled to the first clock control signal sub-line PCK2.

Illustratively, as shown in FIG. 20, the first clock control signal lines may include a plurality of second clock control signal sub-lines (e.g., SCK1 to SCK3, and the like). The second shift register sub-unit SGOA is coupled to the plurality of second clock control signal sub-lines, and the second shift registers in the second shift register sub-unit SGOA are coupled to the second clock control signal sub-lines in one-to-one correspondence, so that each second shift register is coupled to one second clock control signal sub-line. Illustratively, as shown in FIG. 20, the clock control signal terminal CK of the second shift register SSR1 is coupled to a second clock control signal sub-line SCK1, the clock control signal terminal CK of the second shift register SSR2 is coupled to a second clock control signal sub-line SCK2, the clock control signal terminal CK of the second shift register SSR3 is coupled to a second clock control signal sub-line SCK3, and the clock control signal terminal CK of the second shift register SSR4 is coupled to a second clock control signal sub-line.

Next, an operation process of the drive control circuit 200 provided by the embodiment of the present disclosure is described with reference to FIGS. 13, 14*a*, and 20, taking first to tenth display frames as an example.

The first control circuit 210 may acquire image data of the first to tenth display frames, and compare the image data of the first to tenth display frames to determine whether black picture data in a same first image area exists in the first to tenth display frames. When it is determined that the black picture data in the first first image area TX1-1 and the second first image area TX1-2 exists in the first to tenth display frames, during each of the first to tenth display frames, the scan signal lines coupled to the pixel units in the second image area TX2 are determined as target scan signal lines. Moreover, a first selection command signal CX2 is output during each of the first to tenth display frames.

During the first display frame, as shown in FIG. 14*a*, the first control circuit 210 outputs a first selection command signal CX2, and the first selection command signal CX2 includes address information of 000, 001, 010, and 011, and may include data selected information of 0010 to 0111.

In addition, the first control circuit 210 further outputs a first image enable signal to the source driver circuit, and controls the first zero gray scale output buffer and the second zero gray scale output buffer not to operate, and controls the non-zero gray scale output buffers to operate. The source driver circuit controls each control switch to turn it conductive between the first input terminal and the output terminal of the control switch, thereby may perform a series of processing on the image data in the second image area TX2 according to the received image data in the second image area TX2, and then input the processed image data into the coupled non-zero gray scale output buffers, to apply the corresponding data voltages to the data signal lines in the second image area TX2 through the non-zero gray scale output buffers.

The frame start signal control circuit 221-1*b* of the second second control circuit 220-1*b* may determine, according to the address information: 010 and the data selected information: 0010 to 0111 in the first selection command signal CX2, the third to fifth scan signal lines GA3 to GA5 from among the correspondingly coupled scan signal lines, as target scan signal lines, and generate a first target frame start signal stv3*b* to be input to the input signal terminal INP of the first shift register PSR1. Moreover, the generated first target frame start signal stv3*b* is input to the input signal terminal INP of the first shift register PSR1. The first control circuit 210 further inputs the corresponding reference clock control signals cks1 to cks12 to the level shift circuit 240, and the level shift circuit 240 generates clock signals respectively input to the first clock control signal sub-line PCK1 and the first clock control signal sub-line PCK2, and generates clock signals respectively input to the second clock control signal sub-line SCK3 to the second clock control signal sub-line SCK5, according to the received reference clock control signal corresponding to the first shift register PSR1 and the first reference voltage VREF1 and the second reference voltage VREF2. Thus, the cascade signal output terminals of the first shift registers PSR1 to PSR4 may output cascade signals P1 to P4, respectively. The cascade signal P1 is input into the input signal terminal INP of the second shift register SSR1, but no clock signal is input to the second clock control signal sub-line SCK1 coupled to the second shift register SSR1, so that the drive signal output terminal GO of the second shift register SSR1 does not output a signal. Similarly, the cascade signal P2 is input to the input signal terminal INP of the second shift register SSR2, but no clock signal is input to the second clock control signal sub-line SCK2 coupled to the second shift register SSR2, so that the drive signal output terminal GO of the second shift register SSR2 does not output a signal. However, the cascade signal P3 is input to the input signal terminal INP of the second shift register SSR3, and a corresponding clock signal is input to the second clock control signal sub-line SCK3 coupled to the second shift register SSR3, so that the drive signal output terminal GO of the second shift register SSR3 outputs a scan drive signal gb3. Similarly, the cascade signal P4 is input into the input signal terminal INP of the second shift register SSR4, and a corresponding clock signal is input to the second clock control signal sub-line SCK4 coupled to the second shift register SSR4, so that the drive signal output terminal GO of the second shift register SSR4 outputs a scan drive signal gb4. The cascade signal P5 is input to the input signal terminal INP of the second shift register SSR5, and a corresponding clock signal is input to the second clock control signal sub-line SCK5 coupled to the second shift register SSR5, so that the drive signal output terminal GO of the second shift register SSR5 outputs a scan drive signal gb5.

It should be noted that, operation processes of the remaining second control circuits may be analogized in sequence, and are not repeated herein.

Embodiments of the present disclosure provide further implementations of the drive control circuit, which are modified from the implementations in the above embodiments. Only the differences between the present embodiment and the above embodiments will be described below, and the same parts will not be repeated herein.

Figure 21:
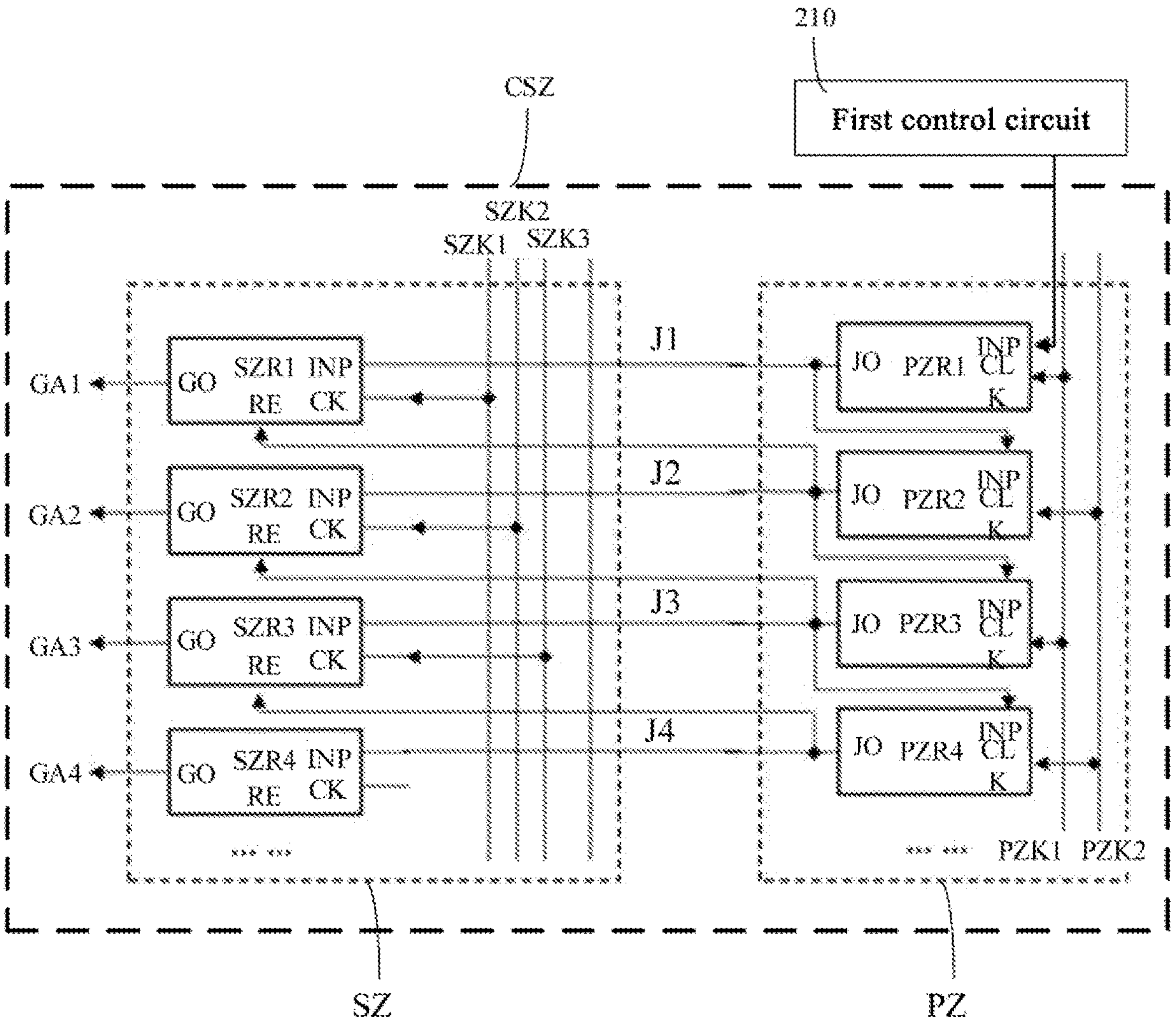
FIG. 21 is a schematic diagram illustrating other structures of a display apparatus provided by an embodiment of the present disclosure.

In some embodiments of the present disclosure, as shown in FIG. 21, the drive control circuit 200 may alternatively include a gate scan circuit CSZ. The gate scan circuit CSZ is coupled to a plurality of scan signal lines. Moreover, the gate scan circuit CSZ may include a first gate scan sub-circuit PZ and a second gate scan sub-circuit SZ, where the second gate scan sub-circuit SZ is coupled to the plurality of scan signal lines. Moreover, the first gate scan sub-circuit PZ is configured to receive a corresponding first target frame start signal output by the first control circuit 210, and provide a signal at a second cascade clock signal terminal to a cascade signal output terminal according to the received first target frame start signal, to output a cascade drive signal through the cascade signal output terminal. Moreover, the second gate scan sub-circuit SZ is configured to receive the cascade drive signal output by a coupled cascade signal output terminal, and provide a signal input to a clock control signal terminal CK to a coupled target scan signal line in response to the cascade drive signal, to output the scan drive signal to the target scan signal line.

Illustratively, as shown in FIG. 21, the gate scan circuit CSZ is coupled to the first control circuit 210, receives a first target frame start signal output by the first control circuit 210, and provides a signal at a second cascade clock signal terminal to a cascade signal output terminal according to the received first target frame start signal, to output the cascade drive signal corresponding to a target scan signal line through the cascade signal output terminal. The drive signal output terminals GO of the second gate scan sub-circuit are coupled to the plurality of scan signal lines, respectively, and the second gate scan sub-circuit receives the cascade drive signal output by a coupled cascade signal output terminal, and provides a signal input to a clock control signal terminal CK to a coupled target scan signal lines in response to the cascade drive signal, to output a scan drive signal to the target scan signal line.

In some embodiments of the present disclosure, the first gate scan sub-circuit PZ may include a plurality of third shift registers (e.g., PZR1 to PZR4), where the plurality of third shift registers (e.g., PZR1 to PZR4) are cascaded together. Moreover, the second gate scan sub-circuit SZ may include a plurality of fourth shift registers (e.g., SZR1 to SZR4), where the plurality of third shift registers (e.g. PZR1 to PZR4) are arranged in one-to-one correspondence with the plurality of fourth shift registers (e.g. SZR1 to SZR4); and the cascade signal output terminal of the third shift register is coupled to the input signal terminal INP of a corresponding fourth shift register. Moreover, the plurality of third shift registers are configured to receive a first target frame start signal corresponding to the coupled target scan signal lines through an input signal terminal INP, and sequentially operate according to the received first target frame start signal, so that each third shift register provides a signal at a second cascade clock signal terminal to the cascade signal output terminal, to output a cascade drive signal through the cascade signal output terminal. Moreover, the fourth shift register is configured to receive the cascade drive signal output by the coupled cascade signal output terminal, and provide a signal input to a clock control signal terminal CK to a coupled target scan signal line in response to the cascade drive signal, to output a scan drive signal to the target scan signal line.

Illustratively, as shown in FIG. 21, the first gate scan sub-circuit PZ may include third shift registers PZR1 to PZR4. The third shift registers PZR1 to PZR4 are cascaded together. For example, the input signal terminal INP of the third shift register PZR1 is coupled to the first control circuit 210 for receiving the first target frame start signal, the input signal terminal INP of the third shift register PZR2 is coupled to the cascade signal output terminal of the third shift register PZR1, the input signal terminal INP of the third shift register PZR3 is coupled to the cascade signal output terminal of the third shift register PZR2, and the input signal terminal INP of the third shift register PZR4 is coupled to the cascade signal output terminal of the third shift register PZR3. The rest are similar and may be analogized, and the details thereof are not repeated herein.

Illustratively, as shown in FIG. 21, the second gate scan sub-circuit SZ may include fourth shift registers SZR1 to SZR4, and the like. The input signal terminal INP of the fourth shift register SZR1 is coupled to the cascade signal output terminal of the third shift register PZR1, and the drive signal output terminal GO of the fourth shift register SZR1 is coupled to the gate line GA1. The input signal terminal INP of the fourth shift register SZR2 is coupled to the cascade signal output terminal of the third shift register PZR2, and the drive signal output terminal GO of the fourth shift register SZR2 is coupled to the gate line GA2. The input signal terminal INP of the fourth shift register SZR3 is coupled to the cascade signal output terminal of the third shift register PZR3, and the drive signal output terminal GO of the fourth shift register SZR3 is coupled to the gate line GA3. The input signal terminal INP of the fourth shift register SZR4 is coupled to the cascade signal output terminal of the third shift register PZR4, and the drive signal output terminal GO of the fourth shift register SZR4 is coupled to the gate line GA4. The rest are similar and may be analogized, and the details thereof are not repeated herein.

Illustratively, as shown in FIG. 21, the display panel further includes a plurality of second clock control signal lines. The second clock control signal lines may include a plurality of third clock control signal sub-lines. The first gate scan sub-circuit may be coupled to the plurality of third clock control signal sub-lines, and the second cascade clock signal terminals of odd-numbered third shift registers in the first gate scan sub-circuit are coupled to a same third clock control signal sub-line PZK1, and the second cascade clock signal terminals of even-numbered first shift registers in the first gate scan sub-circuit are coupled to a same third clock control signal sub-line PZK2. For example, as shown in FIG. 21, the second cascade clock signal terminals of the third shift register PZR1 and the third shift register PZR3 are coupled to the third clock control signal sub-line PZK1, and the second cascade clock signal terminals of the third shift register PZR2 and the third shift register PZR4 are coupled to the third clock control signal sub-line PZK2.

Illustratively, as shown in FIG. 21, the second clock control signal line may include a plurality of fourth clock control signal sub-lines. The second gate scan sub-circuit is coupled to the plurality of fourth clock control signal sub-lines, and fourth shift registers in the second gate scan sub-circuit are coupled to the fourth clock control signal sub-lines in one-to-one correspondence, so that each fourth shift register is coupled to one fourth clock control signal sub-line. Illustratively, as shown in FIG. 21, the clock control signal terminal CK of the fourth shift register SZR1 is coupled to a fourth clock control signal sub-line SZK1, the clock control signal terminal CK of the fourth shift register SZR2 is coupled to a fourth clock control signal sub-line SZK2, the clock control signal terminal CK of the fourth shift register SZR3 is coupled to a fourth clock control signal sub-line SZK3, and the clock control signal terminal CK of the fourth shift register SZR4 is coupled to a fourth clock control signal sub-line.

With continued reference to FIG. 20, it should be noted that, when the driver circuit in the embodiment of the present disclosure is used in a display panel, an initial trigger signal STV' may be input to only an input signal terminal INP of a first shift register PSR1 in a first row. That is, transfer of the cascade signals of the entire display panel is triggered by the initial trigger signal STV' input to the input signal terminal INP of the first shift register PSR1 in the first row. Alternatively, the display panel includes dual trigger signals, for example, the first and second rows correspond to different initial trigger signals STV', respectively. That is, transfer of the cascade signals of the entire display panel is triggered by the initial trigger signals input to the first and second rows. The initial trigger signal STV' is input to the input signal terminal INP of the first shift register PSR1, the first shift register sub-unit PGOA serves to output the cascade signals, and the first clock control signal sub-lines (e.g., PCK1 and PCK2) control the first shift register sub-unit PGOA to output the cascade signals line by line. Whether any row in the display panel is turned-on or not is realized by adjusting clock signals (e.g., SCK1, SCK2, SCK3, etc.) provided by the plurality of second clock control signal sub-lines. If a certain row is required to be turned-on, the second clock control signal sub-line correspondingly connected to this certain row is given an active level at the corresponding time, so that the scan line at this certain row is turned-on; if a certain row is required to be turned-off, the second clock control signal sub-line correspondingly connected to this certain row is given an inactive level at the corresponding time, so that the scan line at this certain row is turned-off. That is, any row is turned-on by adjusting the clock signals provided by the plurality of second clock control signal sub-lines (e.g. SCK1 to SCK3, and the like), while the cascade signals of the display panel are still output in cascade line by line, according to the full-scan mode of the display panel (scan from a first row of the display panel to a last row of the display panel).

Next, an operation process of the drive control circuit provided by the embodiment of the present disclosure is described with reference to FIGS. 13, 14*a*, and 21, taking first to tenth display frames as an example.

The first control circuit 210 may acquire image data of the first to tenth display frames, and compare the image data of the first to tenth display frames to determine whether black picture data in a same first image area exists in the first to tenth display frames. When it is determined that the black picture data in the first first image area TX1-1 and the second first image area TX1-2 exists in the first to tenth display frames, during each of the first to tenth display frames, the scan signal lines coupled to the pixel units in the second image area TX2 are determined as target scan signal lines. Moreover, a first selection command signal CX2 is output during each of the first to tenth display frames.

During the first display frame, as shown in FIG. 14*a*, the first control circuit 210 outputs a first target frame start signal to the input signal terminal INP of the third shift register PZR1. The first control circuit 210 further outputs a first image enable signal to the source driver circuit, and controls the first zero gray scale output buffer and the second zero gray scale output buffer not to operate, and controls the non-zero gray scale output buffers to operate. The source driver circuit controls each control switch to turn it conductive between the first input terminal and the output terminal of the control switch, thereby may perform a series of processing on the image data in the second image area TX2 according to the received image data in the second image area TX2, and then input the processed image data into the coupled non-zero gray scale output buffers, to apply the corresponding data voltages to the data signal lines in the second image area TX2 through the non-zero gray scale output buffers.

The first control circuit 210 further inputs corresponding reference clock control signals to the level shift circuit 240, and the level shift circuit 240 generates clock signals respectively input to the third clock control signal sub-line PZK1 and the third clock control signal sub-line PZK2, and generates clock signals respectively input to the fourth clock control signal sub-line SZK3 to the second clock control signal sub-line SZK8, according to the received reference clock control signal corresponding to the third shift register, and the first reference voltage VREF1 and the second reference voltage VREF2. Thus, the cascade signal output terminals of the third shift registers PZR1 to PZR8 may output cascade signals J1 to J8, respectively. The cascade signal J1 is input to the input signal terminal INP of the fourth shift register SZR1, but no clock signal is input to the fourth clock control signal sub-line SZK1 coupled to the fourth shift register SZR1, so that the drive signal output terminal GO of the fourth shift register SZR1 does not output a signal. Similarly, the cascade signal J2 is input to the input signal terminal INP of the fourth shift register SZR2, but no clock signal is input to the third clock control signal sub-line SZK2 coupled to the fourth shift register SZR2, so that the drive signal output terminal GO of the fourth shift register SZR2 does not output a signal. However, the cascade signal J3 is input to the input signal terminal INP of the fourth shift register SZR3, and a corresponding clock signal is input to the fourth clock control signal sub-line SZK3 coupled to the fourth shift register SZR3, so that the drive signal output terminal GO of the fourth shift register SZR3 outputs a scan drive signal ga3. Similarly, the cascade signal J4 is input to the input signal terminal INP of the fourth shift register SZR4, and a corresponding clock signal is input to the fourth clock control signal sub-line SZK4 coupled to the fourth shift register SZR4, so that the drive signal output terminal GO of the fourth shift register SZR4 outputs a scan drive signal ga4.

It should be noted that, through adjusting, by the first control circuit 210, the first target frame start signal input to the first gate scan sub-circuit as described above, the scan signal lines in different areas can be individually driven.

Embodiments of the present disclosure provide further implementations of the drive control circuit 200, which are modified from the implementations in the above embodiments. Only the differences between the present embodiment and the above embodiments will be described below, and the same parts will not be repeated herein.

In some embodiments of the present disclosure, the second control circuit may alternatively include a scan control output circuit, where the scan control output circuit is coupled to scan signal lines in a corresponding scan signal line group. Moreover, the scan control output circuit is configured to receive a first selection command signal, determine, according to data selected information in the first selection command signal corresponding to address information of the scan control output circuit, target scan signal lines from among the corresponding scan signal line group, generate scan drive signals corresponding to the target scan signal lines according to the determined target scan signal lines, and provide the generated scan drive signals to the coupled target scan signal lines, to output the scan drive signals to the target scan signal lines.

In some embodiments of the present disclosure, the scan control output circuit includes a second decoder 2221, a second frame start signal generator 2222 and a second level shifter 2223. The second decoder 2221 is configured to receive the first selection command signal, determine, according to data selected information in the first selection command signal corresponding to address information of the second decoder 2221 (i.e., the scan control output circuit), target scan signal lines from among the corresponding scan signal line group, and generate scan generating signals corresponding to the target scan signal lines according to the determined target scan signal lines. Moreover, the second frame start signal generator 2222 is configured to receive the scan generating signals corresponding to the target scan signal lines, and generate initial scan signals corresponding to the target scan signal lines according to the received scan generating signals. Moreover, the second level shifter 2223 is configured to receive the initial scan signals corresponding to the target scan signal lines, perform voltage shift processing on the received initial scan signals, generate scan drive signals corresponding to the target scan signal lines, and input the generated scan drive signals corresponding to the target scan signal lines to the coupled target scan signal lines.

Figure 22:
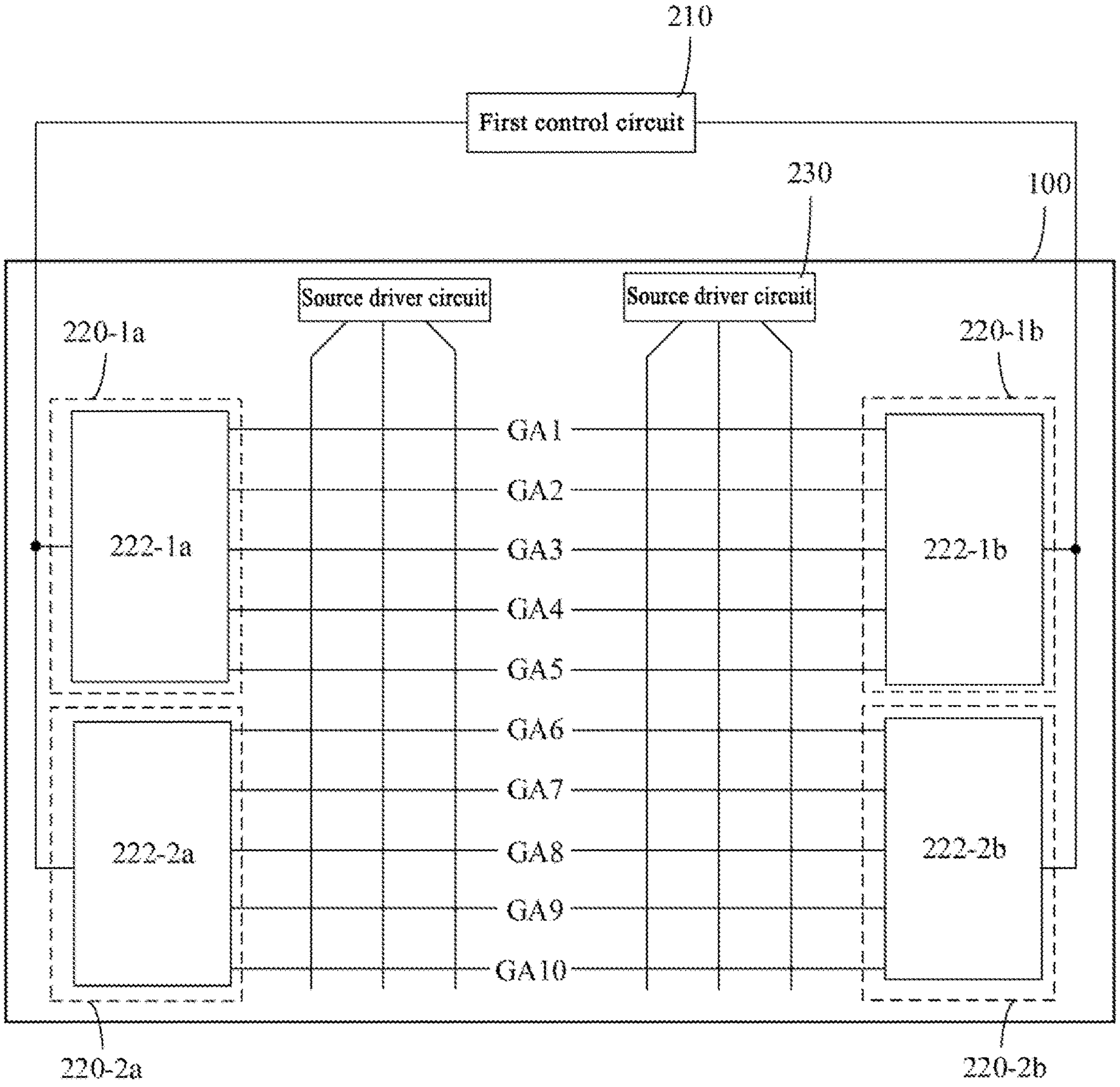
FIG. 22 is a schematic diagram illustrating other structures of a display apparatus provided by an embodiment of the present disclosure.

Illustratively, as shown in FIG. 22, taking it as an example that four second control circuits are provided, the four second control circuits are a first second control circuit 220-1*a*, a second second control circuit 220-1*b*, a third second control circuit 220-2*a*, and a fourth second control circuit 220-2*b*, respectively. The first second control circuit 220-1*a* includes a scan control output circuit 222-1*a*, the second second control circuit 220-1*b* includes a scan control output circuit 222-1*b*, the third second control circuit 220-2*a* includes a scan control output circuit 222-2*a*, and the fourth second control circuit 220-2*b* includes a scan control output circuit 222-2*b*. The scan control output circuit 222-1*a* is coupled to the first scan line GA1 to the fifth scan line GA5, the scan control output circuit 222-1*b* is coupled to the first scan line GA1 to the fifth scan line GA5, the scan control output circuit 222-2*a* is coupled to the sixth scan line GA6 to the tenth scan line GA10, and the scan control output circuit 222-2*b* is coupled to the sixth scan line GA6 to the tenth scan line GA10.

Figure 23:
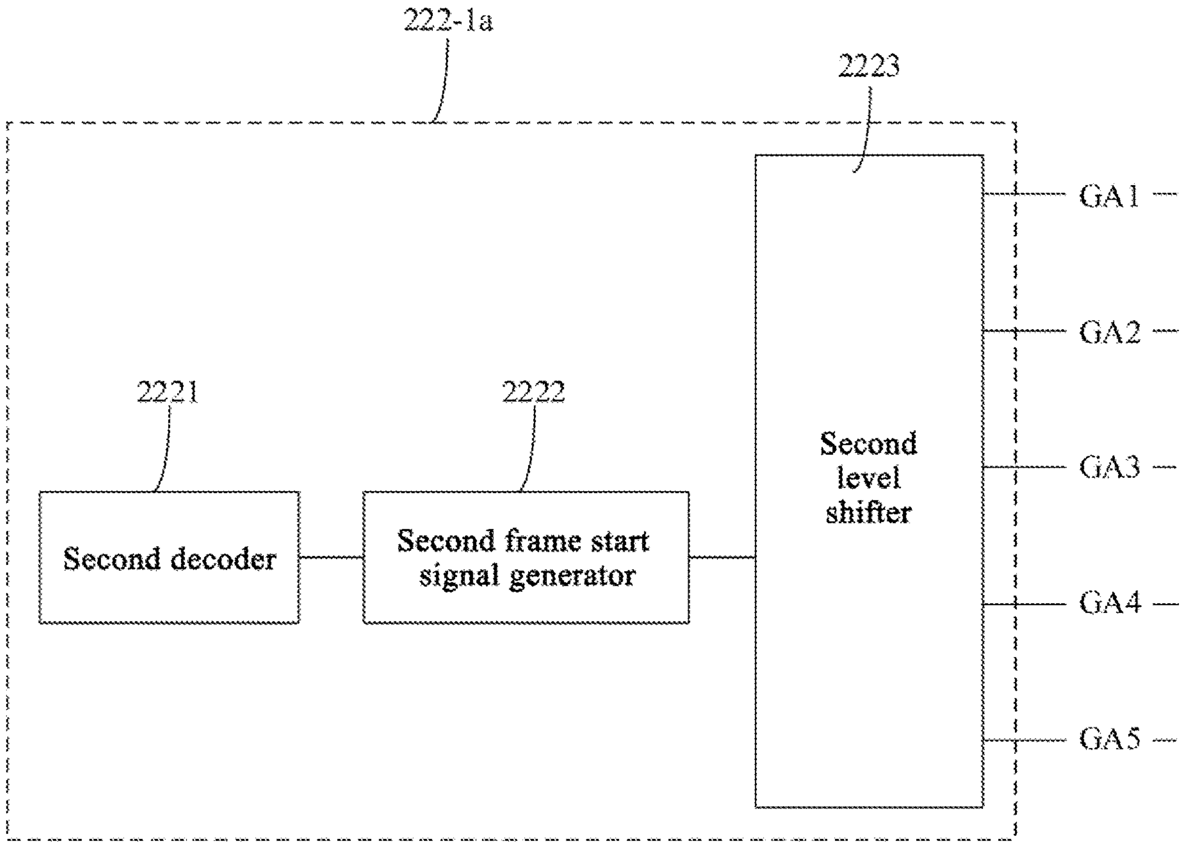
FIG. 23 is a schematic diagram illustrating other structures of a display apparatus provided by an embodiment of the present disclosure.

Taking the scan control output circuit 222-1*a* as an example, illustratively, as shown in FIG. 23, the second decoder 2221 is configured to receive the first selection command signal, determine, according to the data selected information in the first selection command signal corresponding to the address information of the second decoder 2221, target scan signal lines from among the corresponding scan signal line group, and generate scan generating signals corresponding to the target scan signal lines according to the determined target scan signal line. The second frame start signal generator 2222 is configured to receive the scan generating signals corresponding to the target scan signal lines, and generate initial scan signals corresponding to the target scan signal lines according to the received scan generating signal. The second level shifter 2223 is configured to receive the initial scan signals corresponding to target scan signal lines, perform voltage shift processing on the received initial scan signals, generate scan drive signals corresponding to the target scan signal lines, and input the generated scan drive signals corresponding to the target scan signal lines to the coupled target scan signal lines.

Illustratively, taking it as an example that, during a display frame, the first control circuit 210 outputs a first selection command signal CX1, and the first selection command signal CX1 includes address information of 000, 001, 010, and 011, and may include data selected information of 0000 to 0001, and 1000 to 1001, the second decoder 2221 receives the first selection command signal CX1, and may determine, according to the address information: 000 and the data selected information: 0000 to 0001 in the first selection command signal CX1, the first scan signal line GA1 and the second scan signal line GA2 from among the correspondingly coupled scan signal lines, as target scan signal lines, and generate scan generating signals corresponding to the first scan signal line GA1 and the second scan signal line GA2. The second frame start signal generator 2222 receives the scan generating signals corresponding to the first scan line GA1 and the second scan line GA2, and generates the corresponding initial scan signals according to the received scan generating signals corresponding to the first scan line GA1 and the second scan line GA2. Moreover, the generated initial scan signals are sent to the second level shifter 2223, and the second level shifter 2223 performs voltage shift processing on the received initial scan signal corresponding to the first scan signal line GA1 to generate a scan drive signal ga1, and performs voltage shift processing on the received initial scan signal corresponding to the second scan signal line GA2 to generate a scan drive signal ga2. Moreover, the scan drive signal ga1 is input to the first scan signal line GA1, and the scan drive signal ga2 is input to the second scan signal line GA2. It should be noted that, an operation process of the first control circuit 210 when outputting the first selection command signal CX2 may be analogized, and the details thereof are not described herein.

Next, an operation process of the foregoing drive control circuit provided by the embodiment of the present disclosure is described with reference to FIGS. 13, 14*a*, 14*b*, and 22 to 23, taking consecutive first to tenth display frames as an example.

The first control circuit 210 may acquire image data of the first to tenth display frames, and compare the image data of the first to tenth display frames to determine whether set picture data in a same first image area exists in the first to tenth display frames. When it is determined that the black picture data in the first first image area TX1-1 and the second first image area TX1-2 exists in the first to tenth display frames, during each of the first and sixth display frames, the scan signal lines coupled to the pixel units in the first first image area TX1-1 and the second first image area TX1-2 are determined as target scan signal lines, and during each of the second to fifth display frames and the seventh to tenth display frames, the scan signal lines coupled to the pixel units in the second image area TX2 are determined as target scan signal lines. In addition, a first selection command signal CX1 is output during each of the first display frame and the sixth display frame, and a first selection command signal CX2 is output during each of the second to fifth display frames and the seventh to tenth display frames.

During the first display frame, as shown in FIG. 14*b*, the first control circuit 210 outputs a first select command signal CX1, and the first select command signal CX1 includes address information of 000, 001, 010, and 011, and may include data selected information of 0000 to 0001 and 1000 to 1001.

In addition, the first control circuit 210 further outputs a first image disable signal to the source driver circuit, controls the first zero gray scale output buffer and the second zero gray scale output buffer to operate, and controls the non-zero gray scale output buffer not to operate. The data conversion circuit may perform a series of processing on the image data (i.e., 0 gray scale) in the first image area according to the received image data in the first image area, and then input the image data into the coupled first and second zero gray scale output buffers. Each control switch is controlled to turn it conductive between the second input terminal and the output terminal thereof, so that the data voltages corresponding to the negative polarity are applied to the data signal lines in the first image area through the first zero gray scale output buffer. Moreover, each control switch is controlled to turn it conductive between the third input terminal and the output terminal thereof, so that the data voltages corresponding to the positive polarity are applied to the data signal lines in the first image area through the second zero gray scale output buffer.

The second decoder 2221 of the scan control output circuit 222-1*a* in the first second control circuits 220-1*a* may determine, according to the address information: 000 and the data selected information: 0000 to 0001 in the first selection command signal CX1, the first scan signal line GA1 and the second scan signal line GA2 from among the correspondingly coupled scan signal lines, as target scan signal lines, and generate scan generating signals corresponding to the first scan signal line GA1 and the second scan signal line GA2. The second frame start signal generator 2222 generates initial scan signals corresponding to the first scan signal line GA1 and the second scan signal line GA2, according to the scan generating signals corresponding to the first scan signal line GA1 and the second scan signal line GA2. The second level shifter 2223 performs voltage shift processing on the initial scan signals corresponding to the first scan signal line GA1 and the second scan signal line GA2, generates scan drive signals corresponding to the first scan signal line GA1 and the second scan signal line GA2, and inputs the scan drive signals to the corresponding scan signal lines.

In addition, the second decoder 2221 of the scan control output circuit 222-1*b* in the second second control circuit 220-1*b* may determine, according to the address information: 001 and the data selected information: 0000 to 0001 in the first selection command signal CX1, the first scan signal line GA1 and the second scan signal line GA2 from among the correspondingly coupled scan signal lines, as target scan signal lines, and generate scan generating signals corresponding to the first scan signal line GA1 and the second scan signal line GA2. The second frame start signal generator 2222 generates initial scan signals corresponding to the first scan signal line GA1 and the second scan signal line GA2, according to the scan generating signals corresponding to the first scan signal line GA1 and the second scan signal line GA2. The second level shifter 2223 performs voltage shift processing on the initial scan signals corresponding to the first scan signal line GA1 and the second scan signal line GA2, generates scan drive signals corresponding to the first scan signal line GA1 and the second scan signal line GA2, and inputs the scan drive signals to the corresponding scan signal lines.

Thus, when a high level signal appears in each of the scan drive signals input to the first scan signal line GA1 and the second scan signal line GA2, the data voltages with corresponding polarities output from the data signal lines may be input to the pixel electrodes of the sub-pixels, to realize charging the sub-pixels in the first first image area TX1-1.

In addition, the second decoder 2221 of the scan control output circuit 222-2*a* in the third second control circuit 220-2*a* may determine, according to the address information: 010 and the data selected information: 1000 to 1001 in the first selection command signal CX1, the ninth scan signal line GA9 and the tenth scan signal line GA10 from among the correspondingly coupled scan signal lines, as target scan signal lines, and generate scan generating signals corresponding to the ninth scan signal line GA9 and the tenth scan signal line GA10. The second frame start signal generator 2222 generates initial scan signals corresponding to the ninth scan signal line GA9 and the tenth scan signal line GA10, according to the scan generating signals corresponding to the ninth scan signal line GA9 and the tenth scan signal line GA10. The second level shifter 2223 performs voltage shift processing on the initial scan signals corresponding to the ninth scan signal line GA9 and the tenth scan signal line GA10, generates scan drive signals corresponding to the ninth scan signal line GA9 and the tenth scan signal line GA10, and inputs the scan drive signals to the corresponding scan signal lines.

In addition, the second decoder 2221 of the scan control output circuit 222-2*b* in the fourth second control circuit 220-2*b* may determine, according to the address information: 011 and the data selected information: 1000 to 1001 in the first selection command signal CX1, the ninth scan signal line GA9 and the tenth scan signal line GA10 from among the correspondingly coupled scan signal lines, as target scan signal lines, and generate scan generating signals corresponding to the ninth scan signal line GA9 and the tenth scan signal line GA10. The second frame start signal generator 2222 generates initial scan signals corresponding to the ninth scan signal line GA9 and the tenth scan signal line GA10, according to the scan generating signals corresponding to the ninth scan signal line GA9 and the tenth scan signal line GA10. The second level shifter 2223 performs voltage shift processing on the initial scan signals corresponding to the ninth scan signal line GA9 and the tenth scan signal line GA10, generates scan drive signals corresponding to the ninth scan signal line GA9 and the tenth scan signal line GA10, and inputs the scan drive signals to the corresponding scan signal lines.

Thus, when a high level signal appears in each of the scan drive signals input to the ninth scan signal line GA9 and the tenth scan signal line GA10, the data voltages with corresponding polarities output to the data signal lines may be input to the pixel electrodes of the sub-pixels, to realize charging the sub-pixels in the second first image area TX1-2.

During the second display frame, referring to FIG. 14*a*, the first control circuit 210 outputs a first selection command signal CX2, and the first selection command signal CX2 includes address information of 000, 001, 010, and 011, and may include data selected information of 0010 to 0111.

Moreover, the first control circuit 210 further outputs a first image enable signal to the source driver circuit, and controls the first zero gray scale output buffer and the second zero gray scale output buffer not to operate, and controls the non-zero gray scale output buffers to operate. The source driver circuit controls each control switch to turn it conductive between the first input terminal and the output terminal of the control switch, thereby may perform a series of processing on the image data in the second image area TX2 according to the received image data in the second image area TX2, and then input the processed image data into the coupled non-zero gray scale output buffers, to apply the corresponding data voltages to the data signal lines in the second image area TX2 through the non-zero gray scale output buffers.

The second decoder 2221 of the scan control output circuit 222-1*a* in the first second control circuits 220-1*a* may determine, according to the address information: 000 and the data selected information: 0010 to 0111 in the first selection command signal CX2, the third to fifth scan signal lines GA3 to GA5 from among the correspondingly coupled scan signal lines, as target scan signal lines, and generate scan generating signals corresponding to the third to fifth scan signal lines GA3 to GA5. The second frame start signal generator 2222 generates initial scan signals corresponding to the third to fifth scan lines GA3 to GA5 according to the scan generating signals corresponding to the third to fifth scan lines GA3 to GA5. The second level shifter 2223 performs voltage shift processing on the initial scan signals corresponding to the third to fifth scan signal lines GA3 to GA5, generates scan drive signals corresponding to the third to fifth scan signal lines GA3 to GA5, and inputs the scan drive signals to the corresponding scan signal lines.

In addition, the second decoder 2221 of the scan control output circuit 222-1*b* in the second second control circuit 220-1*b* may determine, according to the address information: 001 and the data selected information: 0010 to 0111 in the first selection command signal CX2, the third to fifth scan signal lines GA3 to GA5 from among the correspondingly coupled scan signal lines, as target scan signal lines, and generate scan generating signals corresponding to the third to fifth scan signal lines GA3 to GA5. The second frame start signal generator 2222 generates initial scan signals corresponding to the third to fifth scan lines GA3 to GA5 according to the scan generating signals corresponding to the third to fifth scan lines GA3 to GA5. The second level shifter 2223 performs voltage shift processing on the initial scan signals corresponding to the third to fifth scan signal lines GA3 to GA5, generates scan drive signals corresponding to the third to fifth scan signal lines GA3 to GA5, and inputs the scan drive signals to the corresponding scan signal lines.

In addition, the second decoder 2221 of the scan control output circuit 222-2*a* in the third second control circuit 220-2*a* may determine, according to the address information: 010 and the data selected information: 0010 to 0111 in the first selection command signal CX2, the sixth to eighth scan signal lines GA6 to GA8 from among the correspondingly coupled scan signal lines, as target scan signal lines, and generate scan generating signals corresponding to the sixth to eighth scan signal lines GA6 to GA8. The second frame start signal generator 2222 generates initial scan signals corresponding to the sixth to eighth scan lines GA6 to GA8 according to the scan generating signals corresponding to the sixth to eighth scan lines GA6 to GA8. The second level shifter 2223 performs voltage shift processing on the initial scan signals corresponding to the sixth to eighth scan signal lines GA6 to GA8, generates scan drive signals corresponding to the sixth to eighth scan signal lines GA6 to GA8, and inputs the scan drive signals to the corresponding scan signal lines.

Thus, when a high level signal appears in each of the scan drive signals input to the third to eighth scan signal lines GA3 to GA8, data voltages with corresponding polarities output to the data signal lines may be input to the pixel electrodes of the sub-pixels, to realize charging the sub-pixels in the second image area TX2.

During each of the third to fifth display frames, an operation process thereof may refer to the operation process of the second display frame, which is not repeated herein.

During the sixth display frame, an operation process thereof may refer to the operation process of the first display frame, which is not repeated herein.

During each of the seventh to tenth display frames, an operation process of the display frame may refer to the operation process of the second display frame, which is not repeated herein.

Compared with the conventional GATE IC in the prior art, the scan control output circuit can start outputting the scan drive signal from any one row of scan signal lines, and end the outputting at any one row of scan signal lines. Therefore, in the embodiment of the present disclosure, the first control circuit is required to send an instruction for controlling the start and end of outputting the scan drive signal by the scan control output circuit. Therefore, the scan control output circuit in the embodiment of the present disclosure is required to have a communication interface such as $I^2C$ (Inter-Integrated Circuit), and have a decoder with a command decoding function. The conventional Gate IC in the prior art does not have a communication interface and a decoder with decoding function, and the conventional Gate IC starts scanning line by line, from the first line to the last line, only after receiving a frame start signal sent by the TCON/SOC.

It should be noted that, in the embodiment of the present disclosure, the scan signal line required to be scanned is determined as the target scan signal line, so that the scan signal line required to be scanned is turned on. Moreover, no scan drive signals are input to the rest scan signal lines which are not determined as the target scan signal lines, so that the scan signal lines which are not required to be scanned are turned-off. For these scan signal lines that are not required to be scanned, the implementation of their corresponding data voltages may include the following methods.

A first method: for the scan signal lines that are not required to be scanned, the data voltages corresponding to the scan signal lines may be normally input to the corresponding data lines. However, since the scan signal lines are not turned on, the data voltages are not input to the corresponding sub-pixels (e.g., the black picture area).

A second method: for the scan signal lines that are not required to be scanned, the source driver circuit does not directly output the data voltages corresponding to the scan signal lines. That is, the data voltage is not input to the data signal line at the moment.

In the second method: for the scan signal lines that are not required to be scanned, the source driver circuit shown in FIG. 12 may be adopted to output the data voltages corresponding to the scan signal lines.

Based on the same disclosure concept, an embodiment of the present disclosure further provides a display apparatus, which includes the foregoing display panel provided by the embodiment of the present disclosure and the foregoing drive control circuit provided by the embodiment of the present disclosure. The principle of the display apparatus for solving the problems is similar to that of the foregoing drive control circuit, so that the implementation of the display apparatus may refer to the implementation of the foregoing drive control circuit, and the same parts are not repeated herein.

In a specific implementation, the display apparatus in some embodiments of the present disclosure may be any product or component with a display function, such as a mobile phone, a tablet computer, a television, a monitor, a notebook computer, a digital photo frame, a navigator, and the like. Other essential components of the display apparatus are understood by those skilled in the art, which are not described herein, and should not be construed as limiting the present disclosure.

Based on the same concept of the disclosure, an embodiment of the present disclosure further provides a control method for the foregoing drive control circuit, which may include the following steps:

acquiring image data and outputting a first selection command signal according to the image data; and receiving the first selection command signal, determining, according to the first selection command signal, target scan signal lines from among scan signal lines in a display panel, and outputting scan drive signals to the target scan signal lines.

In some embodiments of the present disclosure, the acquiring the image data and outputting the first selection command signal according to the image data includes:

acquiring image data corresponding to a plurality of consecutive display frames;

comparing the image data of the plurality of consecutive display frames;

when it is determined that set picture data in a same first image area in image data of at least two adjacent display frames exists in the plurality of consecutive display frames, determining an area outside the first image area as a second image area;

determining scan signal lines coupled to pixel units in the first image area or the second image area as the target scan signal lines; and during each of the at least two adjacent display frames, outputting the first selection command signal according to the determined target scan signal lines.

It should be noted that the operation principle and the specific implementation of the control method for the drive control circuit are the same as those of the drive control circuit in the foregoing embodiment, and therefore, the control method for the drive control circuit may be implemented by referring to the specific implementation of the drive control circuit in the foregoing embodiment, and is not repeated herein.

As will be appreciated by those skilled in the art, embodiments of the present disclosure may be provided as a method, a system, or a computer program product. Accordingly, the present disclosure may take the form of an entirely hardware embodiment, an entirely software embodiment or an embodiment combining software and hardware aspects. Furthermore, the present disclosure may take the form of a computer program product which is embodied on one or more computer-usable storage medium (including, but not limited to, disk storage, CD-ROM, optical storage, and the like) having computer-usable program code embodied therein.

The present disclosure is described with reference to flowcharts and/or block diagrams of methods, devices (systems), and computer program products of the embodiments of the present disclosure. It will be understood that each flow and/or block of the flowcharts and/or block diagrams, and combinations of flows and/or blocks in the flowcharts and/or block diagrams, can be implemented by computer program instructions. These computer program instructions may be provided to a processor of a general purpose computer, a special purpose computer, an embedded processor, or other programmable data processing device to produce a machine instruction, such that the instructions, which are executed via the processor of the computer or other programmable data processing device, create an apparatus for implementing the functions specified in a flow or flows in the flowchart and/or a block or blocks in the block diagram.

These computer program instructions may alternatively be stored in a computer-readable memory that can direct a computer or other programmable data processing device to function in a particular manner, such that the instructions stored in the computer-readable memory produce an article of manufacture including instruction apparatus which implement the function specified in a flow or flows in the flowchart and/or a block or blocks in the block diagram.

These computer program instructions may alternatively be loaded onto a computer or other programmable data processing device to cause a series of operational steps to be performed on the computer or other programmable device to produce a computer implemented process, such that the instructions which are executed on the computer or other programmable device provide steps for implementing the functions specified in a flow or flows in the flowchart and/or a block or blocks in the block diagram.

While the preferred embodiments of the present disclosure have been described, additional changes and modifications to those embodiments may occur to those skilled in the art once they learn about the basic inventive concepts. Therefore, it is intended that the appended claims should be interpreted as including the preferred embodiments and all changes and modifications that fall within the scope of the present disclosure.

It will be apparent to those skilled in the art that various changes and variations may be made to the embodiments of the present disclosure without departing from the spirit and scope of the embodiments of the present disclosure. Thus, if such modifications and variations to the embodiments of the present disclosure are within the scope of the claims of the present disclosure and their equivalents, the present disclosure is also intended to encompass such modifications and variations.

What is claimed is:

1. A drive control circuit, comprising:

a first control circuit, configured to acquire image data, and output a first selection command signal according to the image data; and at least one second control circuit, each coupled to at least one scan signal line in a display panel, and coupled to the first control circuit, wherein the at least one second control circuit is each configured to receive the first selection command signal, determine, according to the first selection command signal, a target scan signal line from among a plurality of scan signal lines in the display panel, and output a scan drive signal to the target scan signal line, wherein the plurality of scan signal lines are divided into at least one scan signal line group each comprising at least one of the plurality of scan signal lines; the at least one second control circuit is in one-to-one correspondence with the at least one scan signal line group;

the first selection command signal comprises address information corresponding to the second control circuit coupled to the target scan signal line and data selected information corresponding to the target scan signal line;

the first control circuit is further configured to pre-store address information of the at least one second control circuit coupled to the first control circuit; and each of the at least one second control circuit is further configured to receive the first selection command signal, and determine, according to the data selected information in the first selection command signal corresponding to the address information of the second control circuit, the target scan signal line from among the plurality of scan signal lines in the display panel, wherein the second control circuit comprises a frame start signal control circuit and at least one first shift register unit; a drive signal output terminal of each of the at least one first shift register unit is coupled to at least one scan signal line; in the same second control circuit, the frame start signal control circuit is coupled to an input signal terminal of each of the at least one first shift register unit;

the frame start signal control circuit is configured to receive the first selection command signal, determine, according to corresponding address information and data selected information in the first selection command signal, the target scan signal line from among the correspondingly coupled scan signal line group, generate a first target frame start signal corresponding to the target scan signal line according to the determined target scan signal line, and input the generated first target frame start signal corresponding to the target scan signal line to the input signal terminal of the first shift register unit coupled to the target scan signal line; and the first shift register unit is configured to receive the first target frame start signal corresponding to the coupled target scan signal line through the input signal terminal, and provide a clock signal input to a clock control signal terminal to the coupled target scan signal line according to the received first target frame start signal, to output the scan drive signal to the target scan signal line.

2. The drive control circuit according to claim 1, wherein the frame start signal control circuit comprises a first decoder, a first frame start signal generator, and a first level shifter;

the first decoder is configured to receive the first selection command signal, determine, according to the corresponding address information and data selected information in the first selection command signal, the target scan signal line from among the corresponding scan signal line group, and generate a frame start generating signal corresponding to the target scan signal line according to the determined target scan signal line;

the first frame start signal generator is configured to receive the first frame start generating signal corresponding to the target scan signal line, and generate a first initial frame start signal corresponding to the target scan signal line according to the received first frame start generating signal; and the first level shifter is configured to receive the first initial frame start signal corresponding to the target scan signal line, perform voltage shift processing on the received first initial frame start signal, generate the first target frame start signal corresponding to the target scan signal line, and input the generated first target frame start signal corresponding to the target scan signal line to the input signal terminal of the first shift register unit coupled to the target scan signal line.

3. The drive control circuit according to claim 2, wherein the frame start signal control circuit and the at least one first shift register unit are on the display panel;

the display panel further comprises a plurality of first clock control signal lines; and the clock control signal terminal of the first shift register unit in the second control circuit is coupled to at least one of the plurality of first clock control signal lines.

4. The drive control circuit according to claim 3, wherein in the same second control circuit, all of the at least one first shift register unit is at a same end of the scan signal line; or the scan signal line has a first end and a second end opposite to each other; and all of the at least one first shift register unit in the second control circuit is at one of the first end and the second end; or the scan signal line has a first end and a second end opposite to each other; and each of the first end and the second end of the scan signal line is coupled to one first shift register unit.

5. The drive control circuit according to claim 4, wherein in the same second control circuit, the frame start signal control circuit and the at least one first shift register unit are at the same end of the scan signal line.

6. The drive control circuit according to claim 4, wherein the display panel has a bonding area; the frame start signal control circuit in each of the at least one second control circuit is in the bonding area;

the display panel further comprises a plurality of first frame start signal lines and a plurality of first transfer signal lines, wherein the input signal terminal of the first shift register unit is coupled to one of the plurality of first frame start signal lines, and the one of the plurality of first frame start signal lines is coupled to one of the plurality of first transfer signal lines; and in the same second control circuit, the frame start signal control circuit is coupled to the first transfer signal line corresponding to the first shift register unit.

7. The drive control circuit according to claim 6, wherein the display panel comprises a plurality of pixel units;

the plurality of pixel units are divided into a plurality of pixel unit row groups, wherein each of the plurality of pixel unit row groups comprises one pixel unit row or at least two adjacent pixel unit rows;

between any two adjacent pixel unit row groups is arranged at least one of the plurality of first frame start signal lines, and the plurality of first frame start signal lines and the plurality of scan signal lines are in a same layer.

8. The drive control circuit according to claim 6, wherein the display panel comprises a plurality of pixel units;

the plurality of pixel units are divided into a plurality of pixel unit column groups, wherein each of the plurality of pixel unit column groups comprises one pixel unit column or at least two adjacent pixel unit columns;

between any two adjacent pixel unit column groups is arranged at least one of the plurality of first transfer signal lines; and the display panel further comprises a plurality of data signal lines; and the plurality of first transfer signal lines and the plurality of data signal lines are in a same layer.

9. The drive control circuit according to claim 1, wherein the drive signal output terminal of each of the at least one first shift register unit is coupled to multiple ones of the plurality of the scan signal lines;

the first shift register unit comprises a first shift register sub-unit and a second shift register sub-unit, wherein the second shift register sub-unit is coupled to the multiple scan signal lines;

the first shift register sub-unit is configured to receive the first target frame start signal corresponding to the coupled target scan signal line, and provide a signal at a first cascade clock signal terminal to a cascade signal output terminal according to the received first target frame start signal, to output a cascade drive signal through the cascade signal output terminal; and the second shift register sub-unit is configured to receive the cascade drive signal output by the coupled cascade signal output terminal, and provide a signal at an input clock control signal terminal to the coupled target scan signal line in response to the cascade drive signal, to output the scan drive signal to the target scan signal line.

10. The drive control circuit according to claim 9, wherein the first shift register sub-unit comprises a plurality of first shift registers, wherein the plurality of first shift registers are cascaded together;

the second shift register sub-unit comprises a plurality of second shift registers, wherein the plurality of first shift registers are in one-to-one correspondence with the plurality of second shift registers; and the cascade signal output terminal of each of the plurality of first shift registers is coupled to an input signal terminal of a corresponding one of the plurality of second shift registers;

the plurality of first shift registers are configured to receive the first target frame start signal corresponding to the coupled target scan signal line through the input signal terminal, and sequentially operate according to the received first target frame start signal, so that each first shift register provides the signal at the first cascade clock signal terminal to the cascade signal output terminal, to output the cascade drive signal through the cascade signal output terminal; and each of the plurality of second shift registers is configured to receive the cascade drive signal output by the coupled cascade signal output terminal, and provide the signal at the input clock control signal terminal to the coupled target scan signal line in response to the cascade drive signal, to output the scan drive signal to the target scan signal line.

11. The drive control circuit according to claim 1, wherein the second control circuit comprises a scan control output circuit, wherein the scan control output circuit is coupled to the scan signal line in the corresponding scan signal line group; and the scan control output circuit is configured to receive the first selection command signal, determine, according to data selected information in the first selection command signal corresponding to address information of the scan control output circuit, the target scan signal line from among the corresponding scan signal line group, generate the scan drive signal corresponding to the target scan signal line according to the determined target scan signal line, and provide the generated scan drive signal to the coupled target scan signal line, to output the scan drive signal to the target scan signal line.

12. The drive control circuit according to claim 11, wherein the scan control output circuit comprises a second decoder, a second frame start signal generator, and a second level shifter;

the second decoder is configured to receive the first selection command signal, determine, according to data selected information in the first selection command signal corresponding to address information of the second decoder, the target scan signal line from among the corresponding scan signal line group, and generate a scan generating signal corresponding to the target scan signal line according to the determined target scan signal line;

the second frame start signal generator is configured to receive the scan generating signal corresponding to the target scan signal line, and generate an initial scan signal corresponding to the target scan signal line according to the received scan generating signal; and the second level shifter is configured to receive the initial scan signal corresponding to the target scan signal line, perform voltage shift processing on the received initial scan signal, generate the scan drive signal corresponding to the target scan signal line, and input the generated scan drive signal corresponding to the target scan signal line to the target scan signal line coupled to the second level shifter.

13. The drive control circuit according to claim 1, wherein the first control circuit is further configured to obtain image data corresponding to a plurality of consecutive display frames, compare the image data of the plurality of consecutive display frames, and when it is determined that set picture data in a same first image area in image data of at least two adjacent display frames exists in the plurality of consecutive display frames, determine an area outside the first image area as a second image area, determine a scan signal line coupled to a pixel unit in the first image area or the second image area as the target scan signal line, and output the first selection command signal according to the determined scan signal line during each of the at least two adjacent display frames.

14. The drive control circuit according to claim 13, wherein the first image area comprises a plurality of adjacent pixel unit rows; the second image area comprises a plurality of adjacent pixel unit rows; and at least one first image area exists, and at least one second image area exists, wherein the at least one first image area and the at least one second image area are alternately arranged; or the first image area comprises a plurality of adjacent pixel unit columns; the second image area comprises a plurality of adjacent pixel unit columns; and at least one first image area exists, and at least one second image area exists, wherein the at least one first image area and the at least one second image area are alternately arranged; or the first image area comprises adjacent a1 columns×b1 rows of pixel units, wherein $1 \le a1 < M$, $1 \le b1 < N$, M represents a total number of pixel unit columns in the display panel, N represents a total number of pixel unit rows in the display panel, and both of a1 and b1 are integers;

the first image area comprises adjacent a2 columns×b2 rows of pixel units, wherein $1 \le a2 < M$, $1 < b2 < N$, and both of a2 and b2 are integers; and at least one first image area exists, and at least one second image area exists, wherein the at least one first image area and the at least one second image area are uniformly distributed.

15. The drive control circuit according to claim 13, wherein the first control circuit is further configured to determine a refresh rate corresponding to the first image area as a first refresh rate, and determine a refresh rate corresponding to the second image area as a second refresh rate; and the first refresh rate is less than the second refresh rate.

16. The drive control circuit according to claim 1, wherein the drive control circuit further comprises at least one source driver circuit, wherein each of the at least one source driver circuit is coupled to a data signal line in the display panel;

the first control circuit is further configured to send the acquired image data to the at least one source driver circuit; and each of the at least one source driver circuit is configured to receive the image data, and apply a corresponding data voltage to the data signal line coupled to the source driver circuit, according to the image data.

17. The drive control circuit according to claim 16, wherein the first control circuit is further configured to send the acquired image data to the at least one source driver circuit, and input, when a scan signal line coupled to a pixel unit in the first image area is determined as the target scan signal line, a first image enable signal to the source driver circuit coupled to the pixel unit in the first image area; and the source driver circuit is further configured to receive the first image enable signal, and apply a corresponding data voltage to a data signal line coupled to a pixel unit in the second image area, according to the first image enable signal and the image data.

18. The drive control circuit according to claim 16, wherein the first control circuit is further configured to send the acquired image data to the at least one source driver circuit, and input, when a scan signal line coupled to a pixel unit in the second image area is determined as the target scan signal line, a first image disable signal to the source driver circuit coupled to the pixel unit in the second image area; and the source driver circuit is further configured to receive the first image disable signal, and apply a corresponding data voltage to a data signal line coupled to the pixel unit in the second image area, according to the first image disable signal and the image data.

* * * * *